US012736413B2

(12) United States Patent
Coyne et al.

(10) Patent No.: US 12,736,413 B2
(45) Date of Patent: Sep. 15, 2026

(54) THERMAL CYCLE DETECTORS

(71) Applicant: Analog Devices International Unlimited Company, Limerick (IE)

(72) Inventors: Edward Coyne, Athenry (IE); Aileen Anne Cleary, Somerville, MA (US); Wassim Bassalee, Sherborn, MA (US); Gavin P. Cosgrave, Enniscorthy (IE); Alan J. ODonnell, Castletroy (IE); Ciaran Curtin, Ovens (IE); Bernard Stenson, County Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 466 days.

(21) Appl. No.: 18/501,368

(22) Filed: Nov. 3, 2023

(65) Prior Publication Data

US 2024/0159596 A1 May 16, 2024

Related U.S. Application Data

(60) Provisional application No. 63/383,467, filed on Nov. 11, 2022.

(51) Int. Cl.
*G01K 3/10* (2006.01)
*H10W 20/43* (2026.01)
(Continued)

(52) U.S. Cl.
CPC .............. *G01K 3/10* (2013.01); *H10W 20/43* (2026.01); *H10W 20/4451* (2026.01);
(Continued)

(58) Field of Classification Search
CPC ........ G01K 3/10; G01K 2215/00; G01K 3/04; G01K 7/01; G01K 7/16; G01K 3/005;
(Continued)

(56) References Cited

U.S. PATENT DOCUMENTS 4,558,342 A * 12/1985 Sclar .......................... G01J 5/12
250/338.4
7,489,024 B2 * 2/2009 Socher ................... H02N 1/006
257/706

(Continued)

FOREIGN PATENT DOCUMENTS

DE 102007039088 A1 2/2009
WO 2017/184524 A1 10/2017

OTHER PUBLICATIONS

Extended European Search Report issued Jul. 6, 2026 for European Patent Application No. 26169555.5, 6 pages.

*Primary Examiner* — John E Breene
*Assistant Examiner* — Manuel Salvador Castellon, Jr.
(74) *Attorney, Agent, or Firm* — ArentFox Schiff LLP

(57) ABSTRACT

A thermal cycle detector includes a first temperature reservoir, a second first temperature reservoir, first thermal barrier, and a plurality of first electrical conductors spanning the first thermal barrier. The first temperature reservoir includes a first transistor, and the second temperature reservoir includes a second transistor. The first thermal barrier is disposed between the first temperature reservoir and the second temperature reservoir. The plurality of first electrical conductors is configured to provide an electrical power source for the thermal cycle detector in response to a thermal gradient across the plurality of first electrical conductors.

20 Claims, 38 Drawing Sheets

(51) Int. Cl.

| | |
|---|---|
| ***H10W 20/44*** | (2026.01) |
| ***H10W 40/10*** | (2026.01) |
| ***H10W 72/00*** | (2026.01) |
| ***H10W 74/00*** | (2026.01) |
| ***H10W 90/00*** | (2026.01) |

(52) U.S. Cl.
CPC .......... *H10W 40/10* (2026.01); *H10W 72/884* (2026.01); *H10W 74/00* (2026.01); *H10W 90/734* (2026.01); *H10W 90/736* (2026.01); *H10W 90/754* (2026.01); *H10W 90/756* (2026.01)

(58) Field of Classification Search
CPC . H10W 20/43; H10W 20/4451; H10W 40/10; H10W 72/884; H10W 74/00; H10W 90/734; H10W 90/736; H10W 90/754; H10W 90/756
See application file for complete search history.

(56) References Cited

U.S. PATENT DOCUMENTS

| | | | |
|---|---|---|---|
| 10,032,683 | B2 | 7/2018 | Davis et al. |
| 10,481,672 | B1 | 11/2019 | Griffin et al. |
| 11,269,006 | B2 | 3/2022 | Coyne et al. |
| 11,551,990 | B2 | 1/2023 | Roberts et al. |
| 11,609,265 | B1 | 3/2023 | Rossmeier et al. |
| 2008/0036487 | A1 | 2/2008 | Bradley et al. |
| 2014/0125366 | A1 | 5/2014 | Thøgersen et al. |
| 2014/0301525 | A1 | 10/2014 | Reynolds, IV et al. |
| 2016/0116924 | A1 | 4/2016 | Meijer et al. |
| 2017/0126229 | A1 | 5/2017 | Tan et al. |
| 2017/0242068 | A1 | 8/2017 | Le et al. |
| 2017/0255507 | A1 | 9/2017 | Milor et al. |
| 2018/0143242 | A1 | 5/2018 | Connor et al. |
| 2023/0004151 | A1 | 1/2023 | K.N. et al. |

* cited by examiner 2108
2116(2)
1520
1716
1728
1508
1502
1522(4)
1506
1510(7)
1524(4)
2212
2220
1504
1714
2110
1524(1)
1510(2)
1506
1522(1)
1502
1526
1508
1700
1520
1716
1728
2116(1)
2108
2214

THERMAL CYCLE DETECTORS

RELATED APPLICATIONS

This application claims benefit of U.S. Provisional Patent Application Ser. No. 63/383,467, filed on Nov. 11, 2022, which is incorporated herein by reference.

BACKGROUND

A thermal cycle of a device refers to heating of the device and subsequent cooling of the device. It may be helpful to know how many thermal cycles a device has been subjected to. For example, remaining useful life of a device can potentially be estimated based on number of thermal cycles the device has been subjected to. Also, being able to record the temperature excursions of a device enables actual mission profiles to be monitored. Additionally, warranty coverage of a device may be conditioned on how many thermal cycles the device has been subjected to.

DETAILED DESCRIPTION OF THE EMBODIMENTS

Disclosed herein are new thermal cycle detectors and associated methods which significantly advance the state of the art. Certain embodiments of the new thermal cycle detectors are capable of detecting up to a predetermined number of thermal cycles without requiring an external electrical power source or an electronic memory. Some embodiments of the structures described in this document enable actual exposure and mission profiles to be recorded. Additionally, particular embodiments are capable of detecting thermal cycles having a wide variety of profiles, including thermal cycles having non-monotonic profiles. Furthermore, some embodiments are configured to ignore, i.e., not detect, thermal cycles that do not reach at least a minimum temperature or thermal cycles that do not last for at least a minimum time duration. Moreover, certain embodiments generate a record of detected thermal cycles that is substantially unalterable, i.e., the recorded number of detected thermal cycles cannot be easily deleted or changed. As such, the new thermal cycle detectors may significantly advance thermal cycle detection in numerous possible applications, including but not limited to, integrated circuits, sterilization cycle detection of reusable surgical tools and medical instruments, batteries, information technology devices, vehicles, aircraft, power equipment, industrial equipment, asset tracking of reusable assets, mission profile monitoring, heating and cooling equipment, shipping containers, etc.

Figure 1:
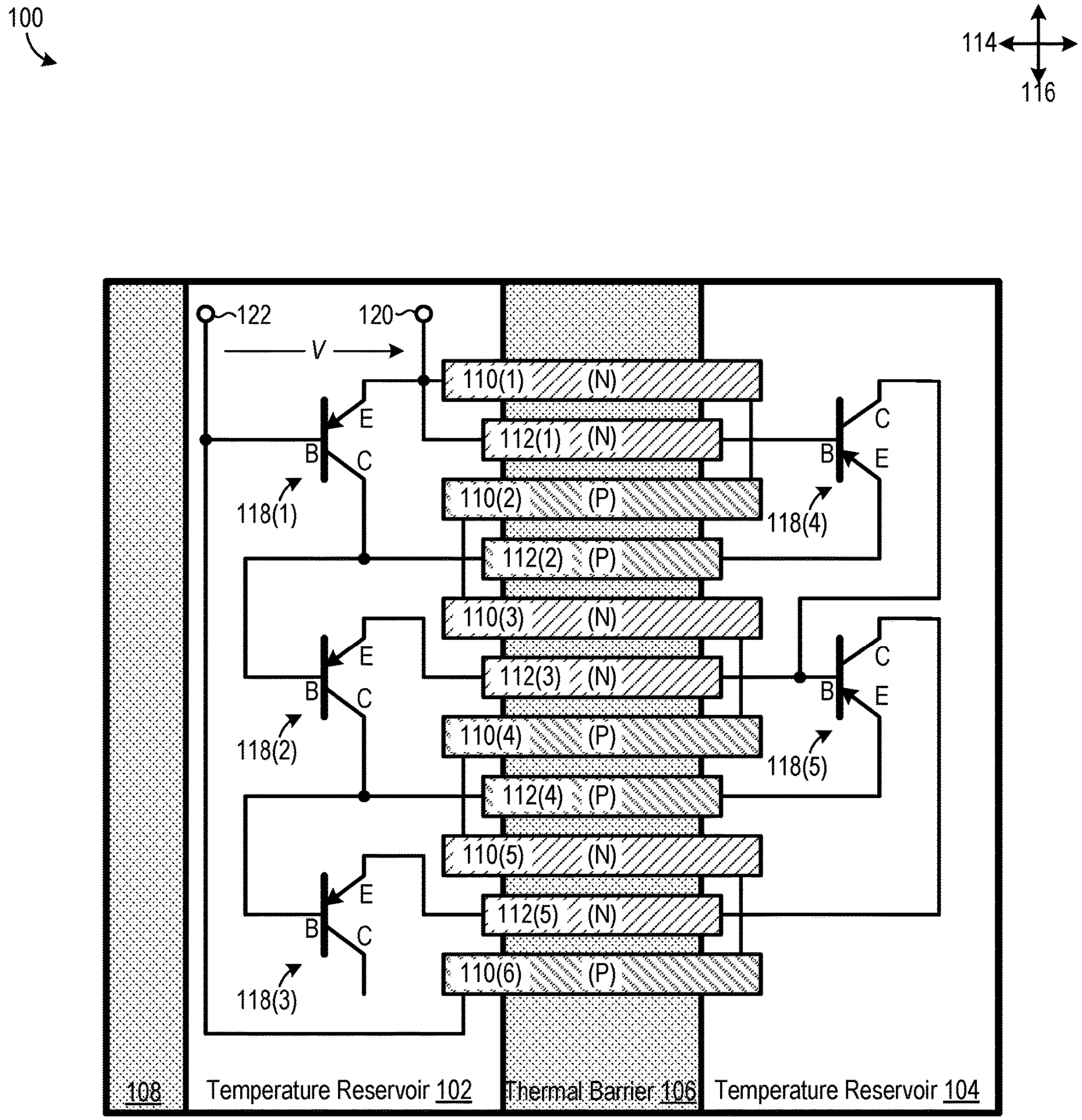
FIG. 1 is a schematic diagram of a thermal cycle detector, according to an embodiment.

FIG. 1 is a schematic diagram of a thermal cycle detector 100, which is one embodiment of the new thermal cycle detectors disclosed herein. Thermal cycle detector 100 includes a first temperature reservoir 102, a second temperature reservoir 104, a first thermal barrier 106, a second thermal barrier 108, a plurality of first electrical conductors 110, and a plurality of second electrical conductors 112. In this document, specific instances of an item may be referred to by use of a numeral in parentheses (e.g. first electrical conductor 110(1)) while numerals without parentheses refer to any such item (e.g. first electrical conductors 110).

First temperature reservoir 102, second temperature reservoir 104, first thermal barrier 106, and second thermal barrier 108 are separated from each other in a first direction 114. Specifically, first temperature reservoir 102 is disposed between second thermal barrier 108 and first thermal barrier 106 in first direction 114, and second thermal barrier 108 is disposed between first temperature reservoir 102 and second temperature reservoir 104 in first direction 114. Each first electrical conductor 110 and each second electrical conductor 112 spans second thermal barrier 106 in first direction 114. While FIG. 1 depicts first electrical conductors 110 and second electrical conductors 112 being interdigitated and separated from each other in a second direction 116, the placement of first electrical conductors 110 and second electrical conductors 112 may vary without departing from the scope hereof, as long as first electrical conductors 110 span first thermal barrier 106. For example, two or more first electrical conductors 110 and/or second electrical conductors 112 could overlap each other, as long as overlapping portions of the electrical conductors are separated by an electrical insulating material. As another example, all first electrical conductors 110 could be grouped together, and all second electrical conductors 112 could be grouped together separate from the group of first electrical conductors 110.

First temperature reservoir 102 and second temperature reservoir 104 include, for example, a semiconductor material, such as silicon or germanium. Each of first temperature reservoir 102 and second temperature reservoir 104 includes one or more transistors 118. Transistors 118 are formed, for example, by doping semiconductor material of first temperature reservoir 102 and by doping semiconductor material of second temperature reservoir 104. FIG. 1 illustrates first temperature reservoir 102 as including three transistors 118, and FIG. 1 illustrates second temperature reservoir 104 including two transistors 118. However, the quantity of transistors 118 included in each of first temperature reservoir 102 and second temperature reservoir 104 may vary as a design choice. As discussed below, each transistor is capable of detecting a single thermal event. As such, the number of thermal cycles that thermal cycle detector 100 is capable of detecting increases with quantity of transistors in the temperature reservoirs 102 and 104. However, complexity and minimum size of thermal cycle detector 100 also increases with quantity of 118 transistors. Consequently, there is tradeoff between quantity of thermal cycles that can be detected by thermal cycle detector 100 and complexity and size of thermal cycle detector 100.

Transistors 118(1), 118(2), and 118(3) of first temperature reservoir 102 are thermally coupled in parallel with each other. Additionally, transistors 118(4) and 118(5) of second temperature reservoir 104 are thermally coupled in parallel with each other. However, transistors 118(1), 118(2), and 118(3) of first temperature reservoir 102 are thermally isolated from transistors 118(4) and 118(5) of second temperature reservoir 104 by first thermal barrier 106.

First electrical conductors 110 are electrically coupled in series between a first power node 120 and a second power node 122, and first electrical conductors 110 are doped with a P-type dopant and an N-type dopant in an alternating manner. In particular, first electrical conductor 110(1) is doped with an N-type dopant, first electrical conductor 110(2) is doped with a P-type dopant, first electrical conductor 110(3) is doped with an N-type dopant, and so on. First electrical conductors 110 act as an electrical power source when subjected to a temperature gradient, i.e., when each of first temperature reservoir 102 and second temperature reservoir 104 are at different temperatures which causes temperature of each first electrical conductor 110 to vary along its length in first direction 114. For example, in certain embodiments, (a) first electrical conductors 110 collectively generate a positive voltage V across power nodes 120 and 122 when first temperature reservoir 102 is warmer than second temperature reservoir 104, and (b) first conductors 110 collectively generate a negative voltage V across power nodes 120 and 122 when second temperature reservoir 104 is warmer than first temperature reservoir 102. In some embodiments, first electrical conductors 110 are formed of polysilicon that is doped with either an N-type dopant or a P-type dopant. Polysilicon has a relatively low thermal conductivity, and forming first electrical conductors 110 out of polysilicon therefore helps prevent heat flow across thermal first barrier 106 via first electrical conductors 110.

The electrical power source formed by first electrical conductors 110 when subjected to a temperature gradient is used to provide electrical power to thermal cycle detector 100. A sufficient number of first electrical conductors 110 must be electrically coupled in series to generate a voltage V that is high enough to forward bias a diode when the first electrical conductors are subjected to the thermal gradient. For example, certain embodiments include a sufficient number of first electrical conductors 110 to generate a voltage V that is between 0.5 volts to 0.8 volts. Accordingly, first thermal barrier 106 must be sufficiently resistant to heat flow such that there is a temperature gradient across first electrical conductors 110 during anticipated operation of thermal cycle detector 100. The ability of first thermal barrier 106 impede heat flow also affects how slow of a change in temperature that thermal cycle detector 100 can detect, as discussed below.

Second electrical conductors 112 electrically couple transistors 118 on opposing sides of thermal barrier 106. Second electrical conductors 112 are also doped with a P-type dopant and an N-type dopants in an alternating manner. In particular, second electrical conductor 112(1) is doped with an N-type dopant, second electrical conductor 112(2) is doped with a P-type dopant, second electrical conductor 112(3) is doped with an N-type dopant, and so on. Accordingly, second electrical conductors 112 generate electrical current when subject to a thermal gradient, which further helps power thermal cycle detector 100. In some embodiments, second electrical conductors 112 are also formed of polysilicon that is doped with either an N-type dopant or a P-type dopant. In some alternate embodiments, however, second electrical conductors 112 are not doped. For example, second electrical conductors 112 could instead be formed of undoped polysilicon or of metal. In any event, it is desirable to configure second electrical conductors 112 in a manner that minimizes conduction of heat across first thermal barrier 106, to help ensure a thermal gradient across first electrical conductors 110.

Each transistor 118 is illustrated as being an P-N-P bipolar junction transistor (BJT) including an emitter (E), a base (B), and a collector (C). However, transistors 118 could be other types of transistors, such as N-P-N BJTs, without departing from the scope hereof. Each transistor 118 is configured to undergo an irreversible change in response to the transistor being subjected to a minimum threshold temperature while being electrically biased. In particular, each transistor 118 is configured such that one of its P-N junctions irreversibly changes from a diode to a resistor, in response to the transistor being subjected to a minimum threshold temperature while being electrically biased. The number of transistors that have undergone such irreversible change corresponds to the number of thermal cycles detected by thermal cycle detector 100, as discussed below.

Figure 2A:
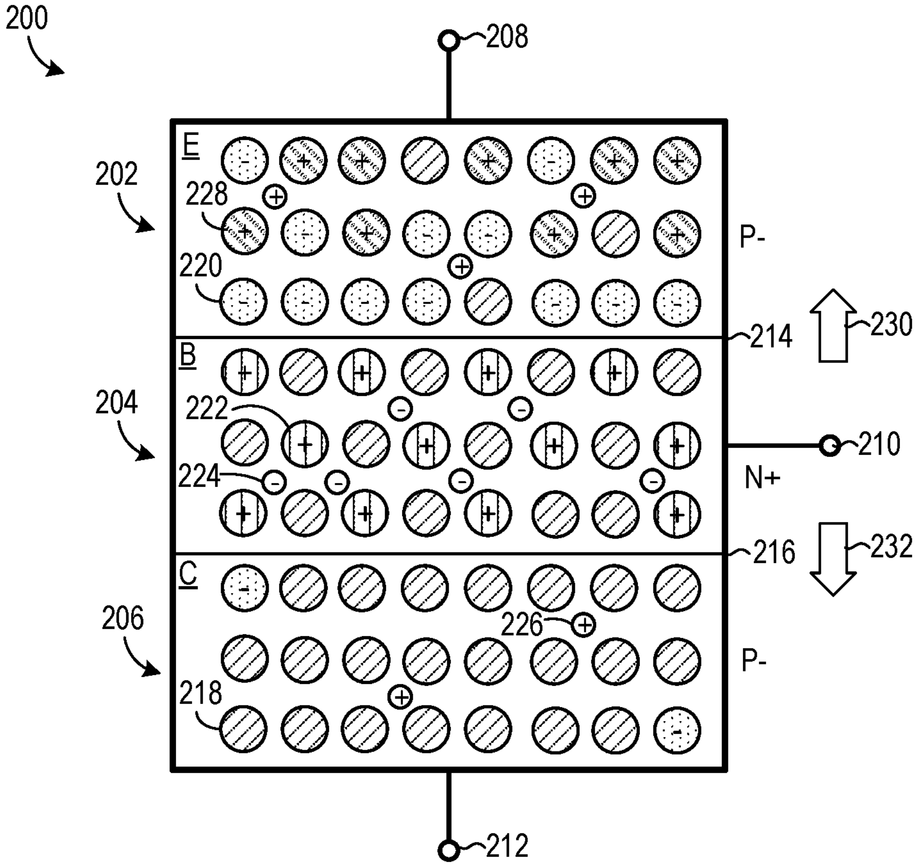
FIG. 2A is schematic diagram of one embodiment of a transistor of the FIG. 1 thermal cycle detector before the transistor has been subjected to elevated temperature and electrical bias.

FIG. 2A is a schematic diagram of a transistor 200, which is one possible embodiment of a transistor 118 instance. Transistor 200 includes an emitter region 202, a base region 204, a collector region 206, an emitter terminal 208, a base terminal 210, and a collector terminal 212. Emitter region 202 and base region 204 are joined at a junction 214, and base region 204 and collector region 206 are joined at a junction 216. Emitter terminal 208 provides an electrical interface to emitter region 202, and base terminal 210 provides an electrical interface to base region 204. Collector terminal 212 provides an electrical interface to collector region 206.

Transistor 200 includes a lattice of semiconductor atoms 218, such as silicon atoms or germanium atoms. Additionally, each of emitter region 202 and collector region 206 is doped with a P-type dopant which creates acceptor atoms 220 in these two regions, but emitter region 202 is more heavily doped with P-type dopant than collector region 206. Additionally, base region 204 is doped with an N-type dopant which creates donor atoms 222 in base region. Only one instance of each of semiconductor atoms 218, acceptor atoms 220, and donor atoms 222 is labeled in FIG. 2A for illustrative clarity. FIG. 2A also illustrates free electrons 224 and holes 226, although only one of each of these items is labeled for illustrative clarity. In this document, strong N-type doping may be referred to as "N+" doping, while weak N-type doping may be referred to as "N-" doping. Similarly, strong P-type doping may be referred to as "P+" doping, while weak P-type doping may be referred to as "P−" doping.

FIG. 2A illustrates transistor 200 under steady state conditions before the transistor is subject to simultaneous elevated temperature and electrical bias. Base region 204 has a strong N-type doping, and collector region 206 has a weak P-type doping. Emitter region 202 would have a strong P-type doping according to the doping configuration discussed above. However, emitter region 202 is not only doped with P-type dopant, but emitter region 202 is also doped with N-type dopant which creates donor atoms 228. The P-type dopant which creates acceptor atoms 220 may be referred to as a primary dopant of emitter region 202, and the N-type dopant which creates donor atoms 228 may be referred to as a counter dopant of emitter region 202. As of result of emitter region 202 having two different types of dopants, emitter region 202 has a weak P-type doping. There is an electric field 230 across junction 214, as well as an electric field 232 across junction 216.

The primary dopant of emitter region 202 has a sufficiently high activation energy such that acceptor atoms 220 will not materially diffuse from emitter region 202 to base region 204 under an anticipated operating temperature range of transistor 200. For example, the primary dopant may selected such that acceptor atoms 220 have a sufficiently high activation energy such that they will not materially diffuse into base region 204 at an anticipated maximum temperature that transistor 200 may be subjected to. However, the counter dopant of emitter region 202 has a lower activation energy than the primary dopant of emitter region 202. Consequently, donor atoms 228 have a lower activation energy than acceptor atoms 220. The counter dopant is selected, for example, such that donor atoms 228 have a sufficiently low activation energy that they will diffuse into base region 204 if transistor 200 is heated to at least a minimum threshold temperature required to detect a thermal cycle. However, an electric field 230 across junction 214 prevents diffusion of donor atoms 228 across junction 214, absent junction 214 being electrically biased. Consequently, donor atoms 228 will diffuse from emitter region 202 to base region 204 only if (a) transistor 200 is heated to a sufficiently high temperature such that donor atoms 228 become mobile and (b) a forward electrical bias is applied between emitter region 202 and base region 204, such as by applying a voltage across emitter terminal 208 and base terminal 210.

Figure 2B:
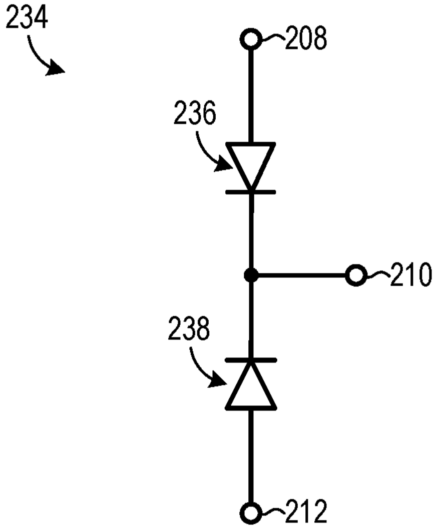
FIG. 2B is an electrical model of the FIG. 2A transistor.

FIG. 2B is an electrical model 234 of transistor 200 under the conditions of FIG. 2A. Model 234 includes a diode 236 and a diode 238. Diode 236 is electrically coupled between emitter terminal 208 and base terminal 210 such that an anode of diode 236 is electrically coupled to emitter terminal 208 and a cathode of diode 236 is electrically coupled to base terminal 210. Diode 238 is electrically coupled between collector terminal 212 and base terminal 210 such that an anode of diode 238 is electrically coupled to collector terminal 212 and a cathode of diode 238 is electrically coupled to base terminal 210.

Figure 3A:
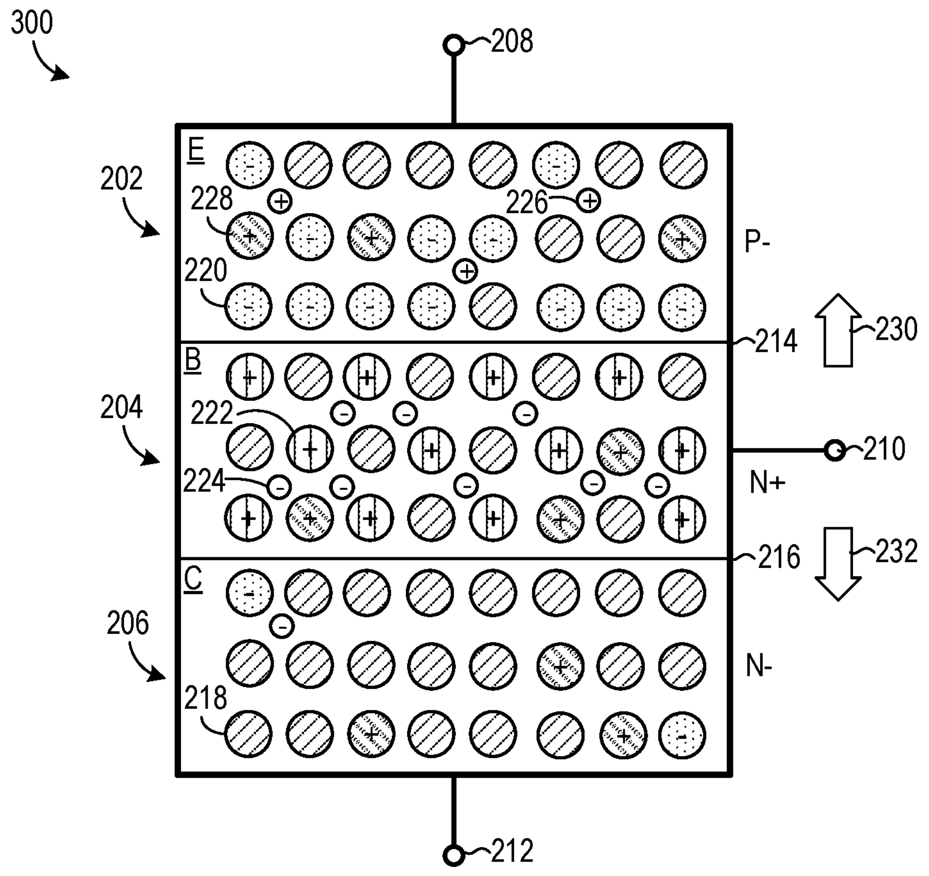
FIG. 3A is a schematic diagram of a transistor that is obtained by subjecting the FIG. 2A transistor to elevated temperature and electrical bias.

FIG. 3A is a schematic diagram of a transistor 300, which results from simultaneously (a) subjecting transistor 200 of FIG. 2A to an elevated temperature sufficient for donor atoms 228 to become mobile and (b) electrically forward biasing junction 214 of transistor 200 of FIG. 2A, e.g., by applying a voltage across emitter terminal 208 and base terminal 210. The elevated temperature and electrical bias collectively enable donor atoms 228 to diffuse into base region 204, as depicted in FIG. 3A. Additionally, electric field 232 accelerates donor atoms 228 in the direction of collector region 206, thereby facilitating movement of donor atoms 228 to collector region 206. Consequently, net doping of collector region 206 is weak N-type, instead of weak P-type. In short, subjecting transistor 200 to elevated temperature and simultaneous electrical biased causes transistor 200 to change to transistor 300, where junction 216 is an N-N junction, instead of P-N junction as in transistor 200.

Figure 3B:
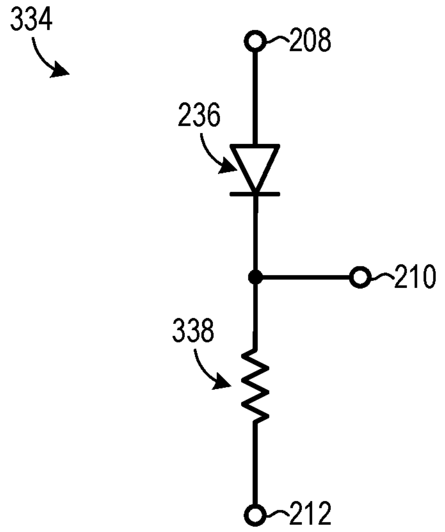
FIG. 3B is an electrical model of the FIG. 3A transistor.

FIG. 3B is an electrical model 334 of transistor 300 of FIG. 3A. Electrical model 334 of FIG. 3B is like electrical model 234 of FIG. 2A except that diode 238 is replaced with a resistor 338, to reflect that junction 216 is an N-N junction instead of a P-N junction. Accordingly, subjecting transistor 200 to elevated temperature and simultaneously electrically biasing junction 214 causes one of the diodes of the transistor to irreversibly change to a resistor, as evident when comparing FIGS. 2B and 3B. Accordingly, the phrase "irreversibly change" in the context of a transistor in this document means that one of the transistor's diodes has irreversibly changed to a resistor.

While transistor 200 is a P-N-P transistor, transistor 200 could be modified to be an N-P-N transistor, with each dopant of transistor 200 being changed to an opposite dopant type. In particular, transistor 200 could be changed to an N-P-N transistor, with (a) primary dopant of emitter region 202 being changed from P-type to N-type, (b) counter dopant of emitter region 202 being changed from N-type to P-type, (c) dopant of base region 204 being changed from N-type to P-type, and (d) dopant of collector region 206 being changed from P-type to N-type. In a transistor modified in such manner, junction 216 would change from a P-N junction to a P-P junction in response to the transistor being subjected to elevated temperature and electrical bias, such that a diode between collector terminal 212 and base terminal 210 changes to a resistor.

Examples of N-type emitter region primary dopants include, but are not limited to, arsenic and phosphorus, and examples of N-type emitter region counter dopants include, but are not limited to, fluorine, chlorine and bromine. An example of a P-type emitter region primary dopant includes, but is not limited to, boron, and examples of P-type emitter region counter dopants include, but are not limited to, lithium, sodium, and potassium.

Transistor 200 could also be modified such that collector region 206, instead of emitter region 202, is doped with a primary dopant and a counter dopant, with changes to thermal cycle detector 100 such that collector region 206 is electrically biased in a manner which causes collector region 206 to serve the same function as an emitter region of a transistor. In such case, junction 214 would change from a P-N junction to an N-N junction (or P-P junction if the transistor is an N-P-N transistor), in response to simultaneously (a) subjecting the transistor to an elevated temperature sufficient for counter dopant atoms of collector region 206 to become mobile and (b) electrically forward biasing junction 216, e.g., by applying a voltage across emitter terminal 208 and base terminal 210. Accordingly, diode 236, instead of diode 238, would change to a resistor as result of the simultaneous elevated temperature and electrical bias.

While transistor 200 is depicted as having a symmetrical vertical configuration for illustrative simplicity, transistor 200 could have any essentially any physical configuration, as long as it has one of the doping configurations discussed above. Discussed below with respect to FIGS. 4A-6B are several example embodiments of transistor 200. It is understood, however, that transistor 200 is not limited to these example embodiments.

Figure 4A:
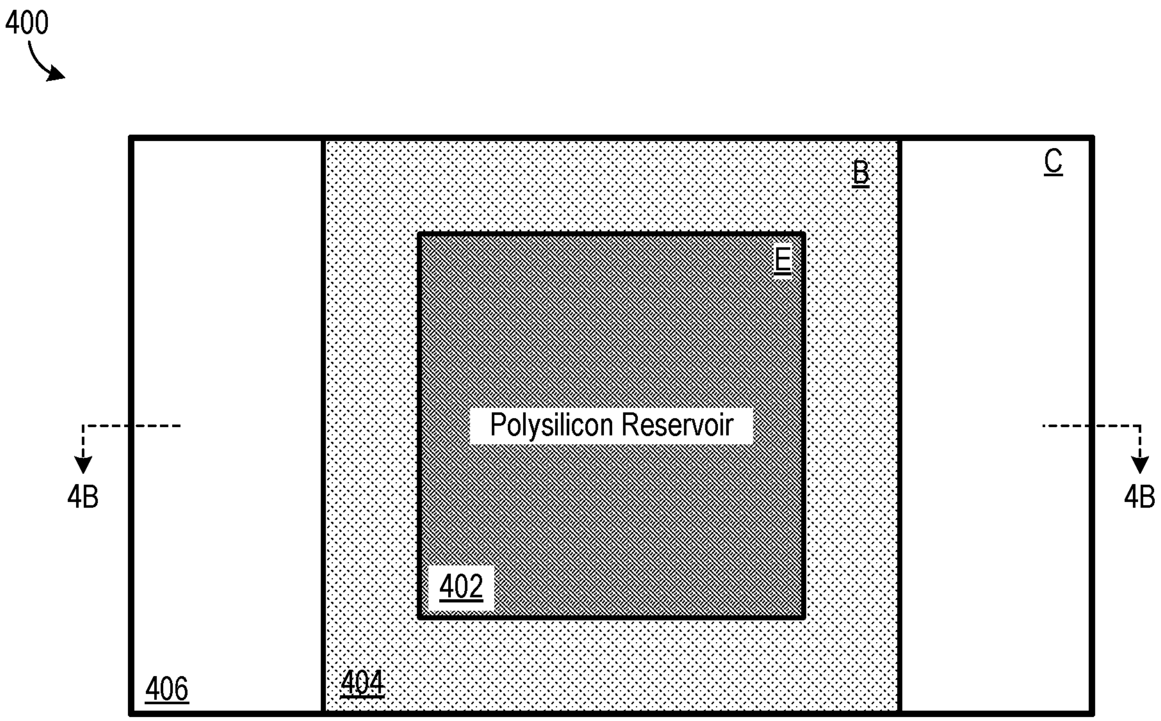
FIG. 4A is a top plan view of an embodiment of the FIG. 2A transistor.
Figure 4B:
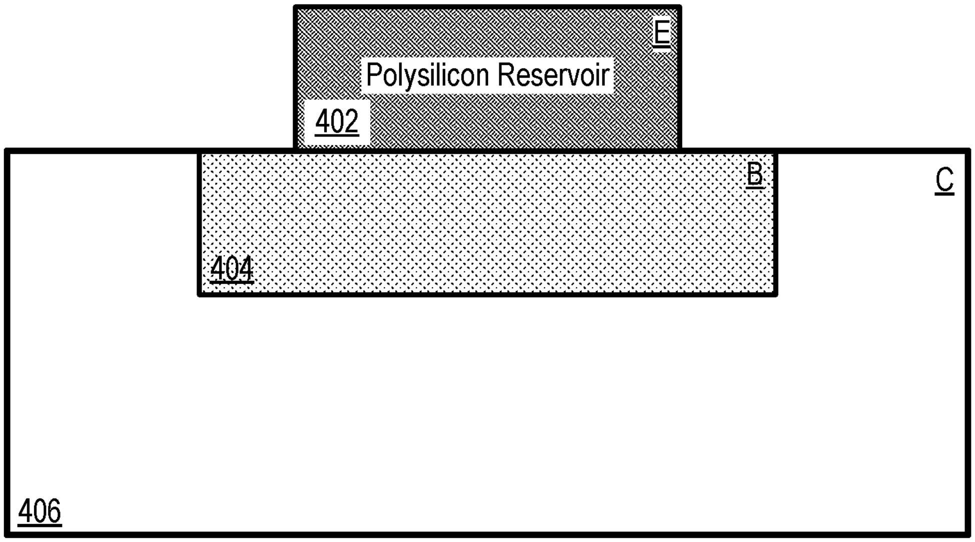
FIG. 4B is a cross-sectional view of the FIG. 4A transistor taking along line 4B-4B of FIG. 4A.

FIG. 4A is a top plan view of a transistor 400, which is one possible embodiment of transistor 200 of FIG. 2A. FIG. 4B is a cross-sectional view of transistor 400 taken along line 4B-4B of FIG. 4A. Transistor 400 has a vertical configuration, and transistor 400 includes an emitter region 402, a base region 404, and a collector region 406, which are embodiments of emitter region 202, base region 204, and collector region 206, respectively. Emitter region 402 is implemented as a polysilicon reservoir, which is well suited for holding the primary dopant atoms and the counter dopant atoms of the emitter region.

Figure 5A:
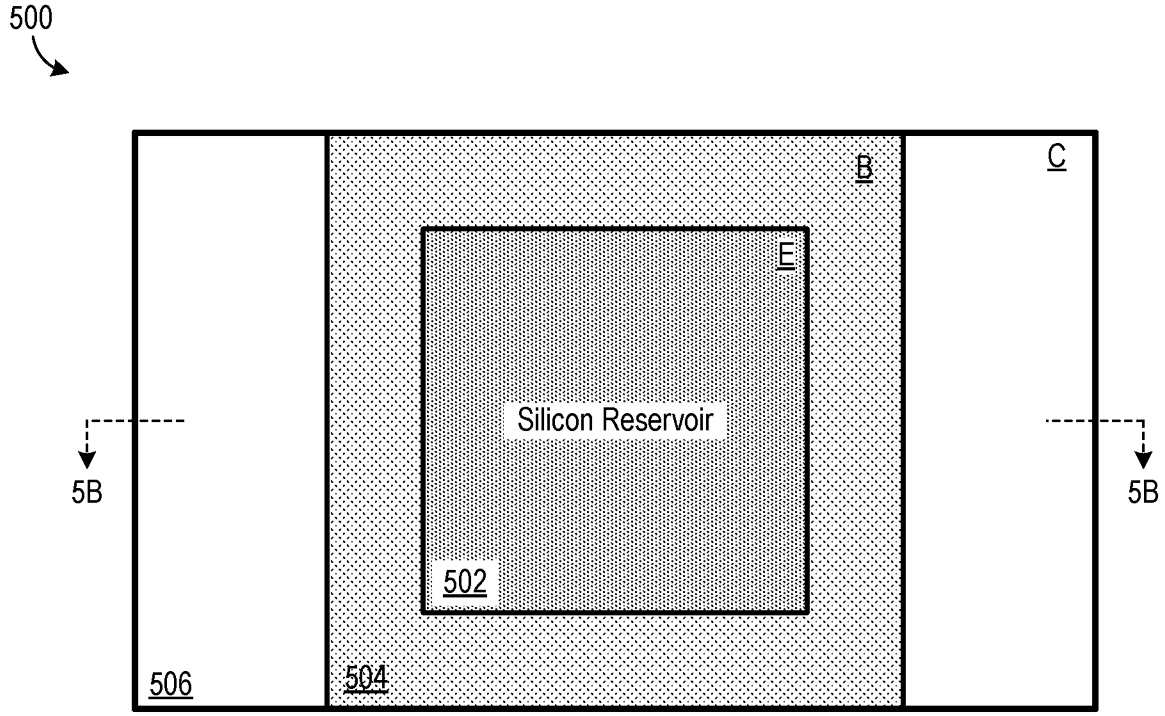
FIG. 5A is a top plan view of another embodiment of the FIG. 2A transistor.
Figure 5B:
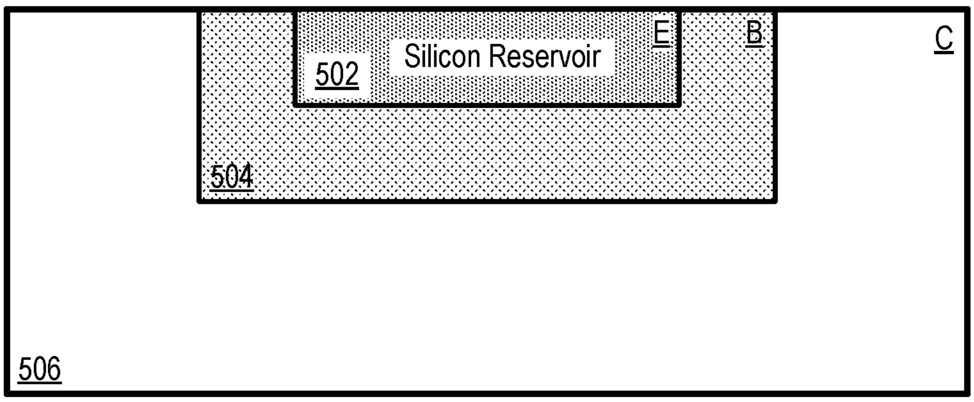
FIG. 5B is a cross-sectional view of the FIG. 5A transistor taking along line 5B-5B of FIG. 5A.

FIG. 5A is a top plan view of a transistor 500, which is another possible embodiment of transistor 200 of FIG. 2A. FIG. 5B is a cross-sectional view of transistor 500 taken along line 5B-5B of FIG. 5A. Transistor 500 also has a vertical configuration, and transistor 500 includes an emitter region 502, a base region 504, and a collector region 506, which are embodiments of emitter region 202, base region 204, and collector region 206, respectively. Emitter region 502 is implemented as a silicon reservoir, or other type of semiconductor reservoir, including a primary dopant and a counter dopant.

Figure 6A:
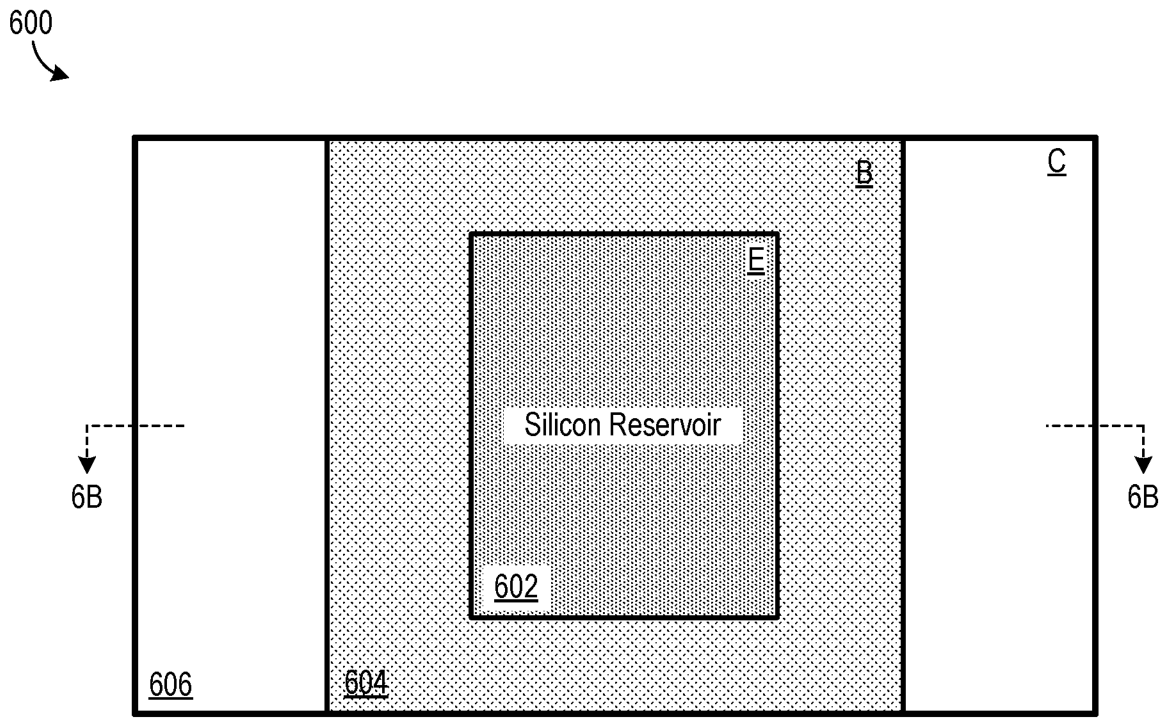
FIG. 6A is a top plan view of an additional embodiment of the FIG. 2A transistor.
Figure 6B:
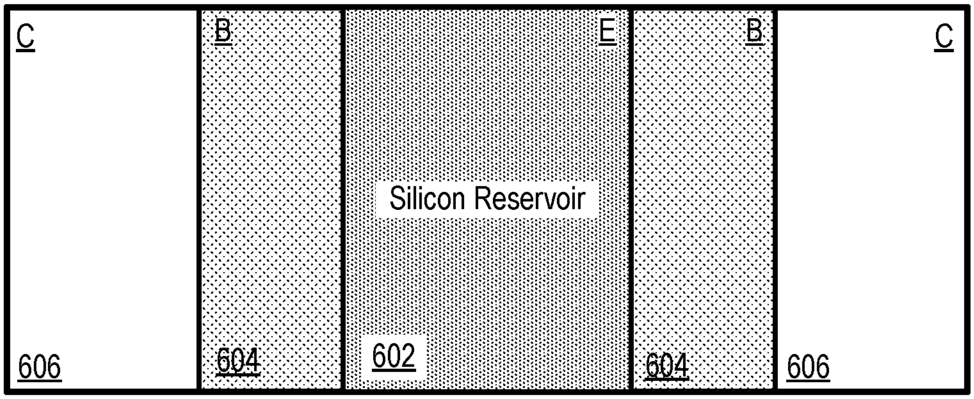
FIG. 6B is a cross-sectional view of the FIG. 6A transistor taking along line 6B-6B of FIG. 6A.

FIG. 6A is a top plan view of a transistor 600, which is another possible embodiment of transistor 200 of FIG. 2A. FIG. 6B is a cross-sectional view of transistor 600 taken along line 6B-6B of FIG. 6A. Transistor 600 has a horizontal configuration, and transistor 600 includes an emitter region 602, a base region 604, and a collector region 606, which are embodiments of emitter region 202, base region 204, and collector region 206, respectively. Emitter region 602 is implemented as a silicon reservoir, or other type of semiconductor reservoir, including a primary dopant and a counter dopant.

Figure 7:
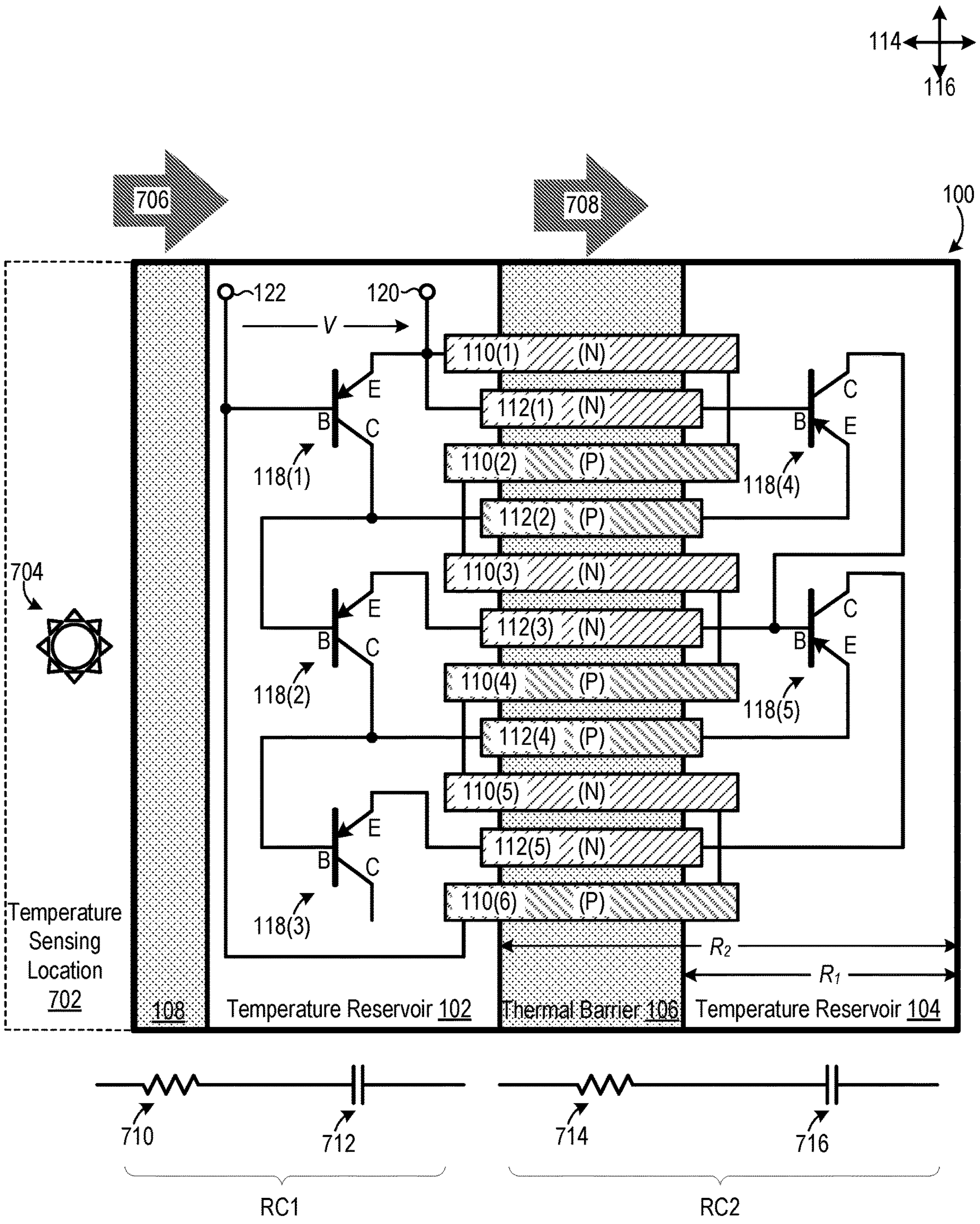
FIG. 7 is a schematic diagram of the FIG. 1 thermal cycle detector during a rising portion of a first thermal cycle.

Referring again to FIG. 1, thermal cycle detector 100 is configured such that a single pair of transistors 118, i.e. one transistor 118 in first temperature reservoir 102 and one transistor in second temperature reservoir 104, undergoes an irreversible change each time that thermal cycle detector 100 is subjected to a complete thermal cycle. For example, FIG. 7 is a schematic diagram of thermal cycle detector 100 at a beginning of a first thermal cycle, i.e., when temperature of thermal cycle detector 100 is rising for a first time. Thermal cycle detector 100 is configured to detect thermal cycling at a temperature sensing location 702, such that second thermal barrier 108 is disposed between first temperature reservoir 102 and temperature sensing location 702, in first direction 114. Temperature sensing location 702 could be either incorporated within thermal cycle detector 100 or separate from thermal cycle detector 100. In the FIG. 7 example, a heat source 704 at temperature sensing location 702 causes heat to begin to flow from temperature sensing location 702 to first temperature reservoir 102, as symbolically shown by an arrow 706. Additionally, heat begins to flow from first temperature reservoir 102 to second temperature reservoir 104, as symbolically shown by an arrow 708.

Time required for first temperature reservoir 102 to rise to the temperature of temperature sensing location 702 is a function of second thermal barrier 108 and first temperature reservoir 102. The combination of second thermal barrier 108 and first temperature reservoir 102 can be modeled by an electrical model including a resistor 710 and a capacitor 712, as shown in FIG. 7. Resistor 710 represents resistance of second thermal barrier 108 to heat flow, and capacitor 712 represents heat storage capacity of first temperature reservoir 102. Second thermal barrier 108 and first temperature reservoir 102 collectively form a low pass filter than prevents thermal cycle detector 100 from recording transient thermal events as a thermal cycle. For example, a thermal time constant (RC1) of the combination of second thermal barrier 108 and first temperature reservoir 102 may be sufficiently large so that thermal cycle detector 100 does not detect a thermal cycle of short duration. Second thermal barrier 108 is optionally omitted, e.g., first temperature reservoir 102 is in direct thermal contact with temperature sensing location 702, in alternate embodiments where transient thermal event filtering is not required.

Similarly, time required for second temperature reservoir 104 to rise to the temperature of first temperature reservoir 102 is a function of first thermal barrier 106 and second temperature reservoir 104. The combination of first thermal barrier 106 and second temperature reservoir 104 can be modeled by an electrical model including a resistor 714 and a capacitor 716, as shown in FIG. 7. Resistor 714 represents resistance of first thermal barrier 106 to heat flow, and capacitor 716 represents heat storage capacity of second temperature reservoir 104. A thermal time constant (RC2) formed by first thermal barrier 106 and second temperature reservoir 104 is important for at least two reasons. First, thermal time constant RC2 helps determine the minimum duration of a thermal cycle for the thermal cycle to be detected by thermal cycle detector 100. In general, the larger thermal time constant RC2, the longer the thermal cycle must be to be detected by thermal cycle detector 100. Second, thermal time constant RC2 must be sufficiently large so that there is a thermal gradient across first electrical conductors 110, to enable the electrical conductors to electrically power thermal cycle detector 100 during a thermal cycle. In general, the slower the change in temperature during a thermal cycle, the larger thermal time constant RC2 must be.

Figure 8:
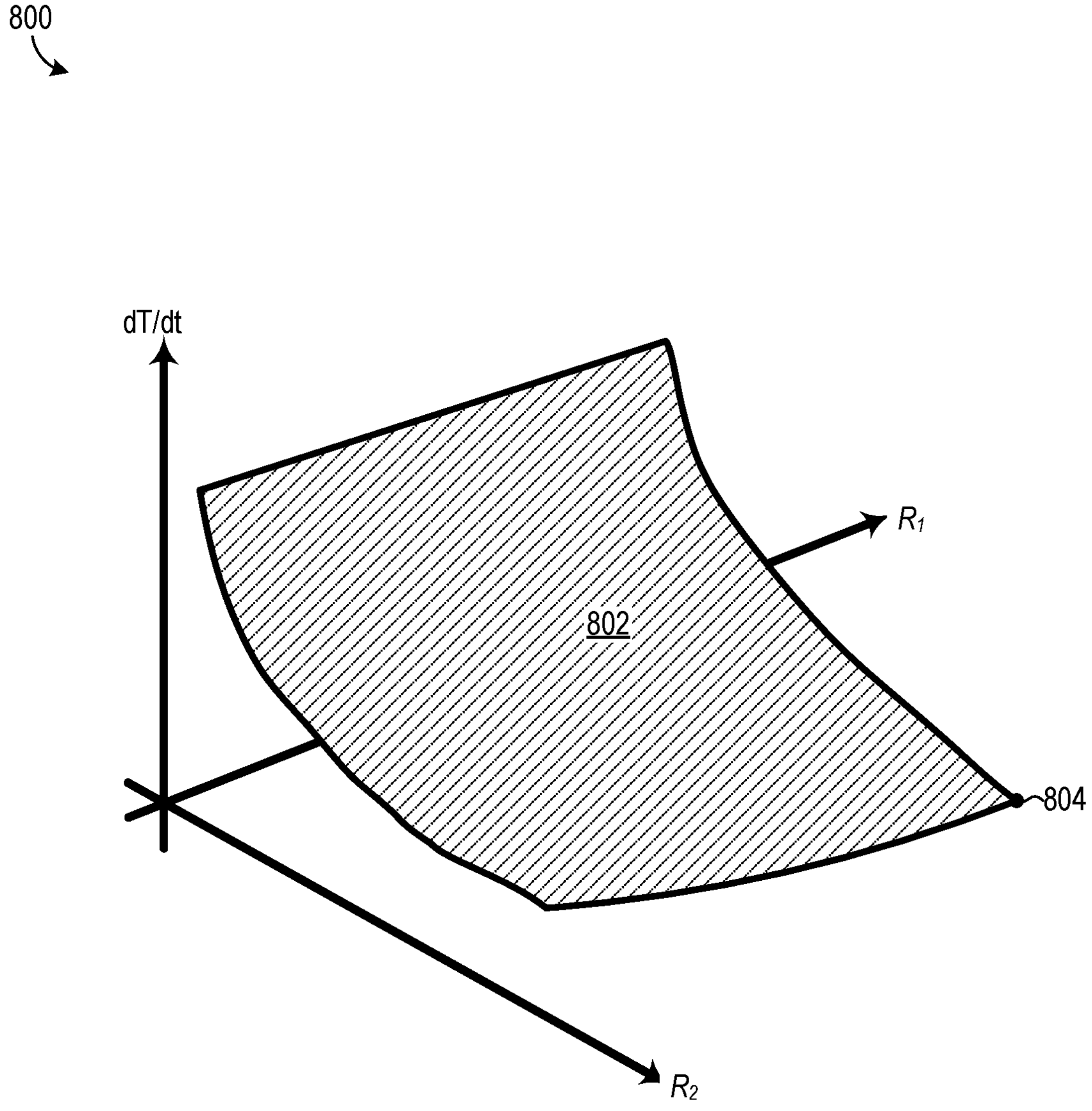
FIG. 8 is a graph illustrating minimum required dimensions of one embodiment of the FIG. 1 thermal cycle detector.

For example, FIG. 8 is graph 800 illustrating required minimum values of dimension $R_1$ and dimension $R_2$ is one embodiment of thermal cycle detector 100. Dimension $R_1$ is width of second temperature reservoir 104 in first direction 114, and dimension $R_2$ is width of the combination of first thermal barrier 106 and second temperature reservoir 104 in first direction 114, as illustrated in FIG. 7. Graph 800 includes respective axes representing each of dimension $R_1$, dimension $R_2$, and rate of change in temperature (dT/dt) at temperature sensing location 702 during a thermal cycle. Graph 800 includes a surface 802 representing the minimum permissible value of dT/dt at each of a plurality of pairs of $R_1$ and $R_2$ values. As evident from graph 800, the lower the value of dT/dt, the larger first thermal barrier 106 and second temperature reservoir 104 need to be. A point 804 on surface 802 represents a minimum value of dT/dt in the simulation, which corresponds to largest required values of each of $R_1$ and $R_2$ in the simulation.

Figure 9:
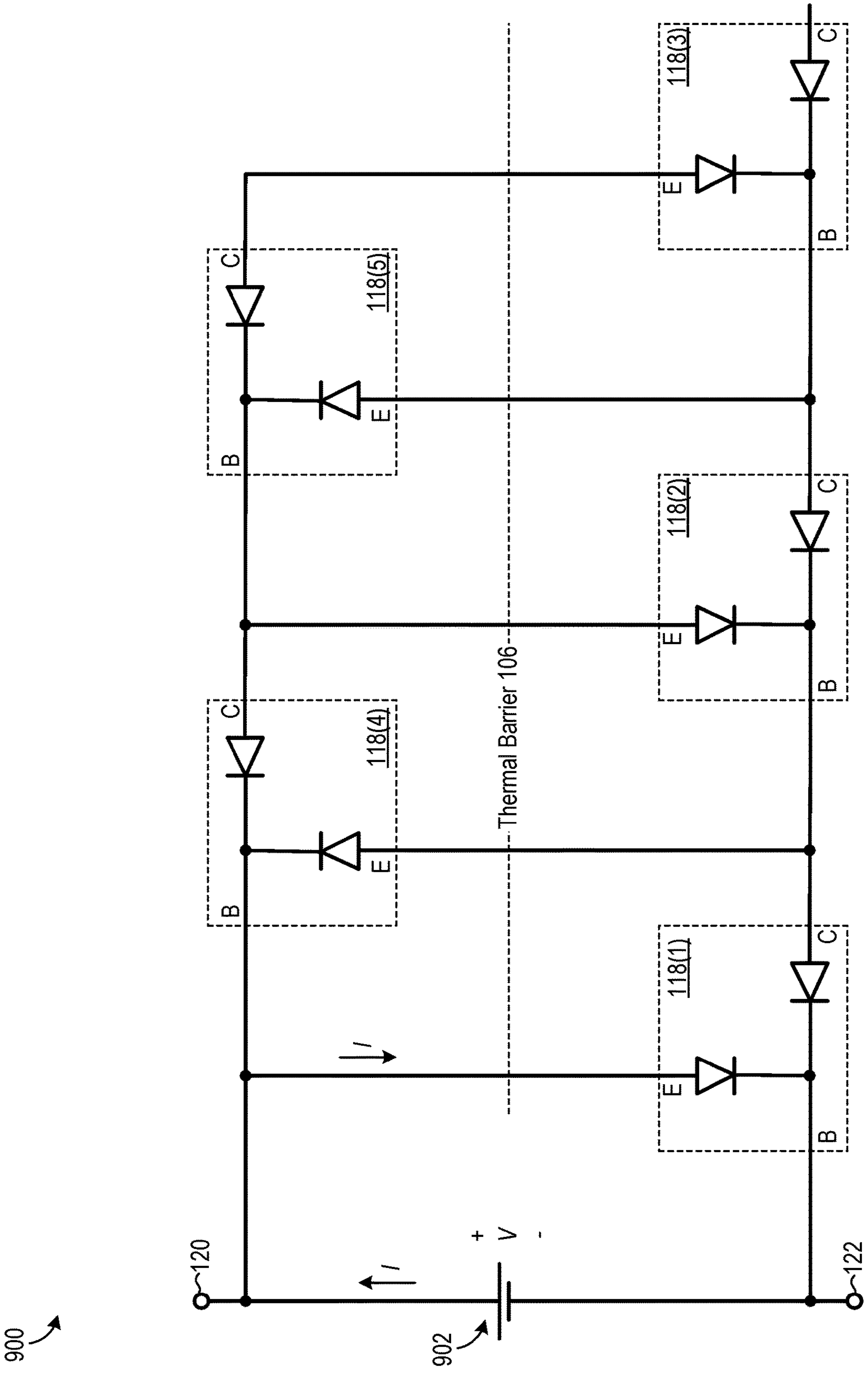
FIG. 9 is an electrical model of the FIG. 1 thermal cycle detector during a rising portion of the first thermal cycle before any transistor has undergone an irreversible change.

FIG. 9 is an electrical model 900 of thermal cycle detector 100 at the beginning of a thermal cycle where (a) sufficient heat has crossed second thermal barrier 108 and first thermal barrier 106 such that first temperature reservoir 102 is warmer than second temperature reservoir 104, (b) and before any transistors 118 have undergone an irreversible change. Each transistor 118 is modeled by two diodes in a manner analogous to electrical model 234 of transistor 200 illustrated in FIG. 2B. A dashed line symbolically represents first thermal barrier 106. Accordingly, transistors 118(1)-118(3) are located on one side of first thermal barrier 106, and transistors 118(4) and 118(5) are located on the other side of first thermal barrier 106. The electrical power source collectively formed by the series connection of first electrical conductors 110 is represented by a voltage source 902 having a positive polarity, i.e., voltage at first power node 120 is greater than the voltage at second power node 122, due to first temperature reservoir 102 being warmer than second temperature reservoir 104. Consequently, a current I flows between voltage source 902 and transistor 118(1).

Figure 10:
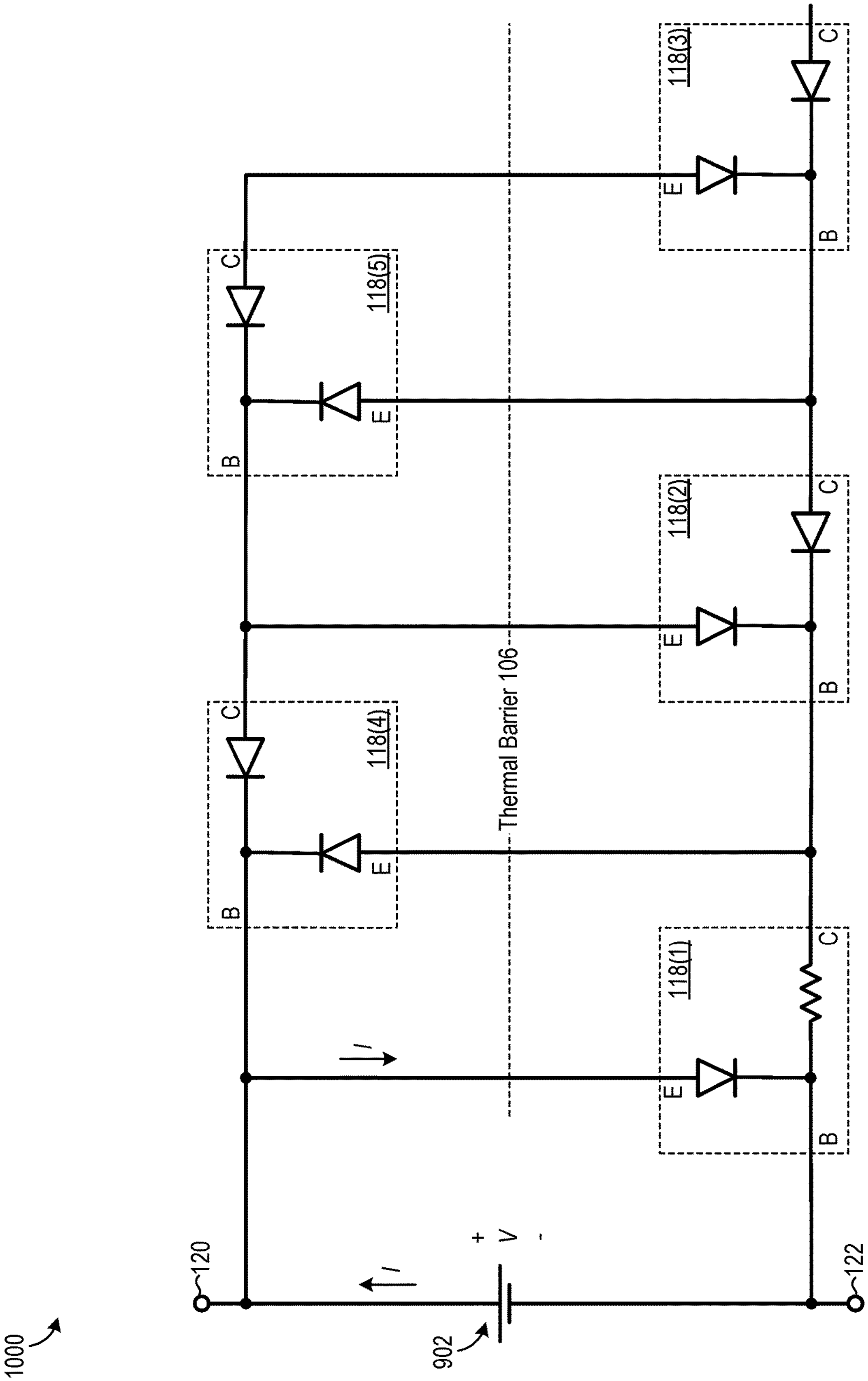
FIG. 10 is an electrical model of the FIG. 1 thermal cycle detector during a rising portion of the first thermal cycle after a transistor has undergone an irreversible change.

Each of transistors 118(1)-118(3) is thermally coupled in parallel in first temperature reservoir 102, as discussed above. Consequently, each of transistors 118(1)-118(3) will be at substantially the same temperature. However, neglecting non-ideal properties of transistors 118, only transistor 118(1) is electrically forward biased, as shown in FIG. 9 by current I flowing through transistor 118(1) but not through the remaining transistors 118(2)-118(4). Consequently, solely transistor 118(1) is affected by the temperature rise of the first thermal cycle. Specifically, once first temperature reservoir 102 has reached a sufficiently high temperature such that counter dopant atoms in the emitter region of transistor 118(1) are mobile, the base-collector junction of transistor 118(1) changes from a P-N junction to either an N-N junction or a P-P junction, depending on whether transistor 118(1) is a P-N-P transistor or an N-P-N transistor, in a manner analogous to that discussed above with respect to FIGS. 2A and 3A. FIG. 10 is an electrical model 1000 of thermal cycle detector 100 after the irreversible change to transistor 118(1). As illustrated in FIG. 10, the diode of transistor 118(1) between the cathode and base regions has changed to a resistor. Accordingly, changing of the cathode-base diode in transistor 118(1) to a resistor indicates that thermal cycle detector 100 has been subjected to the rising portion of a thermal cycle, i.e., heating of thermal cycle detector 100 to at least a minimum temperature required for a thermal event to be detected as a thermal cycle.

It should be noted that there will be no further changes to thermal cycle detector 100 as long as it remains heated above the minimum temperature required for a thermal event to be detected as a thermal cycle. For example, there will be no further changes to thermal cycle detector 100 even if its temperature temporarily decreases, as long as a temperature of thermal cycle detector 100 remains above the minimum value for a thermal event to be detected as a thermal cycle. As another example, there will be no further changes to thermal cycle detector 100 even if its temperature remains elevated for an extended period.

Figure 11:
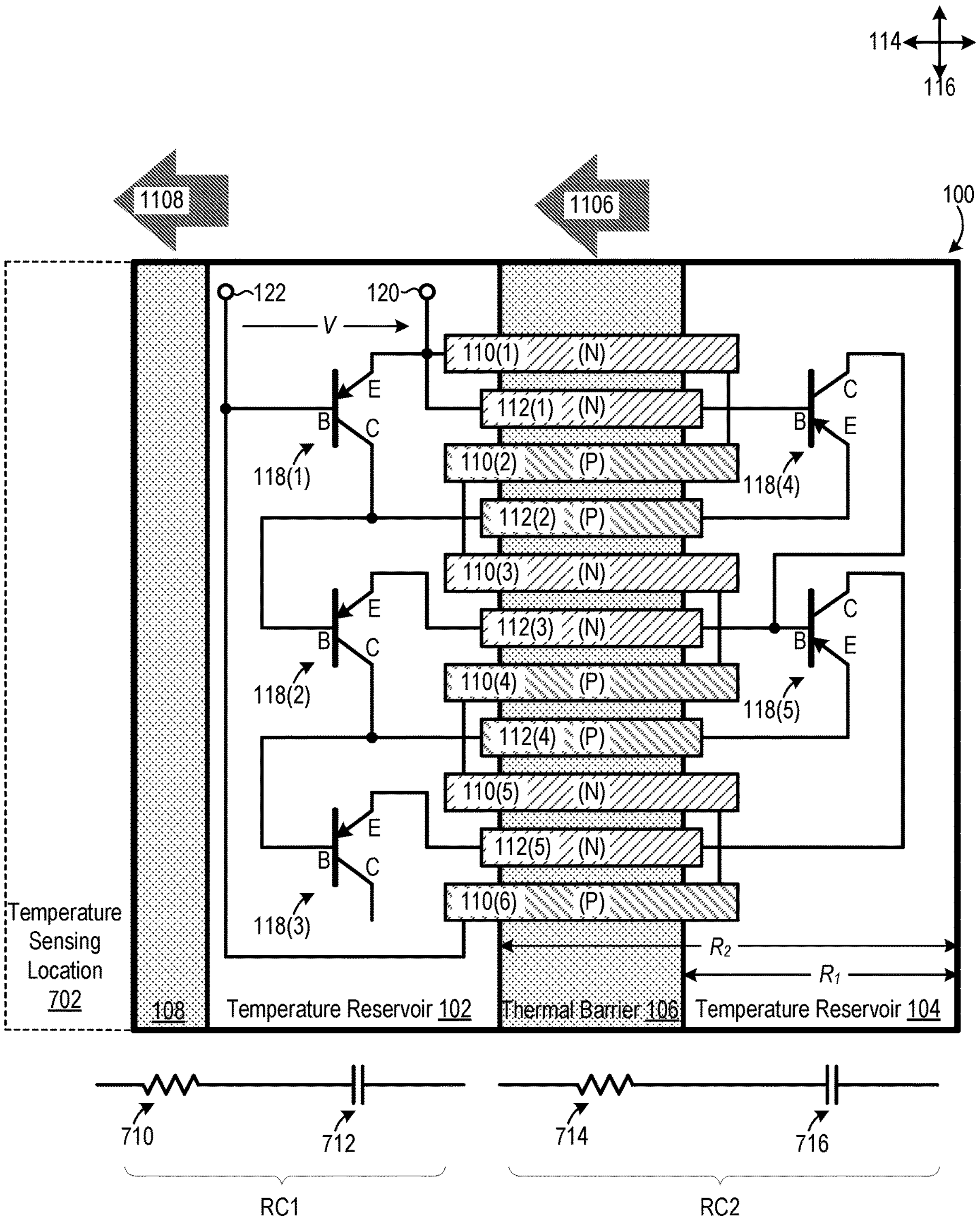
FIG. 11 is a schematic diagram of the FIG. 1 thermal cycle detector during a falling portion of the first thermal cycle.

FIG. 11 is a schematic diagram of thermal cycle detector 100 at an end of the first thermal cycle, i.e., when temperature of thermal cycle detector 100 is falling. Temperature sensing location 702 has cooled, as symbolically shown by lack of a heat source in temperature sensing location 702. Due to presence of thermal time constants RC1 and RC2, it will take time for first temperature reservoir 102 and second temperature reservoir 104 reservoirs to cool, that is, for the two temperature reservoirs to fall to the temperature of temperature sensing location 702. An arrow 1106 represents flow of heat from second temperature reservoir 104 to first temperature reservoir 102, and an arrow 1108 represents flow of heat from first temperature reservoir 102 to temperature sensing location 702.

Figure 12:
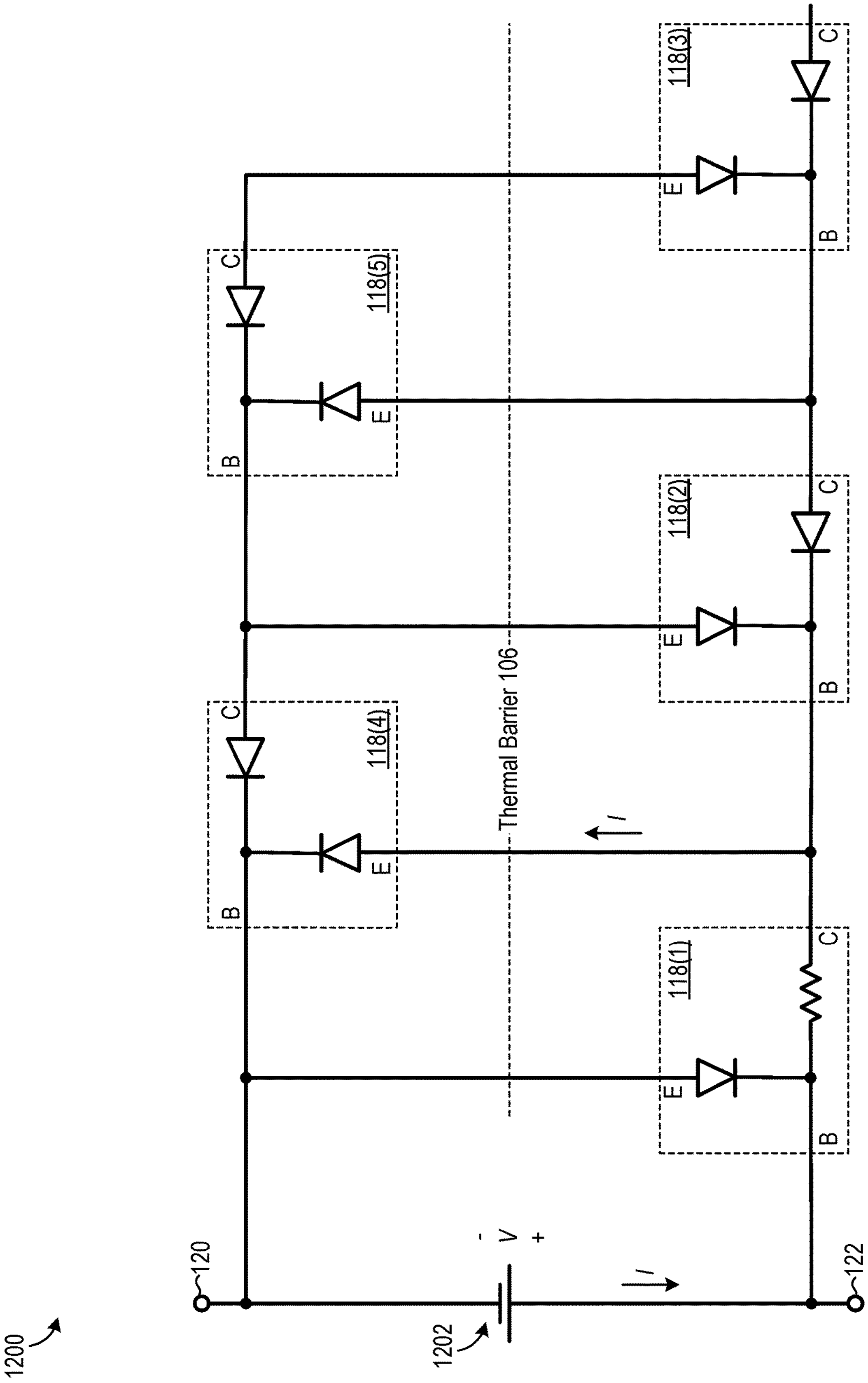
FIG. 12 is an electrical model of the FIG. 1 thermal cycle detector during a falling portion of the first thermal cycle before a second transistor has undergone an irreversible change.
Figure 13:
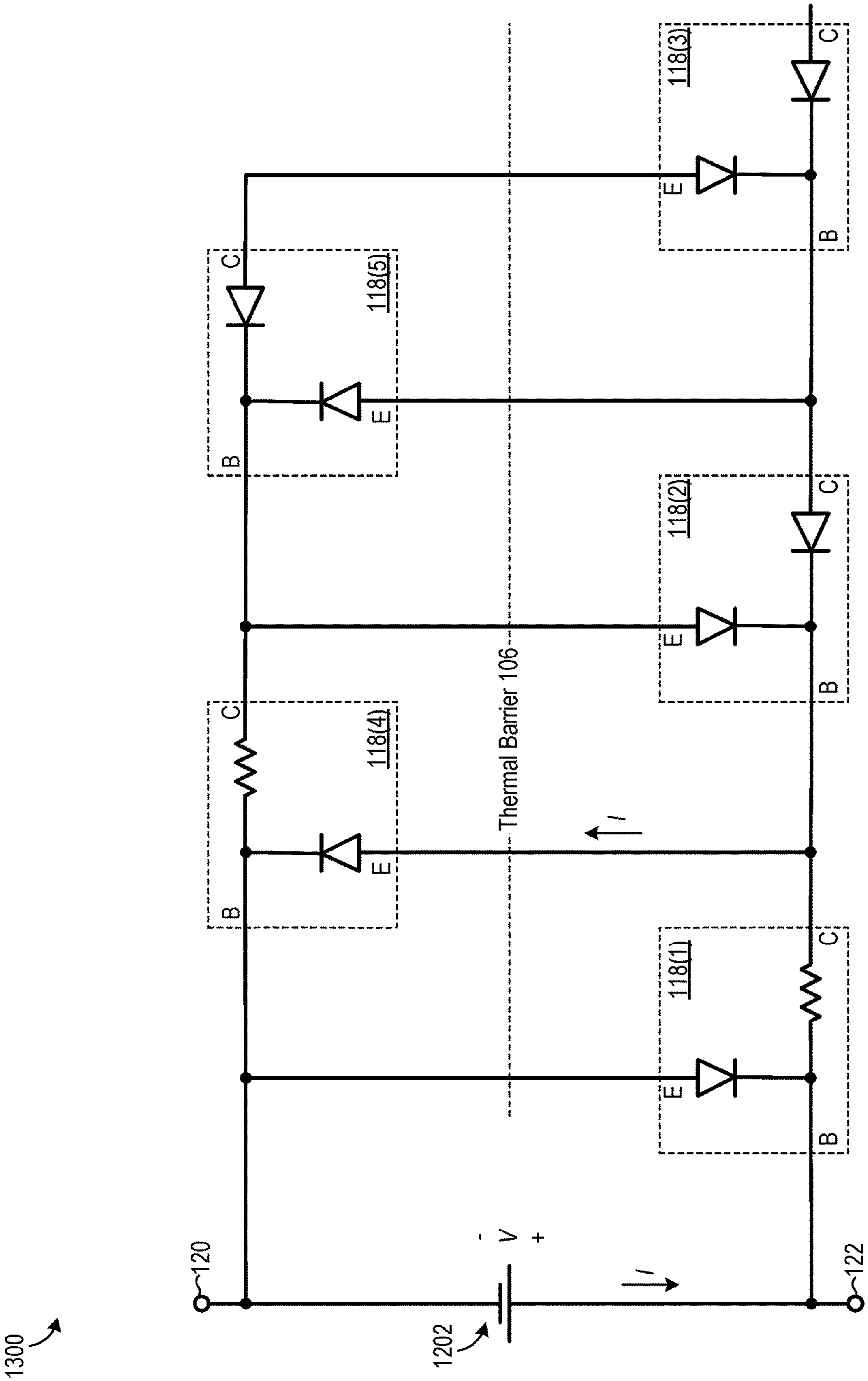
FIG. 13 is an electrical model of the FIG. 1 thermal cycle detector during a falling portion of the first thermal cycle after a second transistor has undergone an irreversible change.

FIG. 12 is an electrical model 1200 of thermal cycle detector 100 at the end of the first thermal cycle before a second transistor 118 has undergone an irreversible change. The electrical power source collectively formed by the series connection of first electrical conductors 110 is represented by a voltage source 1202 having a negative polarity, i.e., voltage at power node 122 is greater than voltage at power node 120, due to second temperature reservoir 104 being warmer second than first temperature reservoir 102. Consequently, a current I flows between voltage source 1202 and transistor 118(4). Neglecting non-ideal properties of transistors 118, solely transistor 118(4) is electrically forward electrically biased, as shown in FIG. 12 by current I flowing through transistor 118(4) but not through other transistors 118(1)-118(3) and 118(5). Consequently, solely transistor 118(4) is affected by the temperature fall of the first thermal cycle. In response to transistor 118(4) being at elevated temperature and the electrical bias provided by voltage source 1202, the base-collector junction of transistor 118(4) changes from a P-N junction to either an N-N junction or a P-P junction, depending on whether transistor 118(4) is P-N-P transistor or an N-P-N transistor, in a manner analogous to that discussed above with respect to FIGS. 2A and 3A. FIG. 13 is an electrical model 1300 of thermal cycle detector 100 after the irreversible change to transistor 118 (4). As illustrated in FIG. 13, the diode of transistor 118(4) between the cathode and base regions has changed to a resistor. Accordingly, changing of the cathode-base diode in transistor 118(4) to a resistor indicates that thermal cycle detector 100 has been subjected to the falling portion of a first thermal cycle, i.e., cooling of thermal cycle detector 100 to a temperature below a minimum temperature required for a thermal event to be detected as a thermal cycle. There will be no further changes to thermal cycle detector 100 until a next rise in temperature of a subsequent thermal cycle.

Figure 14:
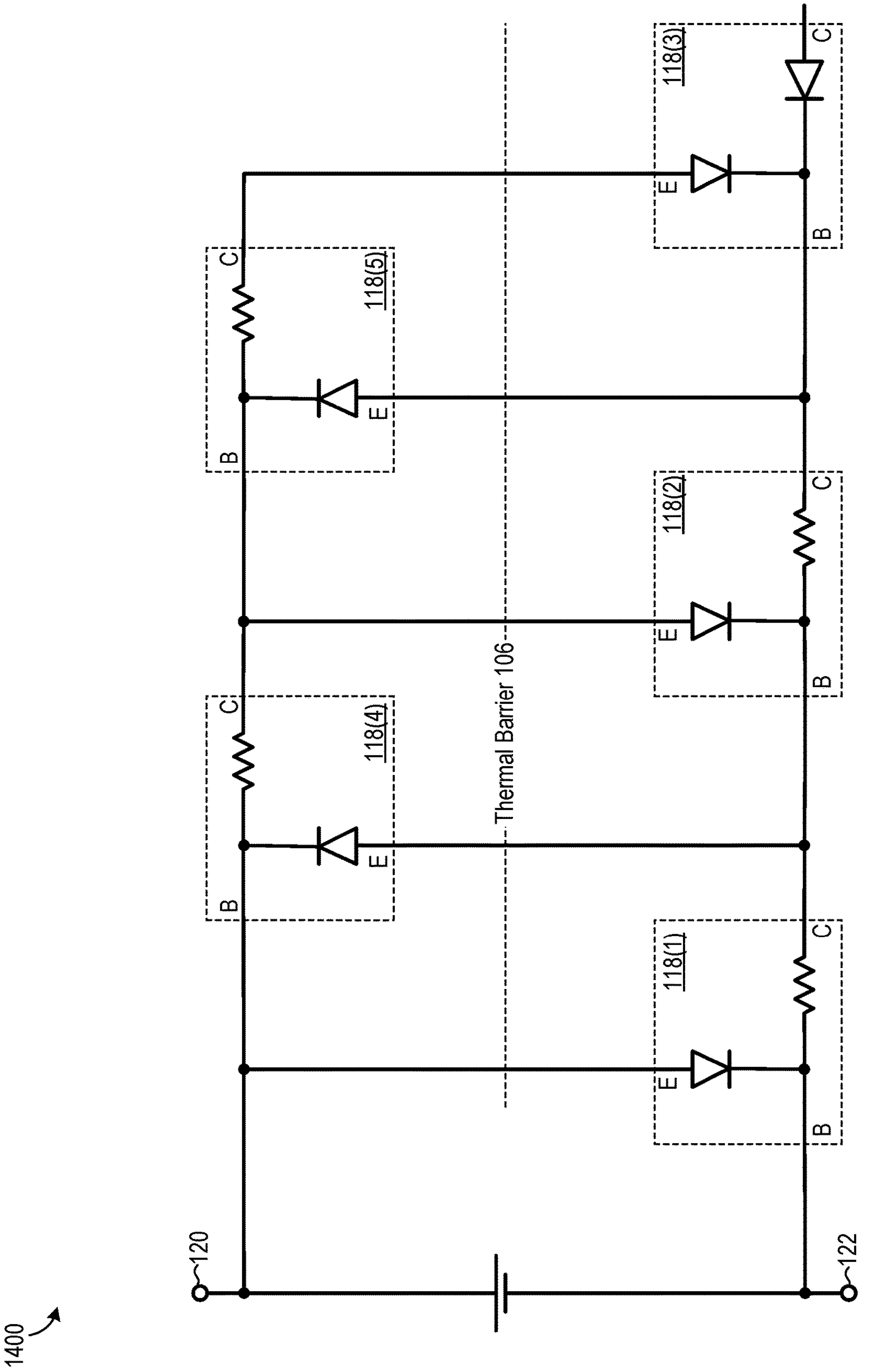
FIG. 14 is an electrical model of the FIG. 1 thermal cycle detector after the thermal cycle detector has been subjected to two complete thermal cycles.

Accordingly, the irreversible change in pair of transistors 118(1) and 118(4) indicates that thermal cycle detector 100 has been subjected to a first complete thermal cycle. Each additional thermal cycle will cause each transistor 118 of another pair of transistors 118, i.e., one transistor 118 in temperature reservoir 102 and one transistor 118 in temperature reservoir 104, to undergo an irreversible change. For example, FIG. 14 is an electrical model 1400 of thermal cycle detector 100 after it has undergone two complete thermal cycles. As illustrated in FIG. 14, two pairs of transistors, i.e. a first pair including transistors 118(1) and 118(4) and a second pair including transistors 118(2) and 118(5), have undergone an irreversible change.

As such, the number of thermal cycles detected by thermal cycle detector 100 can be determined by counting the number of pairs of transistor 118 that have undergone an irreversible change. The number of pairs of transistors 118 that have undergone an irreversible change may be determined, for example, by applying a voltage to thermal cycle detector 100, e.g., across power nodes 120 and 122, and measuring the resulting current, or by applying a current to thermal cycle detector 100 and measuring the resulting voltage. It should be appreciated that the fact that the number of detected thermal cycles is represented by number of diodes that have changed to resistors creates a record of number of detected thermal cycles that is substantially unalterable under ordinary conditions.

Figure 15A:
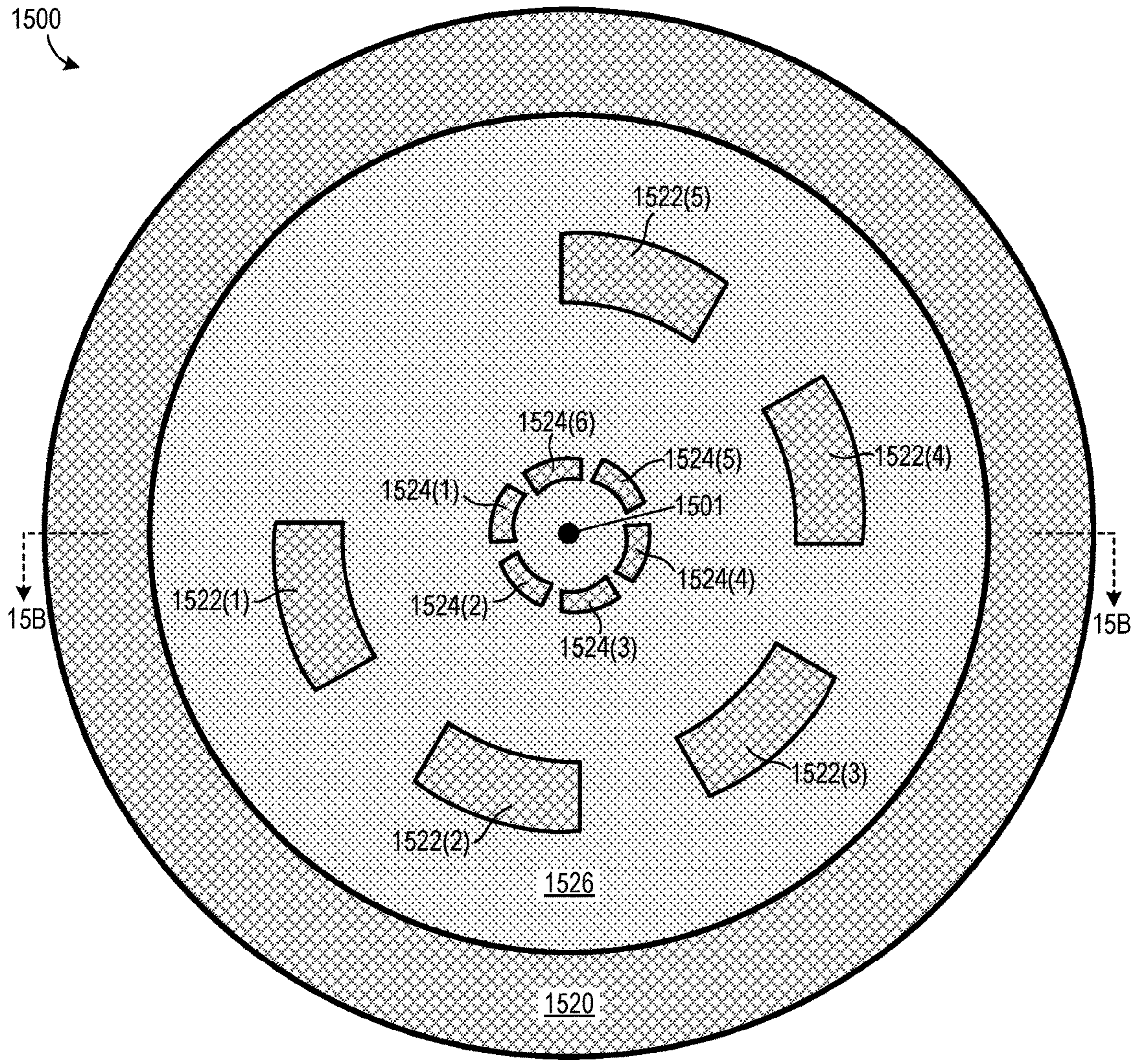
FIG. 15A is a top plan view of an embodiment of the FIG. 1 thermal cycle detector.
Figure 15B:
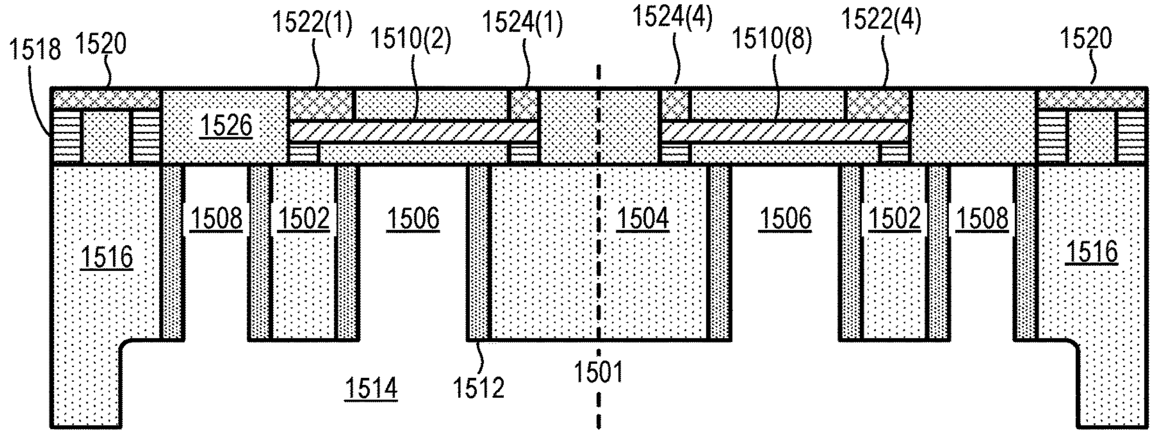
FIG. 15B is a cross-sectional view of the FIG. 15A thermal cycle detector taken along line 15B-15B of FIG. 15A.

While FIG. 1 illustrates thermal cycle detector 100 as having a rectangular shape, thermal cycle detector 100 could be configured to have other shapes, such as a round shape, a triangular shape, or an irregular shape, as long as the thermal cycle detector includes (a) two temperature reservoirs separated by a thermal barrier and (b) first electrical conductors spanning the thermal barrier. For example, FIG. 15 is a top plan view of a thermal cycle detector 1500, which is one possible embodiment of thermal cycle detector 100 of FIG. 1 having a round shape. FIG. 15B is a cross-sectional view of thermal cycle detector 1500 taken along line 15B-15B of FIG. 15A. Various elements of thermal cycle detector 1500 are concentric with respect to a center axis 1501. In particular, thermal cycle detector 1500 includes a first temperature reservoir 1502, a second temperature reservoir 1504, a first thermal barrier 1506, and a second thermal barrier 1508, which are embodiments of first temperature reservoir 102, second temperature reservoir 104, first thermal barrier 106, and second thermal barrier 108, respectively. Each of first temperature reservoir 1502, second temperature reservoir 1504, first thermal barrier 1506, and second thermal barrier 1508 are concentric with respect to center axis 1501. In certain alternate embodiments, however, the aforementioned mentioned elements of thermal cycle detector 1500 are only substantially concentric with respect to center axis 1501 (or another axis), or the aforementioned elements of thermal cycle detector 1500 are not concentric.

Each of first temperature reservoir 1502 and second temperature reservoir 1504 is formed of a semiconductor material, such as silicon or germanium, and a plurality of transistors 118 (not shown in FIGS. 15A and 15B) are formed in each temperature reservoir, such as by doping the semiconductor material forming the two temperature reservoirs. Each of first thermal barrier 1506 and second thermal barrier 1508 is embodied by a trench formed in semiconductor material, where the trench is lined with an oxide material 1512 and filled with air or another gas. Only one instance of oxide material 1512 is labeled in FIG. 15B for illustrative clarity. The fact that first thermal barrier 1506 and second thermal barrier 1508 include trenches that are filled with air (or another gas) causes the thermal barriers to be very effective at impeding heat flow. Additionally, thermal cycle detector 1500 includes an cavity 1514, filled with air or another gas, below each of first temperature reservoir 1502, second temperature reservoir 1504, first thermal barrier 1506, and second thermal barrier 1508. Cavity 1514 further enhances effectiveness of first thermal barrier 1506 and second thermal barrier 1508 in impeding heat transfer. Consequently, thermal cycle detector 1500 has large thermal time constants, which makes the thermal cycle detector suitable for detecting thermal cycles with slow change in temperature.

Figure 15C:
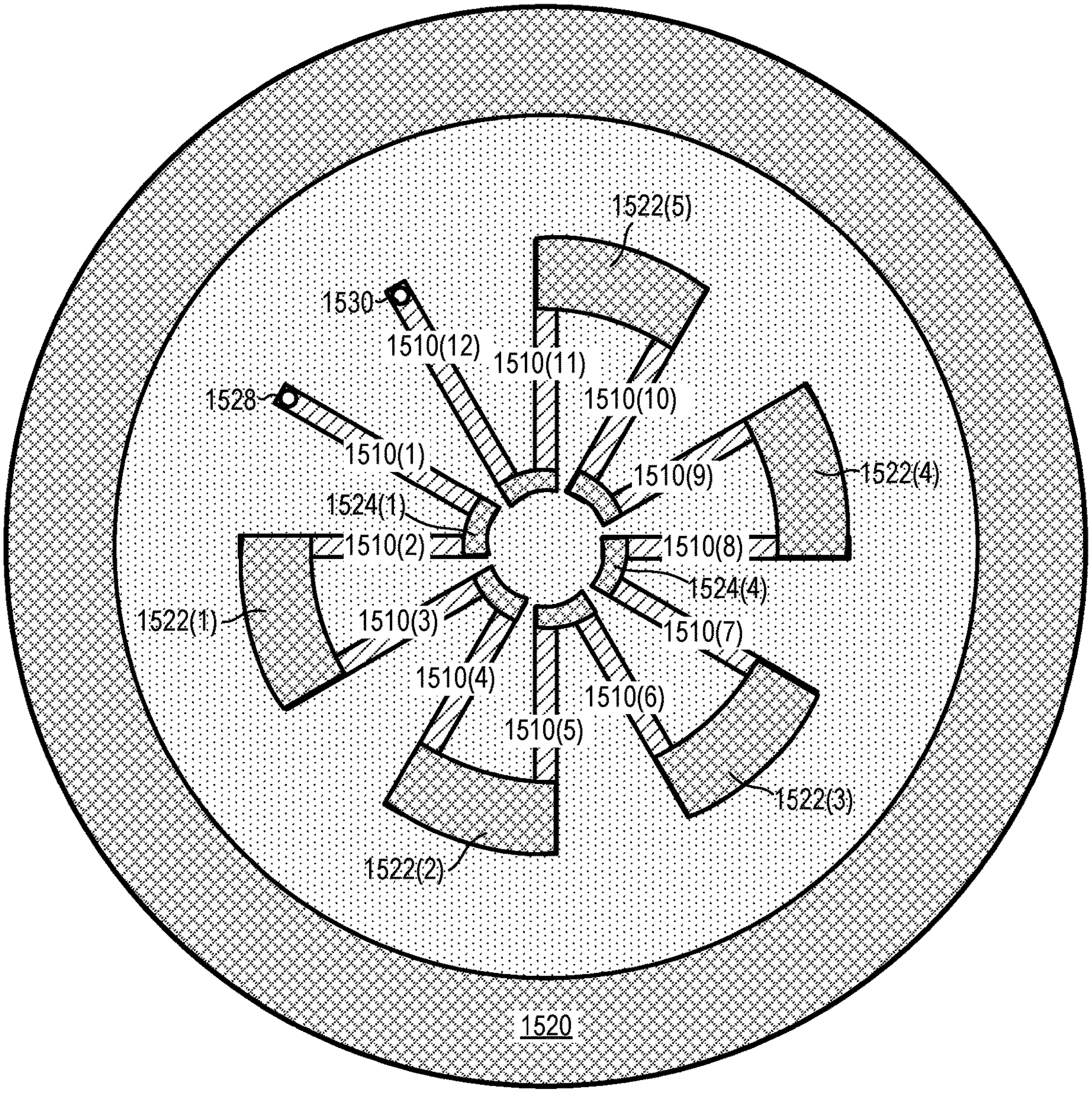
FIG. 15C is a top plan view of the FIG. 15A thermal cycle detector with a passivation layer omitted.

Thermal cycle detector 1500 further includes a temperature sensing location 1516, a plurality of metalized regions 1518 (only one of which is labeled), a plurality of first electrical conductors 1510, a first heatsink 1520, a plurality of second heatsinks 1522, a plurality of third heatsinks 1524, and a passivation layer 1526. FIG. 15C is a top plan view of thermal cycle detector 1500 with passivation layer 1526 omitted, to show first electrical conductors 1510. Temperature sensing location 1516 is analogous to temperature sensing location 702 of FIG. 7, and temperature sensing location 1516 is concentric with respect to center axis 1501. In some alternate embodiments, however, temperature sensing location 1516 is only substantially concentric with respect to center axis 1501, or temperature sensing location 1516 is not concentric with respect to center axis 1501. First heatsink 1520 is thermally coupled to temperature sensing location 1516 by metalized regions. First electrical conductors 1510 are embodiments of first electrical conductors 110 of FIG. 1, and first electrical conductors span first thermal barrier 1506. First electrical conductors 1510 are electrically coupled in series between a first power node 1528 and a second power node 1530 via second heatsinks 1522 and third heatsinks 1524, as illustrated in FIG. 15C. First power node 1528 and second power node 1530 are embodiments of first power node 120 and second power node 122 of FIG. 1, respectively. First electrical conductors 1510 are doped with an N-type dopant and P-type dopant in an alternating manner. For example, in certain embodiments, first electrical conductor 1510(1) is doped with an N-type dopant, first electrical conductor 1510(2) is doped with a P-type dopant, first electrical conductor 1510(3) is doped with an N-type dopant, and so on. In some embodiments, first electrical conductors 1510 are formed of a polysilicon material doped with either an N-type dopant or a P-type dopant. First electrical conductors 1510 are electrically coupled to first temperature reservoir 1502 and second temperature reservoir by metalized regions. Thermal cycle detector 1500 additional includes embodiments of second electrical conductors 112 spanning first thermal barrier 1506, but these electrical conductors are not shown for illustrative clarity.

Figure 16A:
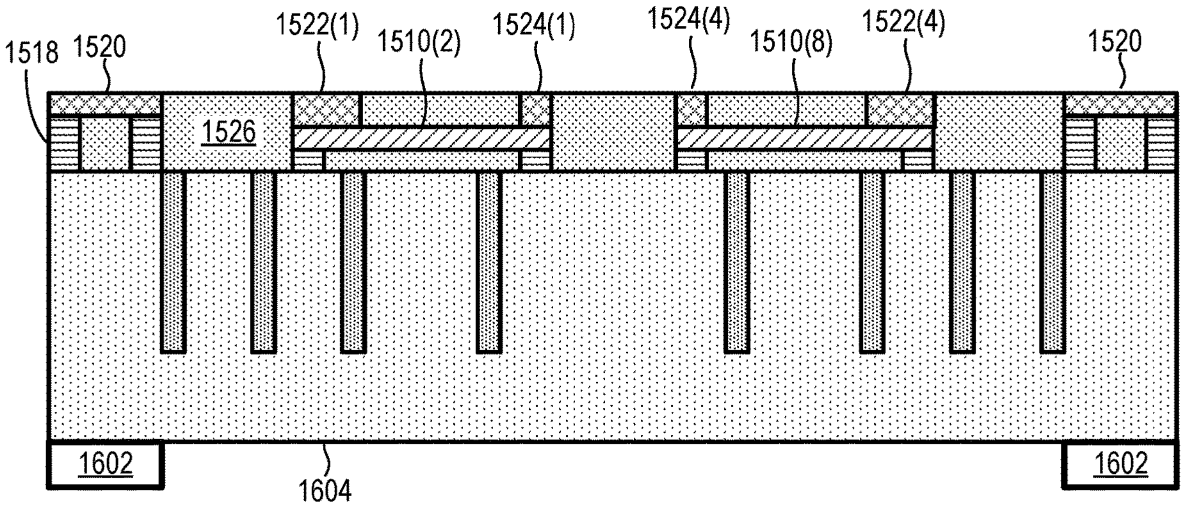
FIG. 16A is a cross-sectional view of the FIG. 15A thermal cycle detector before forming trenches of thermal barriers.
Figure 16B:
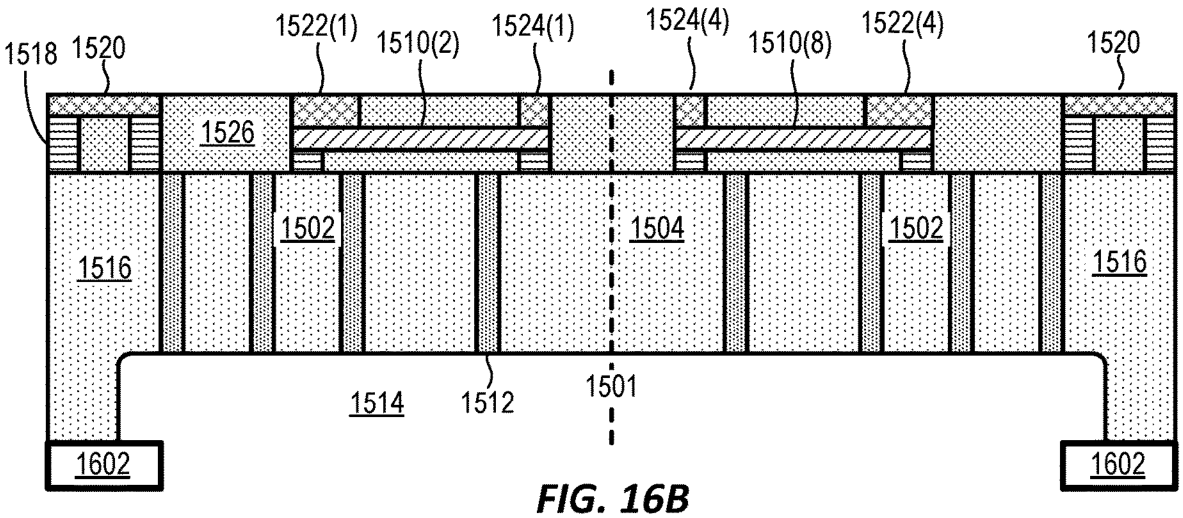
FIG. 16B is a cross-sectional view of the FIG. 15A thermal cycle detector after etching semiconductor material from the bottom of the thermal cycle detector.
Figure 16C:
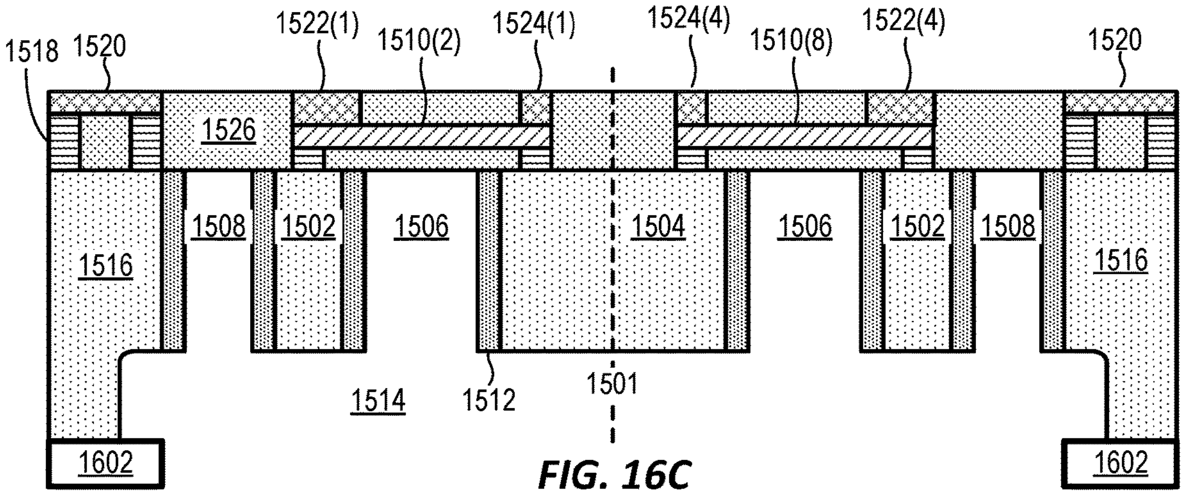
FIG. 16C is a cross-sectional view of the FIG. 15A thermal cycle detector after etching semiconductor material from the top of the thermal cycle detector.

FIGS. 16A-16C are cross-sectional views analogous to the cross-sectional view of FIG. 15B illustrating one example of how trenches may be formed in semiconductor material of thermal cycle detector 1500. It is understood, however, that the trenches of thermal cycle detector 1500 could be formed in other manners. FIG. 16A depicts thermal cycle detector 1500 with a mask 1602, e.g., an oxide hard mask, formed on a bottom surface 1604 in preparation for etching. FIG. 16B depicts thermal cycle detector 1500 after etching cavity 1514 from the bottom of the thermal cycle detector via an opening in mask 1602, such as by using a wet etching process. FIG. 16C illustrates thermal cycle detector 1500 after etching through openings (not shown) in a top of thermal cycle detector, to form the respective trenches of first thermal barrier 1506 and second thermal barrier 1508 in semiconductor material of thermal cycle detector 1500.

Figure 17:
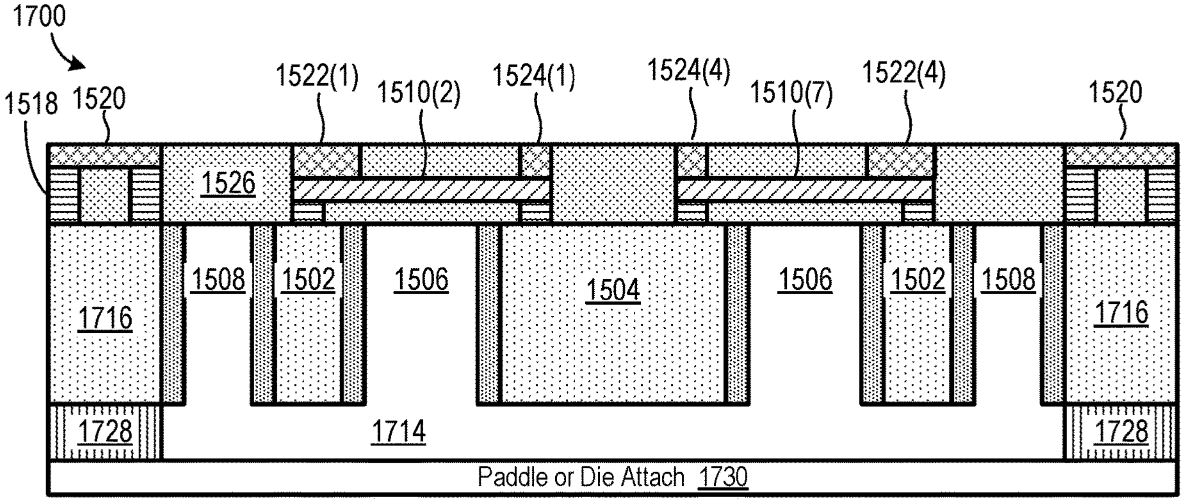
FIG. 17 is a cross-sectional view of an alternate embodiment of the FIG. 15A thermal cycle detector.

FIG. 17 is a cross-sectional view analogous to the FIG. 15B cross-sectional view of a thermal cycle detector 1700, which is an alternate embodiment of thermal cycle detector 1500. Thermal cycle detector 1700 includes a spacer 1728 in place of semiconductor material to offset first temperature reservoir 1502 and second temperature reservoir 1504 from a paddle or die attach 1730, to help achieve large thermal time constants. Consequently, thermal cycle detector 1700 has an cavity 1714 in place of cavity 1514. Additionally, thermal cycle detector 1700 includes temperature sensing location 1716 in place of temperature sensing location 1516, due to presence of spacer 1728. Paddle/die attach 1730 is not necessarily part of thermal cycle detector 1700.

Figure 18:
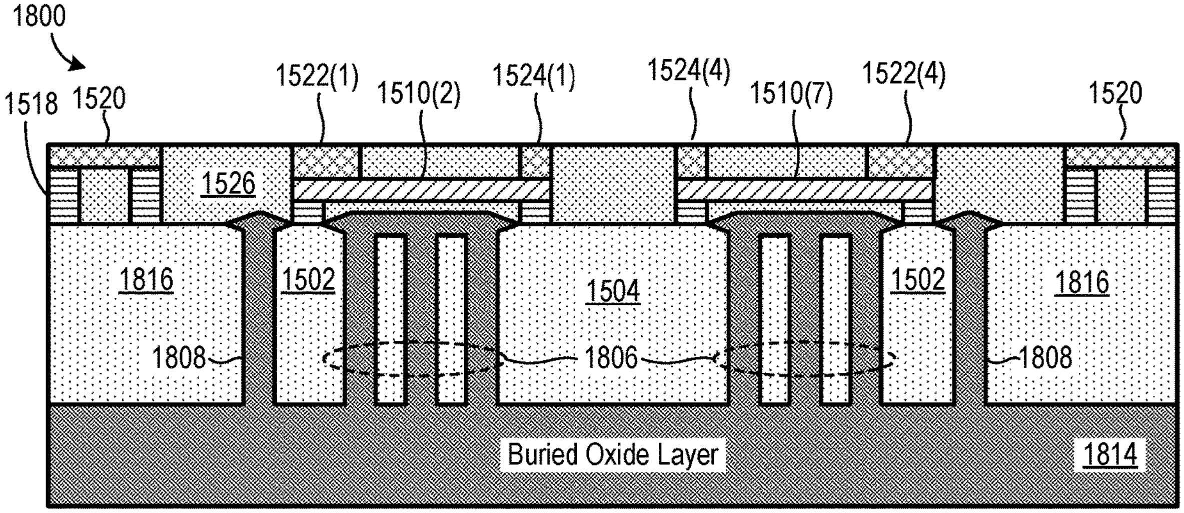
FIG. 18 is a cross-sectional view of another alternate embodiment of the FIG. 15A thermal cycle detector.

FIG. 18 is a cross-sectional view analogous to the FIG. 15B cross-sectional view of a thermal cycle detector 1800, which is another alternate embodiment of thermal cycle detector 1500. Thermal cycle detector 1800 includes a buried oxide layer 1814 in place of cavity 1514. Additionally, thermal cycle detector 1800 includes a first thermal barrier 1806 in place of first thermal barrier 1506, as well as a second thermal barrier 1808 in place of second thermal barrier 1508. First thermal barrier 1806 includes a plurality of trenches formed in semiconductor material where the trenches are filled with an oxide material. Second thermal barrier 1808 includes a single trench formed in semiconductor material, where the trench is filled with an oxide material. In some embodiments, the oxide material filling trenches of first thermal barrier 1806 and second thermal barrier 1808 is the same type of oxide material forming buried oxide layer 1814. Additionally, thermal cycle detector 1800 includes temperature sensing location 1816 in place of temperature sensing location 1516. Thermal cycle detector 1800 has a smaller thermal time constant than thermal cycle detector 1500.

Figure 19:
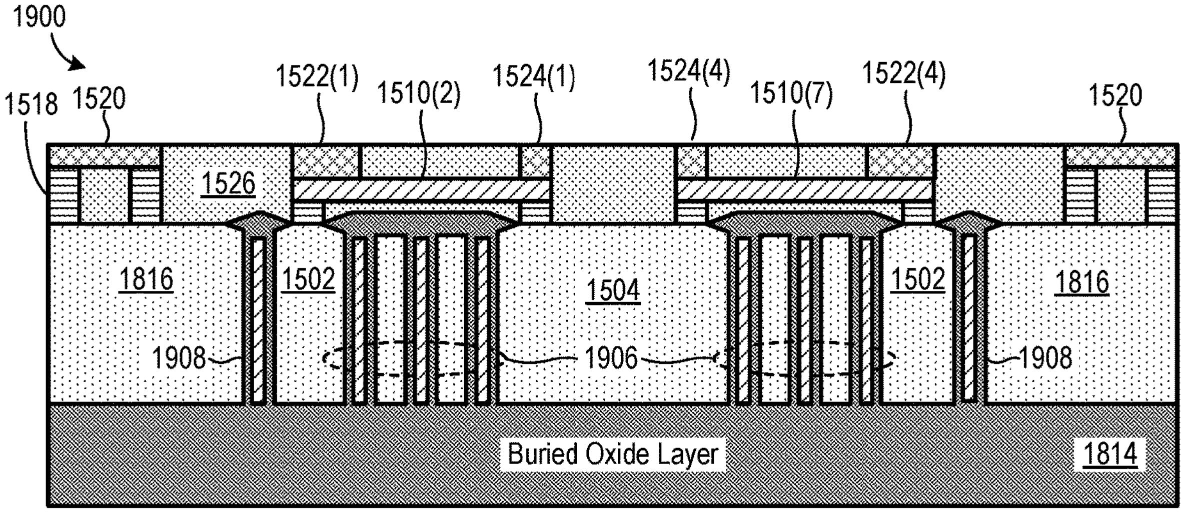
FIG. 19 is a cross-sectional view of an alternate embodiment of the FIG. 18 thermal cycle detector.

FIG. 19 is a cross-sectional view analogous to the FIG. 15B cross-sectional view of a thermal cycle detector 1900, which is an alternate embodiment of thermal cycle detector 1800 where first thermal barrier 1806 and second thermal barrier 1808 are replaced with first thermal barrier 1906 and second thermal barrier 1908, respectively. Each of first thermal barrier 1906 and second thermal barrier 1908 includes trenches lined with oxide material but filled with polysilicon material, instead of trenches that are completely filled with oxide material.

Applicant has additionally developed packaging embodiments for thermal cycle detectors that can be chosen depending on the specific requirements of the application. Certain embodiments are constructed to specifically prevent or reduce flow of heat around thermal barriers. For example, some of the packages are configured such that package elements, e.g., mould compound and/or a packaging substrate, do not directly contact thermal barriers or temperature reservoirs, thereby helping prevent undesired heat transfer. There may also be applications where connecting the barriers or temperature reservoirs directly to supporting substrates, encapsulant, and/or package structure is desirable, e.g., in an application where a fast thermal transient is required. Discussed below with respect to FIGS. 20A-29 are several examples of the new packages for embodiments of the thermal cycle detectors, such as the thermal cycle detectors of FIGS. 15A-19. It is understood, however, that the example packages of FIGS. 20A-29 could be adapted to thermal cycle detectors having other shapes, form factors, stack thicknesses, electrical conductor configurations, and so on, depending on the specific requirements of the application. The shape and size/form factor of the package can also be modified to be incorporated with a body or structure (where the monitoring of the thermal cycles is critical), and the integration of the package accommodates suitable electrical contact paths such that the sensing structures can be read depending on the specific requirements of the application.

Figure 20A:
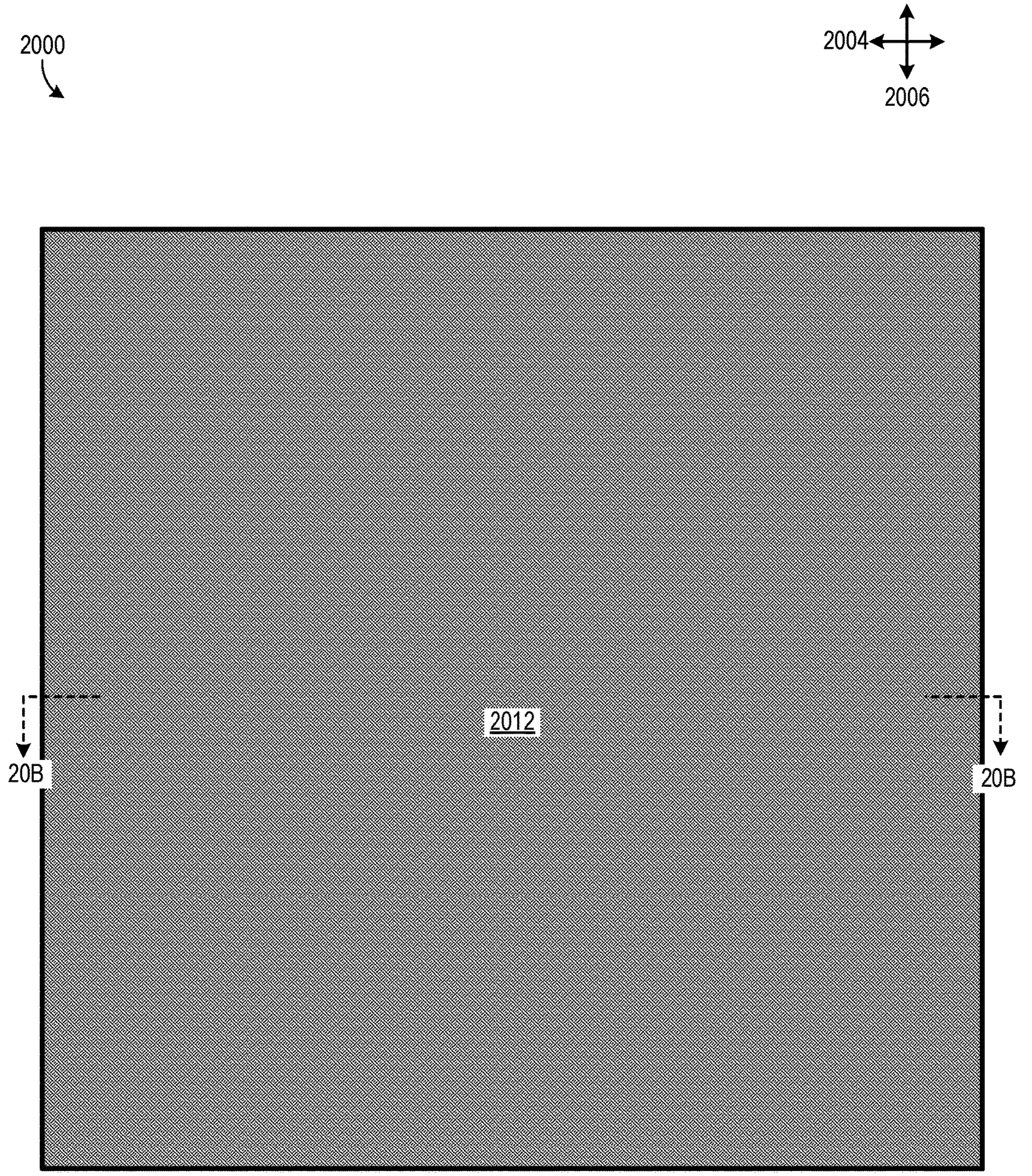
FIG. 20A is a top plan view of an assembly including a package and an embodiment of the FIG. 17 thermal cycle detector, according to an embodiment.
Figure 20B:
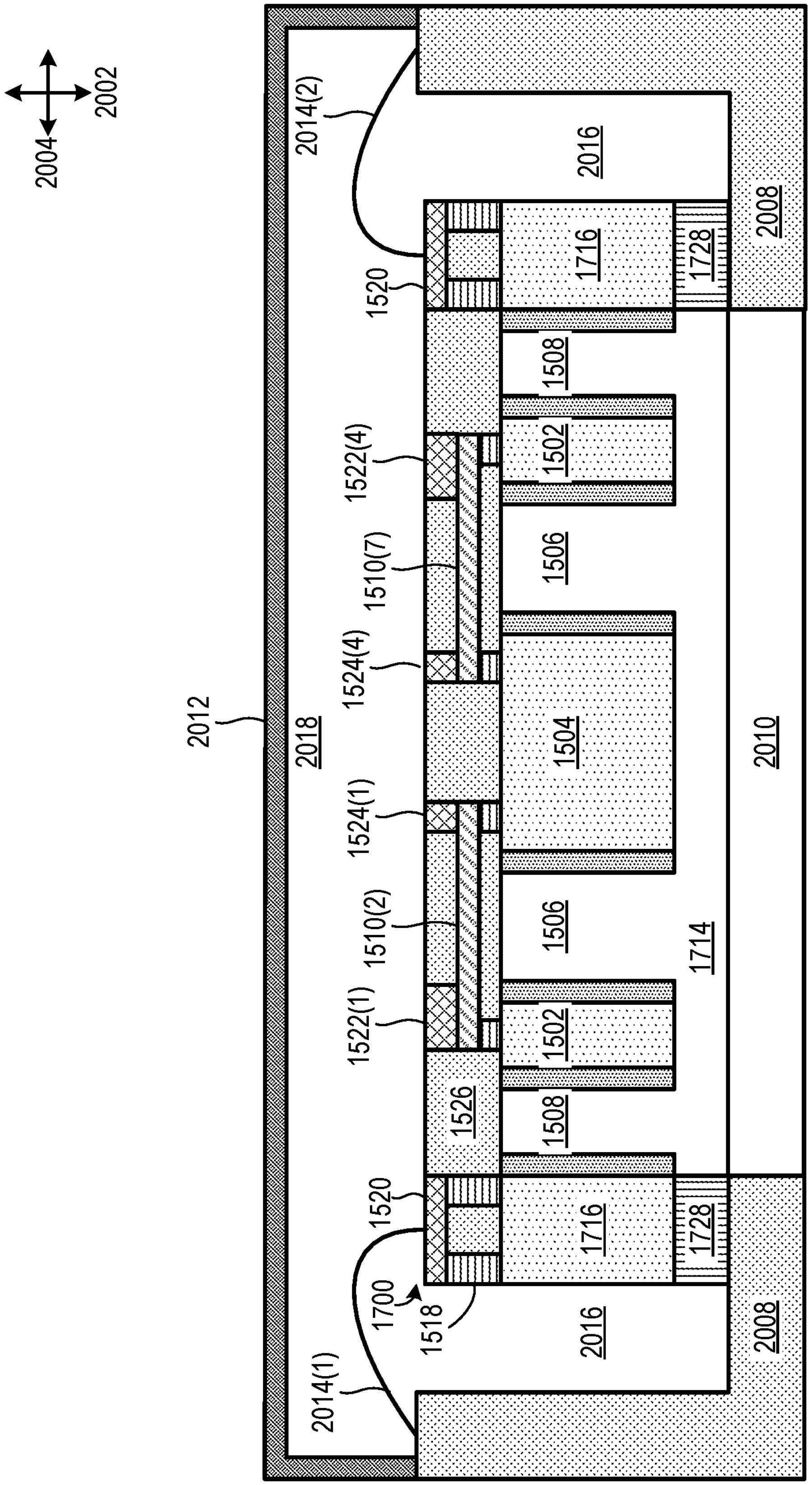
FIG. 20B is a cross-sectional view of the FIG. 20A assembly taken along line 20B-20B of FIG. 20A.

FIG. 20A is a top plan view of an assembly 2000, and FIG. 20B is a cross-sectional view of assembly 2000 taken along line 20B-20B of FIG. 20A. The shape, dimensions, construction, materials, and outline of the package of assembly 2000 can be optimized depending on the specific requirements of the application. Assembly 2000 includes an embodiment of thermal cycle detector 1700 of FIG. 17 that is packaged in an embodiment of the new packages disclosed herein. It is understood that assembly 2000 could be modified to incorporate a different thermal cycle detector, e.g., thermal cycle detector 1500, 1800, or 1900, in place of thermal cycle detector 1700. Additionally, assembly 2000 could be modified to have a different shape, such as a rectangular or circular shape, depending on the specific requirements of the application. FIGS. 20A and 20B include coordinate axes collectively showing a first direction 2002, a second direction 2004, and a third direction 2006, where each of these directions is orthogonal to each other of these directions.

Assembly 2000 includes leads or conductive traces 2008, a package base 2010, a cap or lid 2012, and a plurality of bond wires 2014, in addition to the elements of thermal cycle detector 1700. Leads or electrical contacts 2008, which may alternately be referred to as electrically conductive elements for brevity, are thermally conductive. Additionally, in certain embodiments, leads or electrical contacts 2008 form an electrical path between the thermal cycle detector and the external portions of leads or electrical contacts 2008 that are connected to the next packaging level in an application. In certain embodiments, leads or electrical contacts 2008 may be embedded within compound (in a pre-moulded cavity package, for example) such that leads or electrical contacts 2008 are partially encapsulated with only the bond wire areas and areas in contact with spacer 1728 and external areas (to be connected to the next packaging level) exposed.

Leads or electrical contacts 2008 are connected to sensing location 1716 in first direction 2002 by spacer 1728 which could be conductive paste of film, preform, or some other suitable thermally conductive medium. Alternately, in an application where the intention is to limit the thermal paths, spacer 1728 includes, for example, a non-conductive paste or film. Leads or electrical contacts 2008 are separated from temperature sensing location 1716 in second direction 2004 by a cavity 2016 filled air or another gas. The primary thermal path from first heatsink 1520 is towards leads or electrical contacts 2008 which act like a heat sink. Leads or electrical contacts 2008 are thermally coupled to first heatsink 1520 via bond wires 2014. Although two bond wires 2014 are shown in FIG. 20B, it is understood that assembly 2000 may include any number of bond wires 2014, such as additional bond wires 2014 (not shown) disposed within assembly 2000.

The package of assembly 2000 can be constructed in a number of different ways. For example, the package may be a pre-formed or moulded cavity package, or the package may be fabricated using build up and etching or 3D printing technologies to create a cavity and internal topographies or features, depending on the specific requirements of the application. FIG. 20B shows a cavity and construction such that first temperature reservoir 1502 and second temperature reservoir 1504 are not in contact with the package base 2010, thus limiting further the paths for heat to dissipate. Spacer 1728 may be thermally conductive or non-thermally-conductive, depending on the requirements of the application of assembly 2000. In some embodiments, a main purpose of the packaging construction is to limit or minimize the thermal paths from first temperature reservoir 1502 and second temperature reservoir 1504 to the lateral paths of the sensor constituent parts. Even though typical packaging encapsulants and materials are not thermally conductive (other than the portions that are intentionally electrically and thermally conductive such as leads, paddles, heat sinks, vias etc.), in particular embodiments, no contact with a package surface is more desirable than a physical connection to an insulating or poor thermally conductive material. The embodiment shown FIG. 20B could also be modified to use different interconnect technologies to connect the thermal cycle detector die to the external environment, such as conductive vias, bumps, conductive paste, anisotropic conductive film, TAB or other suitable methods, depending on the specific requirements of the application.

Package base 2010 is positioned below each of first temperature reservoir 1502, second temperature reservoir 1504, first thermal barrier 1506, and second thermal barrier 1508, in first direction 2002. Package base 2010 also forms a bottom boundary of cavity 1714, and cavity 1714 is filled, for example, with air or another gas. In particular embodiments, package base 2010 is formed of a material that has a low thermal conductivity, to promote effectiveness of first thermal barrier 1506 and second thermal barrier 1508 in impeding heat flow. This would be the case in a pre-moulded cavity package for example, or a package constructed using build up, plating and selective plating and etching with intermediate moulding steps, or with 3D printing technologies. Cap or lid 2012 is supported by leads or electrical contacts 2008, and cap or lid 2012 is disposed over thermal cycle detector 1700 in first direction 2002. In certain embodiments, cap or lid 2012 is formed of a material that has a low thermal conductivity. Cap or lid 2012 can be fabricated from epoxy or another suitable low thermal conductivity material that will adhere to leads or electrical contacts 2008. The lid could also be ceramic, glass or metallic, again, depending on the specific requirements of the application. A cavity 2018 is located between thermal cycle detector 1700 and cap or lid 2012, and cavity 2018 could be filled with air or another gas, to further promote effectiveness of first thermal barrier 1506 and second thermal barrier 1508 in impeding heat flow.

It should be appreciated that there is no direct contact between packaging of assembly 2000 any of first temperature reservoir 1502, second temperature reservoir 1504, first thermal barrier 1506, and second thermal barrier 1508. For example, cavity 1714 separates the temperature reservoirs and thermal barriers from package base 2010. Package base 2010 may be an epoxy mould compound or ceramic material or PCB/FR4/BT resin material, or a metal can, or some other suitable material. As another example, cavity 2018 separates the temperature reservoirs and thermal barriers from cap or lid 2012. Cap or lid 2012 may be epoxy or ceramic or metal, or some other suitable material, depending on the specific requirements of the application of assembly 2000. Leads or electrical contacts 2008 may be copper or Alloy 42 or another suitable material that can provide mechanical stability and is also potential compatible with plating and interconnection technologies such as wire bonding. Leads or electrical contacts 2008 can also be partially encapsulated (with interconnect areas and terminations for the next packaging level exposed).

Figure 21A:
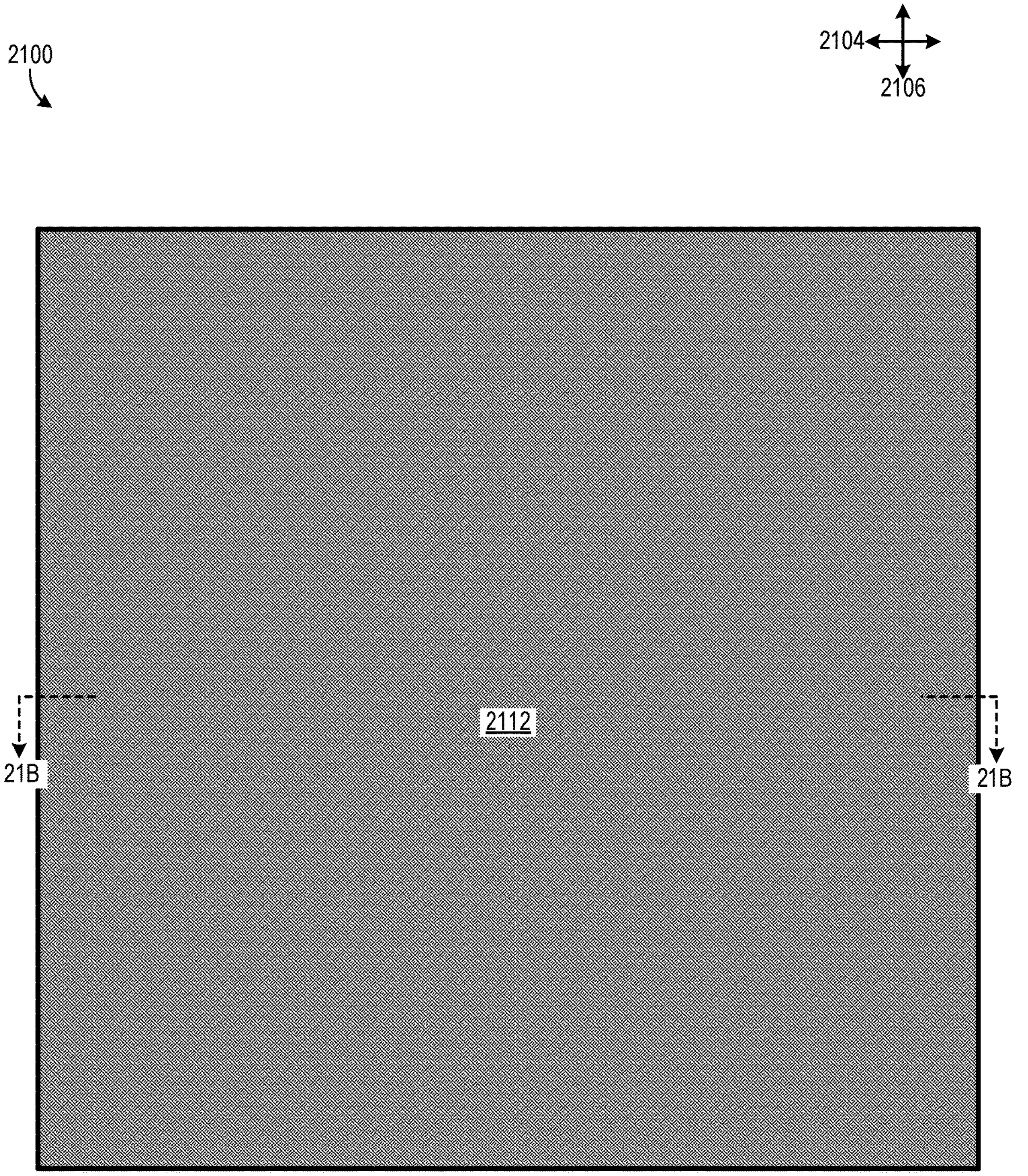
FIG. 21A is a top plan view of another assembly including a package and an embodiment of the FIG. 17 thermal cycle detector, according to an embodiment.
Figure 21B:
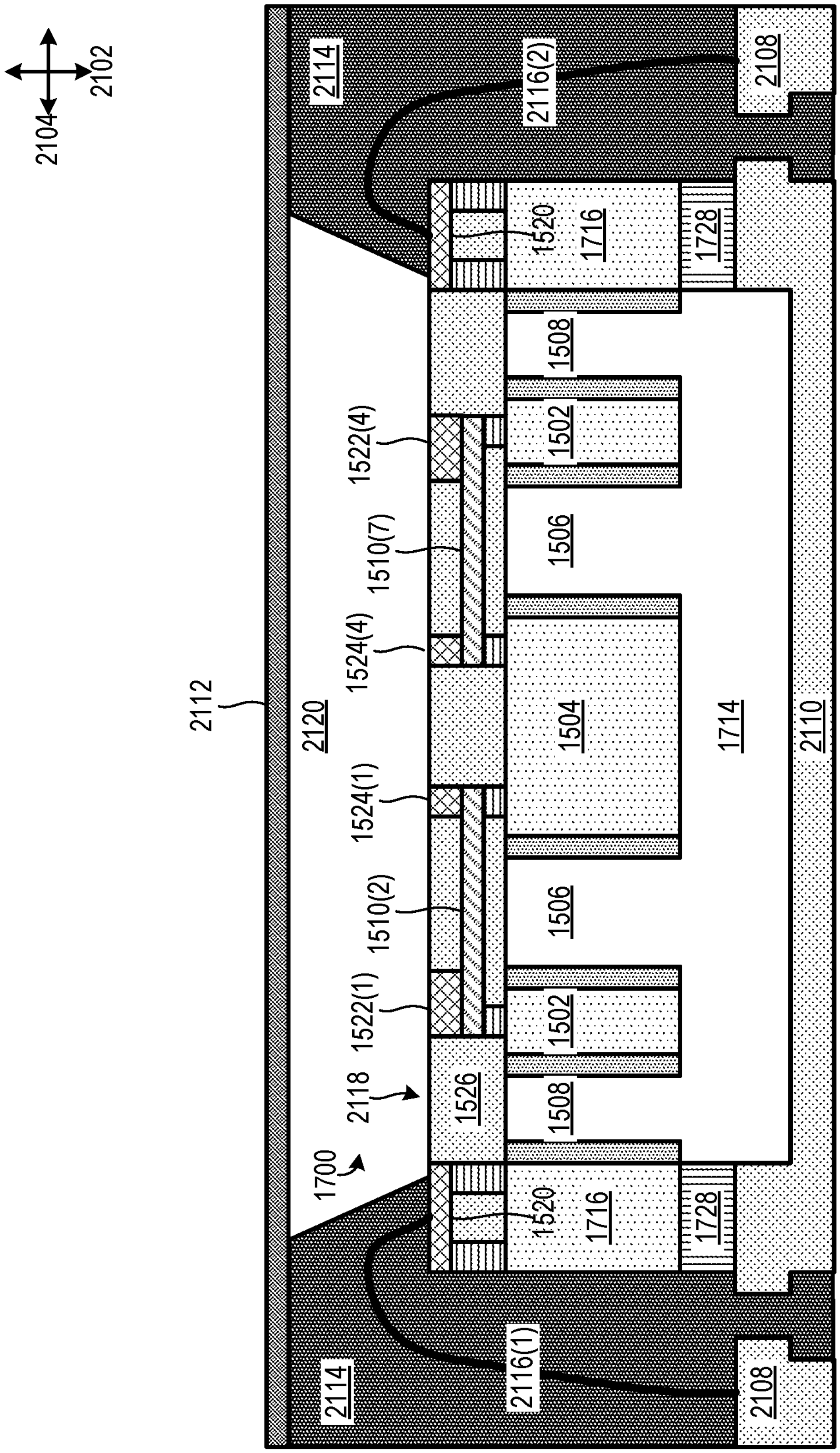
FIG. 21B is a cross-sectional view of the FIG. 21A assembly taken along line 21B-21B of FIG. 21A.

The shape, thicknesses, plating finished and other features in the package construction of assembly 2000 can be modified and/or optimized depending on the specific requirements of the application of assembly 2000. As such, the configuration of assembly 2000 advantageously helps minimize effects of packaging on performance of thermal cycle detector 1700. The package described in FIG. 20B could be a pre moulded cavity package, ceramic, hermetic, metal can, fabricated using 3D printing or another build up process with intermediate moulding or etching and plating steps, or some other suitable technology, depending on the requirements of the application. The material used for the package construction could also vary depending on the requirements of the application and can include, for example, materials such as epoxy moulding compound, copper, aluminum, Fe—Ni, Alloy 42, co-fired ceramic, laminate/PCB materials, conductive paste, liquid crystal polymer, and/or other suitable materials, depending on the specific requirements of the application FIG. 21A is a top plan view of an assembly 2100, and FIG. 21B is a cross-sectional view of assembly 2100 taken along line 21B-21B of FIG. 21A. The shape, dimensions, construction, materials and outline of the package of assembly 2100 can be optimized depending on the specific requirements of the application. Assembly 2100 includes an embodiment of thermal cycle detector 1700 of FIG. 17 that is packaged in another embodiment of the new packages disclosed herein. It is understood that assembly 2100 could be modified to incorporate a different thermal cycle detector, e.g., thermal cycle detector 1500, 1800, or 1900, in place of thermal cycle detector 1700. Additionally, assembly 2100 could be modified to have a different shape, such as a circular or rectangular shape, that can be optimized depending on the specific requirements of the application. FIGS. 21A and 21B include coordinate axes collectively showing a first direction 2102, a second direction 2104, and a third direction 2106, where each of these directions is orthogonal to each other of these directions.

Assembly 2100 includes leads or electrical contacts 2108, a paddle 2110, a cap or lid 2112, mould compound 2114, and a plurality of bond wires 2116, in addition to the elements of thermal cycle detector 1700. This construction can be implemented using a number of different technologies such as moulding, pre-moulded cavity packaging, build up processes using selective plating and etching with intermediate moulding steps, 3D printing, and other suitable technologies, depending on the specific requirements of the application. In certain embodiments of assembly 2100, the intent is to ensure that there is no mould compound in direct contact with the thermal cycle detector (thus limiting the paths for heat transfer, even if the compound has a low thermal conductivity). This could be achieved by using a pre-moulded cavity package or in a transfer moulded package by using a film assisted moulding process (which ensures that no mould compound flows over specific die areas during the transfer moulding process).

Leads or electrical contacts 2108 are thermally conductive, and leads or electrical contacts 2108 are thermally coupled to first heatsink 1520 via bond wires 2116. Although two bond wires 2116 are shown in FIG. 21B, it is understood that assembly 2100 may include any number of bond wires 2116, such as additional bond wires 2116 (not shown) disposed within assembly 2100. In other packaging embodiments, conductive tape, TAB, plated vias or other methods for constructing conductive paths between the thermal cycle detector and external packaging contacts can be used. In certain embodiments, bumping or anisotropic conductive film interconnect technologies are used.

Paddle 2110 is disposed below each of first temperature reservoir 1502, second temperature reservoir 1504, first thermal barrier 1506, and second thermal barrier 1508 in first direction 2102. Paddle 2110 also forms a bottom boundary of cavity 1714. Paddle 2110 can be formed, for example, by a half etching process where a recess is incorporated into the structure such that there is a cavity or air gap that means that first temperature reservoir 1502 and second temperature reservoir 1504 are not physically connected. In certain embodiments, paddle 2110 is thermally conductive to help maximize thermal conductivity between temperature sensing location 1716 and an environment external to assembly 2100. Paddle 2110 could be made from copper or alloy 42 and partially etched or formed and plated. In the example shown in FIG. 21B, paddle 2110 has a recess etched into the profile ensuring that there is a gap and no direct physical contact between it and first temperature reservoir 1502 and second temperature reservoir 1504. Paddle 2110 could also be fabricated from Alloy 42 or some other suitable material depending on the specific requirements of the application.

The external portions of leads or electrical contacts 2108 and paddle 2110 can be plated and made compatible with a solder process such that these external contacts can be connected to the next packaging level—and possibly thermal vias—so that the paths for heat dissipation/transfer are further maximized. Spacer 1728 could be a thermally conductive die attach paste or film pre-form or some other suitable material to maximize heat transfer to the paddle 2110, such that it effectively acts like a heat sink. In other embodiments, a non-conductive die attach or film or inert/non-conductive spacer may be used depending on the specific requirements.

Mould compound 2114 is disposed adjacent to thermal cycle detector 1700 in second direction 2104, and mould compound 2114 extends above a top surface 2118 of thermal cycle detector 1700 in first direction 2102 to support cap or lid 2112. In certain embodiments, cap or lid 2112 is formed of a material that has a low thermal conductivity such as epoxy or similar material. A cavity 2120 or gap results between thermal cycle detector 1700 and cap or lid 2112. Reducing (or eliminating) potential thermal paths (e.g., incorporating cavities/air gaps shown by cavity 2120 and cavity 1714) further promotes the effectiveness of first thermal barrier 1506 and second thermal barrier 1508 in impeding heat flow.

Figure 22A:
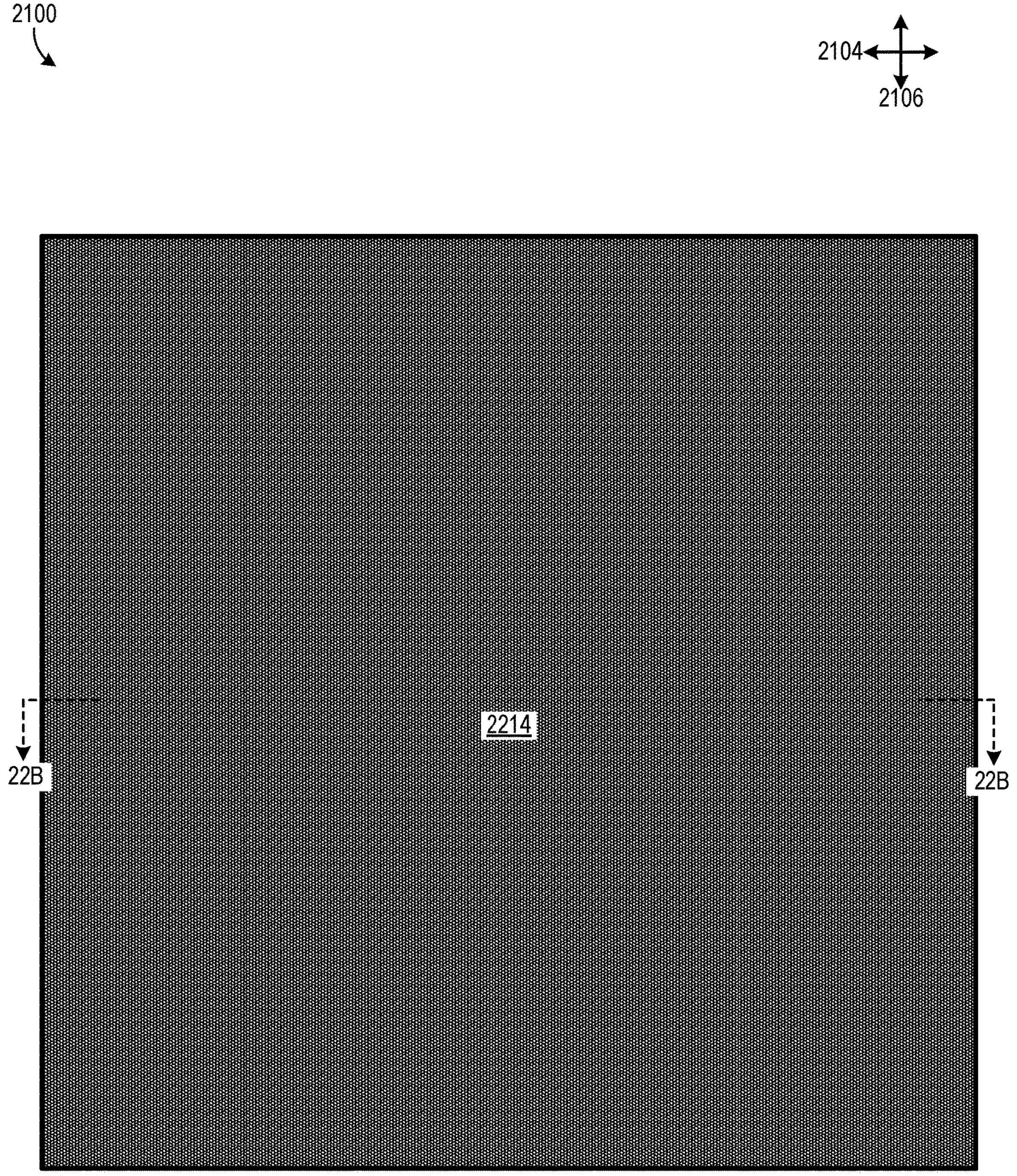
FIG. 22A is a top plan view of an alternate embodiment of the FIG. 21A assembly.
Figure 22B:
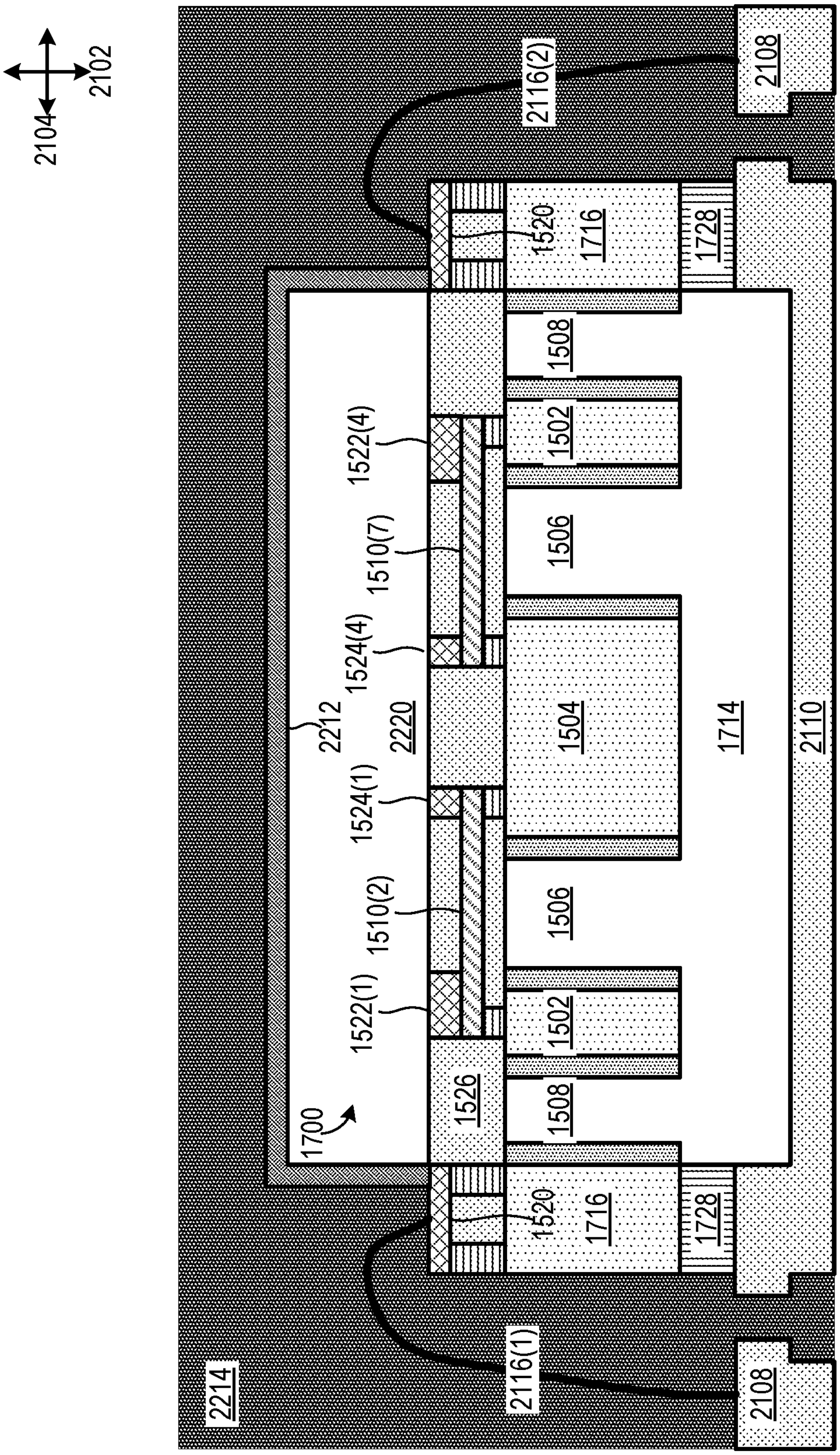
FIG. 22B is a cross-sectional view of the FIG. 22A assembly taken along line 22B-22B of FIG. 22A.

FIG. 22A is a top plan view of an assembly 2200, and FIG. 22B is a cross-sectional view of assembly 2200 taken along line 22B-22B of FIG. 22A. The shape, dimensions, construction, materials, and outline of the package of assembly 2200 can be optimized depending on the specific requirements of the application. Assembly 2200 is an alternate embodiment of assembly 2100 including a cap or lid 2212 and mould compound 2214 in place of cap or lid 2112 and mould compound 2114. Cap or lid 2212 can be attached at wafer level (for example) and provides a barrier to prevent mould compound contacting top surfaces of the thermal cycle detector structure during subsequent encapsulation steps (e.g., transfer moulding). Cap or lid 2212 enables a cavity to be formed over specific areas (thus reducing thermal dissipation paths) and becomes embedded in mould compound 2214. Cap or lid 2212 can be fabricated from silicon or glass or some other suitable material. Cap or lid 2212 prevents mould compound 2214 from contacting portions of thermal cycle detector 1700 proximate to first temperature reservoir 1502, second temperature reservoir 1504, first thermal barrier 1506, and second thermal barrier 1508, and there is accordingly a cavity 2220 between thermal cycle detector 1700 and mould compound 2214. Cavity 2220 can be filled, for example, with air or another gas. In particular embodiments, the primary consideration, however, is limiting physical contact in specific areas and hence limiting heat transfer paths.

Figure 23A:
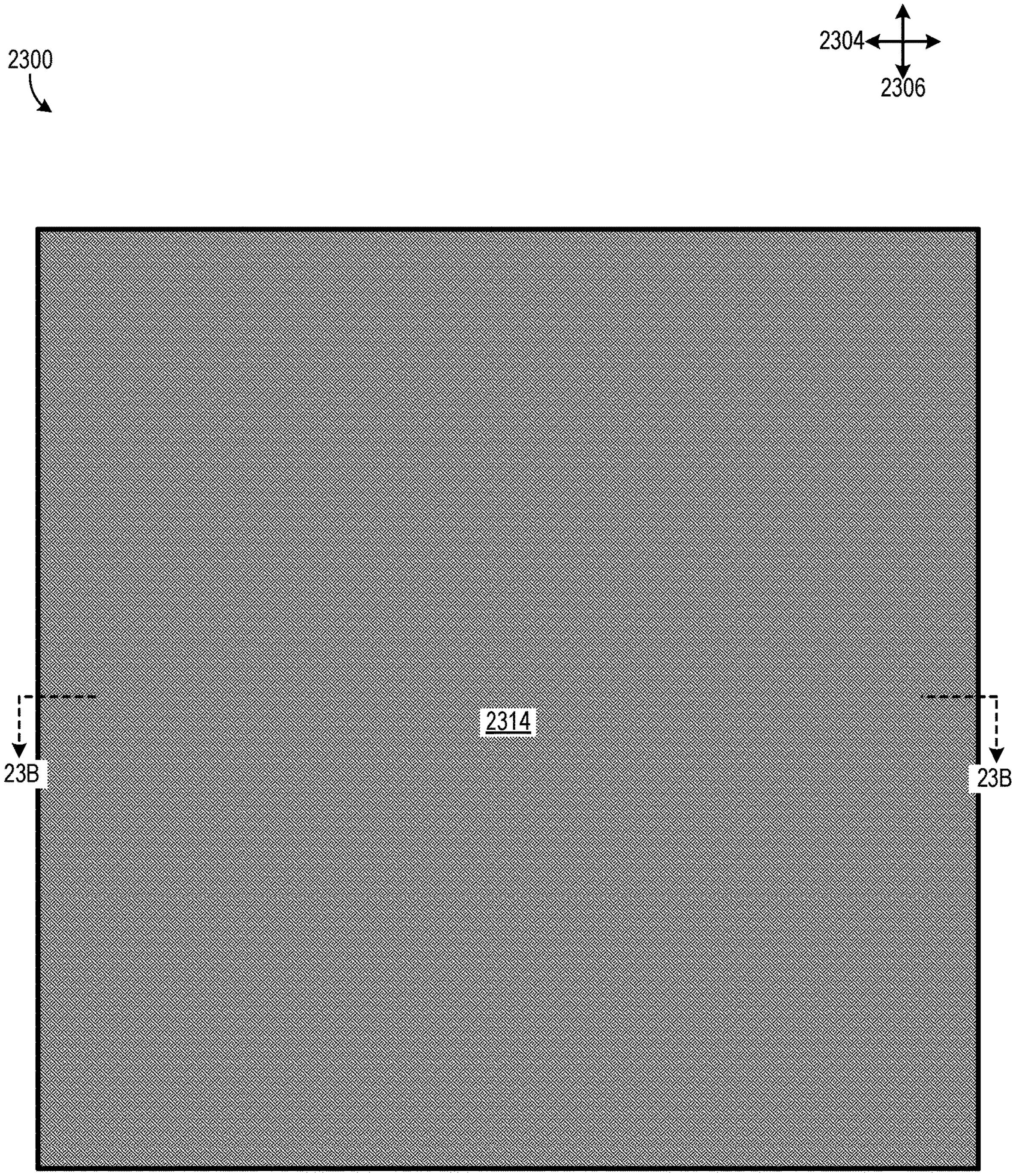
FIG. 23A is a top plan view of an assembly including a package and an alternate embodiment of the FIG. 17 thermal cycle detector, according to an embodiment.
Figure 23B:
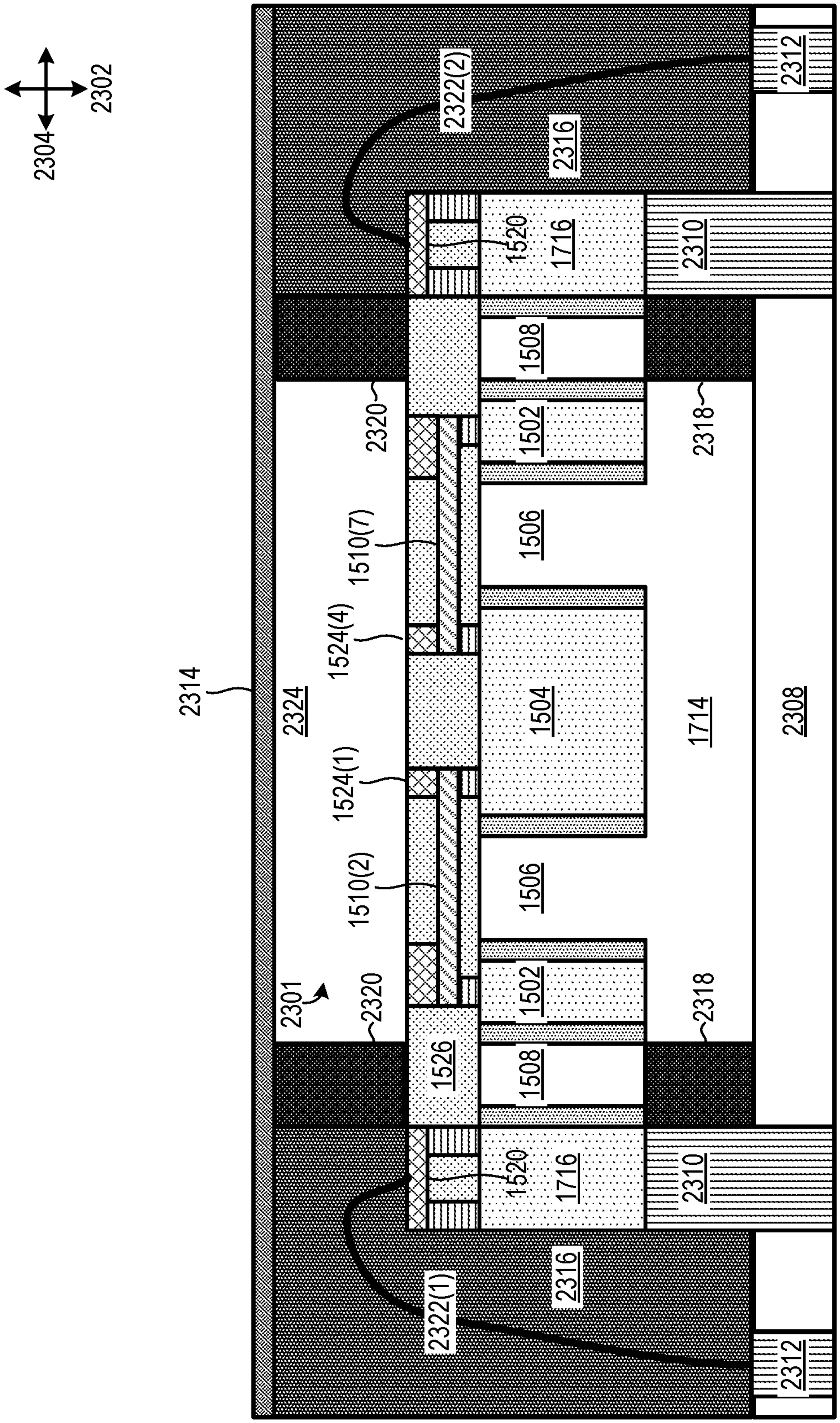
FIG. 23B is a cross-sectional view of the FIG. 23A assembly taken along line 23B-23B of FIG. 23A.

FIG. 23A is a top plan view of an assembly 2300, and FIG. 23B is a cross-sectional view of assembly 2300 taken along line 23B-23B of FIG. 23A. The shape, dimensions, construction, materials, and outline of the package of assembly 2200 can be optimized depending on the specific requirements of the application. Assembly 2300 includes a thermal cycle detector 2301 that is packaged in another embodiment of the new packages disclosed herein, where thermal cycle detector 2301 is an alternate embodiment of thermal cycle detector 1700 with spacers replaced with thermal vias. It is understood that assembly 2300 could be modified to incorporate a different thermal cycle detector, e.g., thermal cycle detector 1500, 1800, or 1900, in place of thermal cycle detector 2301. Additionally, assembly 2300 could be modified to have a different shape, such as a circular or rectangular shape for incorporating a rectangular thermal cycle detector. FIGS. 23A and 23B include coordinate axes collectively showing a first direction 2302, a second direction 2304, and a third direction 2306, where each of these directions is orthogonal to each other of these directions.

Assembly 2300 includes a substrate 2308, one or more thermal vias 2310, one or more thermal vias 2312, a cap or lid 2314, mould compound 2316, a first gasket 2318, a second gasket 2320, and a plurality of bond wires 2322, in addition to the elements of thermal cycle detector 2301. Thermal vias 2310 and 2312 extend through substrate 2308 in first direction 2302. There are a number of different ways that substrate 2308 and thermal vias 2310 and 2312 could be constructed. For example, a laminate or build up process using selective etching, plating, or screen printing, with intermediate moulding or plating steps, or 3D printing or some other suitable technology, could be used. In certain embodiments, thermal vias 2310 and 2312 are plated through-holes in substrate 2308. In a laminate or build up process, vias can be plated and selective etched (and possibly combined with screen-printing and other processes) such that there are conductive pillars onto which first heat sink 1520 can be aligned. Incorporating a topography so that there are raised areas or pillars onto which the thermal cycle detector die can be mounted also means that a cavity 1714 can be created (and thermal dissipation paths minimized).

The quantity of thermal vias 2310 and 2312 may vary as a design choice. Thermal via(s) 2310 thermally couple temperature sensing location 1716 to an ambient environment of assembly 2300. Additionally, thermal via(s) 2312 thermally couple first heatsink 1520 to the ambient environment of assembly 2300 via bond wires 2322. In some embodiments, thermal vias 2312 are exposed so that they can be connected to the next packaging level (for example by soldering) in the required application. Although two bond wires 2322 are shown in FIG. 23B, it is understood that assembly 2300 may include any number of bond wires 2322, such as additional bond wires 2322 (not shown) disposed within assembly 2300. Assembly 2300 could also use interconnect technologies such as bumping or TAB bonding or anisotropic conductive film or other suitable technologies depending on the specific requirements of the application.

Mould compound 2316 is formed on paddle 2308 and extends around and above thermal cycle detector 2301 in each of first direction 2302 and second direction 2304. Mould compound 2316 also supports cap or lid 2314. FIG. 23B shows gaskets 2318 and 2320 incorporated as part of the assembly process to facilitate the construction of cavities 2324 and 1714. These gaskets are applied, for example, before moulding or encapsulation steps when manufacturing assembly 2300. First gasket 2318, which acts as a dam, prevents mould compound 2316 from entering cavity 1714. Additionally, second gasket 2320, which also acts as a dam, prevents mould compound 2316 from entering a cavity 2324 between cap or lid 2314 and thermal cycle detector 2301. Incorporating gaskets or dams before encapsulation is another method of prohibiting compound from contacting specific areas of the thermal cycle detector die (and hence limiting paths for thermal transfer).

FIGS. 24A-24F collectively illustrate one example of how assembly 2300 could be manufactured. However, it is understood that assembly 2300 could be manufactured in other manners without departing from the scope hereof. Each of FIGS. 24A-24F depicts a cross-sectional view of assembly 2300 at a different respective manufacturing step.

Figure 24A:
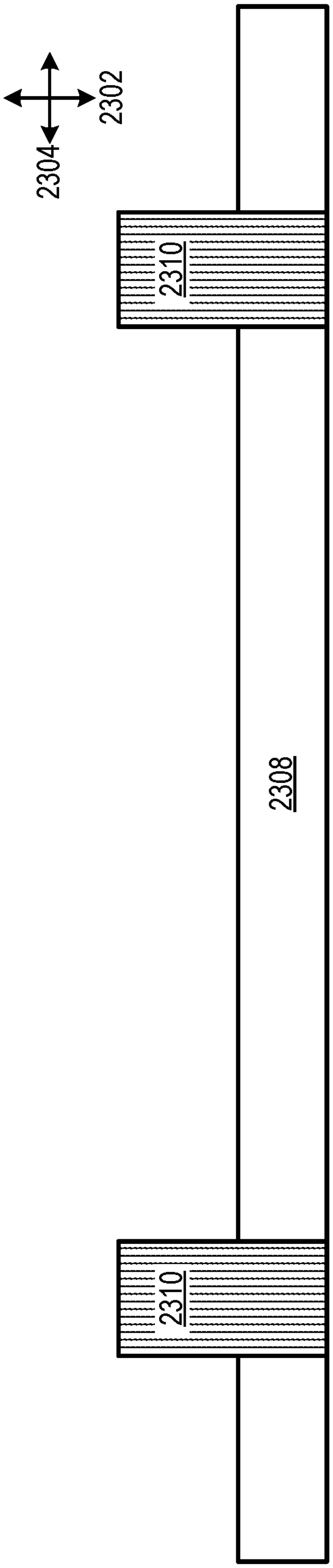
FIG. 24A depicts a manufacturing step where one or more thermal vias are formed in a paddle, in an example method for manufacturing the FIG. 23A assembly.

FIG. 24A depicts a manufacturing step where one or more thermal vias 2310 are formed in substrate 2308. The substrate may be a laminate type structure, a lead frame structure, or another material such as ceramic or glass, or some other suitable material depending on the specific requirements of the application. Substrate 2308 can be fabricated such that there is a topography with raised areas intentionally fabricated to support specific areas of a thermal cycle detector die. In certain embodiments, thermal vias 2310 are formed by drilling or etching one or more holes in substrate 2308 and plating or screen printing conductive material, or by forming one or more other types of apertures in substrate 2308, and filling the holes or apertures with a conductive material.

Figure 24B:
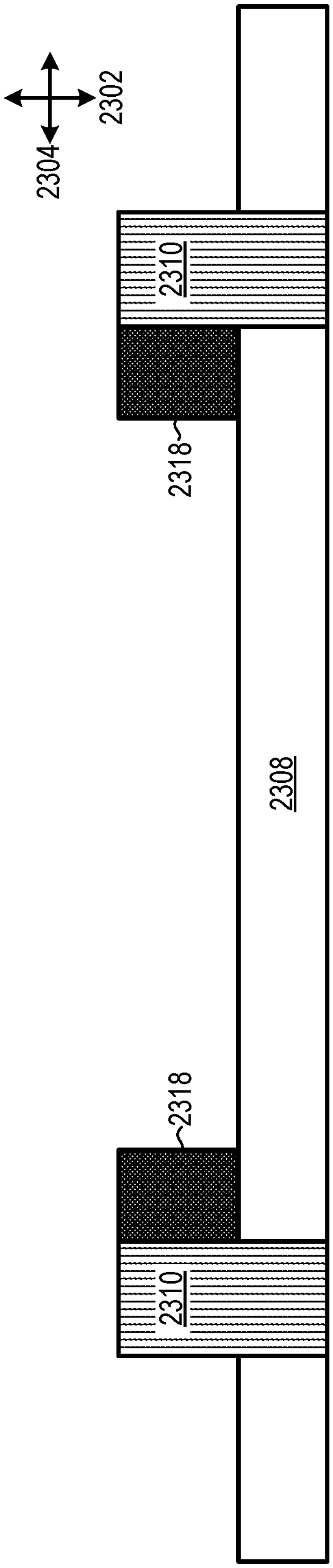
FIG. 24B depicts a manufacturing step where a first gasket is formed on the paddle, in the example method for manufacturing the FIG. 23A assembly.

FIG. 24B depicts a manufacturing step where first gasket 2318 is formed on substrate 2308. First gasket 2318 may be a pre-fabricated material (e.g., epoxy, rubber, polymer, ceramic, or some other suitable material), or first gasket 2318 may be dispensed and cured (e.g., epoxy, polymer, or another suitable material). In some embodiments, first gasket 2318 is a pre-made element that is placed on substrate 2308. In some other embodiments, first gasket 2318 is formed by dispensing a liquid on substrate 2308, such as a fast cure epoxy and curing the liquid, such that first gasket 2318 could also be referred to as a dam.

Figure 24C:
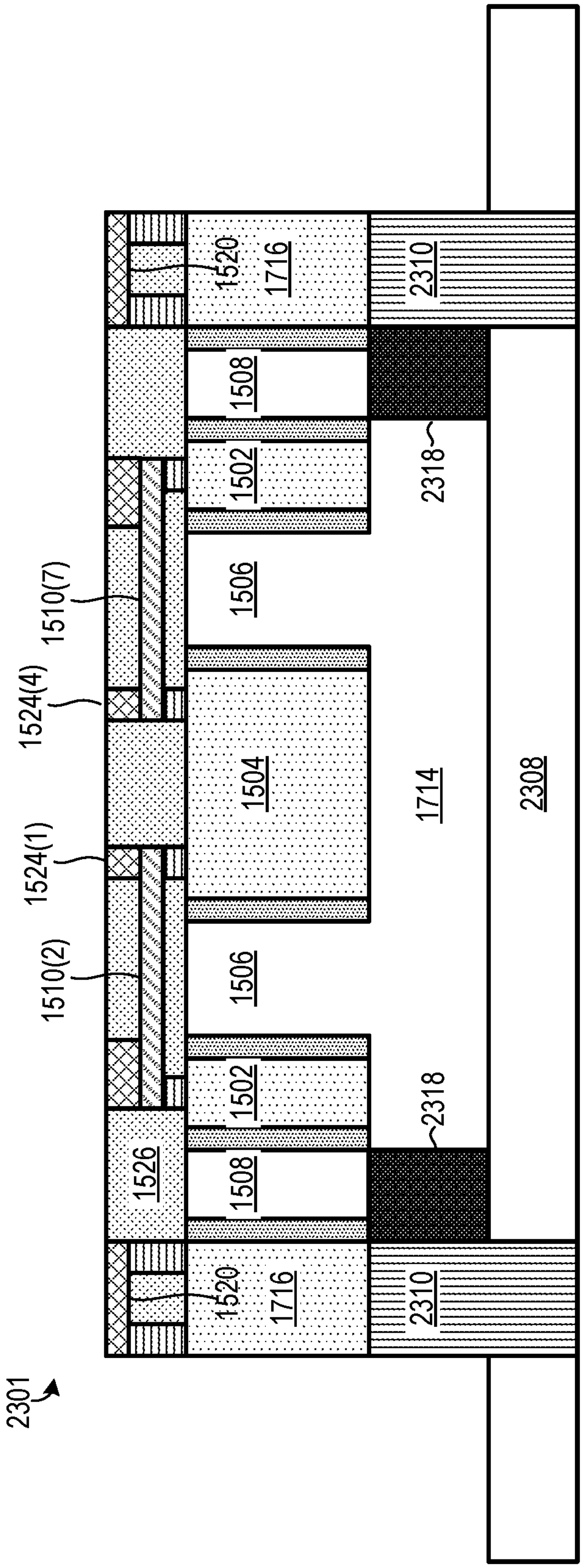
FIG. 24C depicts a manufacturing step where an instance of the FIG. 23A thermal cycle detector is placed over the paddle, in the example method for manufacturing the FIG. 23A assembly.
Figure 24D:
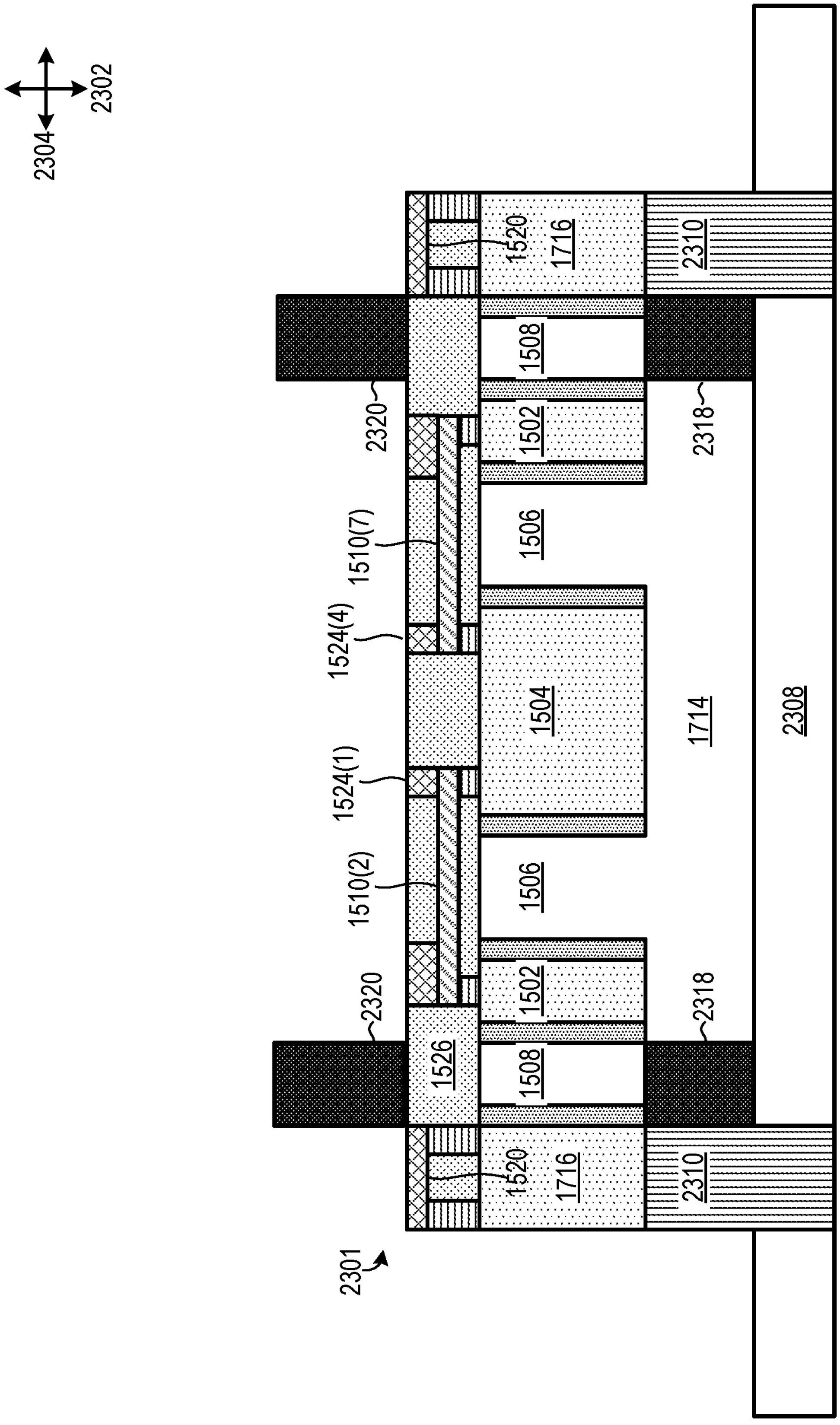
FIG. 24D depicts a manufacturing step where a second gasket is formed on the temperature cycle detector, in the example method for manufacturing the FIG. 23A assembly.

FIG. 24C depicts a manufacturing step where an instance of thermal cycle detector 2301 is placed over substrate 2308 such that temperature sensing location 1716 contacts thermal via(s) 2310. FIG. 24D depicts a manufacturing step where second gasket 2320 is formed on thermal cycle detector 2301. In some embodiments, second gasket 2320 is a pre-made element that is placed on thermal cycle detector 2301. In some other embodiments, second gasket 2320 is formed by dispensing a liquid on thermal cycle detector 2301 and curing the liquid, such that second gasket 2320 could also act as a dam, prohibiting the flow of encapsulant.

Figure 24E:
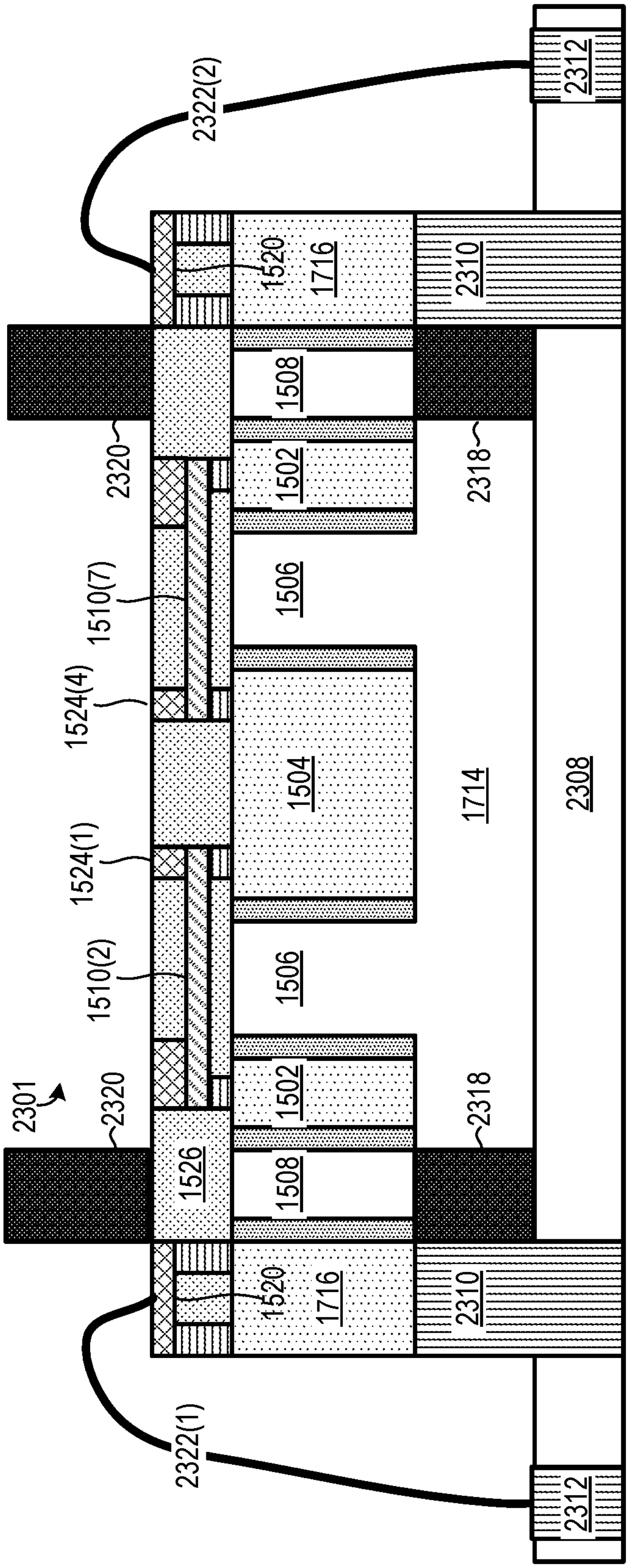
FIG. 24E depicts a manufacturing step where one or more thermal vias are formed in the paddle and thermally coupled to a first heatsink, in the example method for manufacturing the FIG. 23A assembly.
Figure 24F:
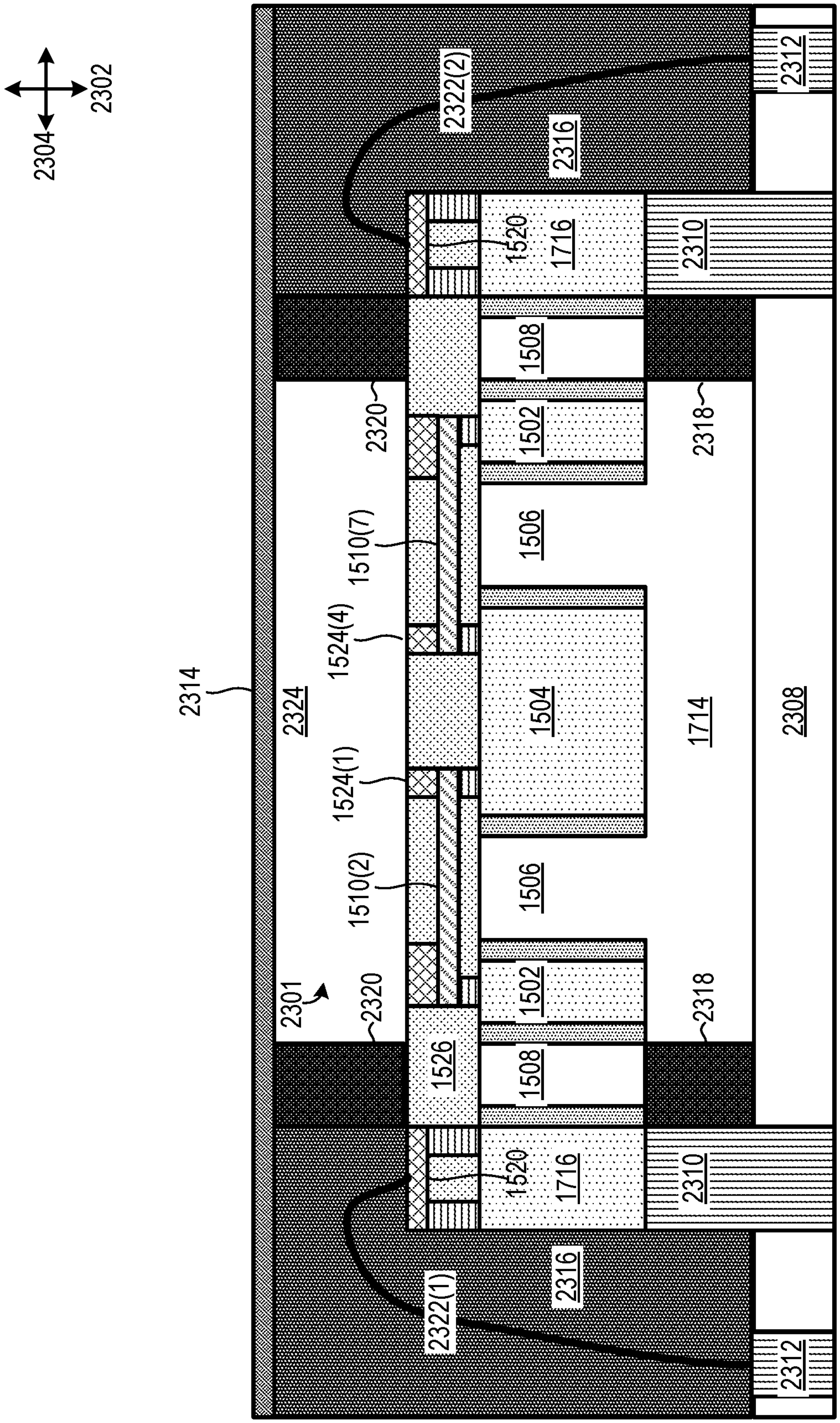
FIG. 24F depicts a manufacturing step where mould compound is disposed on the paddle, and a cap is placed on the mould compound and the second gasket, in the example method for manufacturing the FIG. 23A assembly.

FIG. 24E depicts a manufacturing step where one or more thermal vias 2312 are formed in substrate 2308, and the thermal vias are thermally coupled to first heatsink 1520 via bond wires 2322. In particular embodiments, thermal vias 2312 are formed by drilling and or etching one or more holes in substrate 2308, or by forming one or more other types of apertures in substrate 2308, and plating, screen printing, or filling the holes or apertures with a conductive material. FIG. 24F depicts a manufacturing step where mould compound 2316 is disposed (after wire bonding the sensor) on the assembly mounted on substrate 2308, and cap or lid 2314 is placed on the encapsulant or mould compound 2316 and second gasket 2320, to obtain assembly 2300.

Figure 25A:
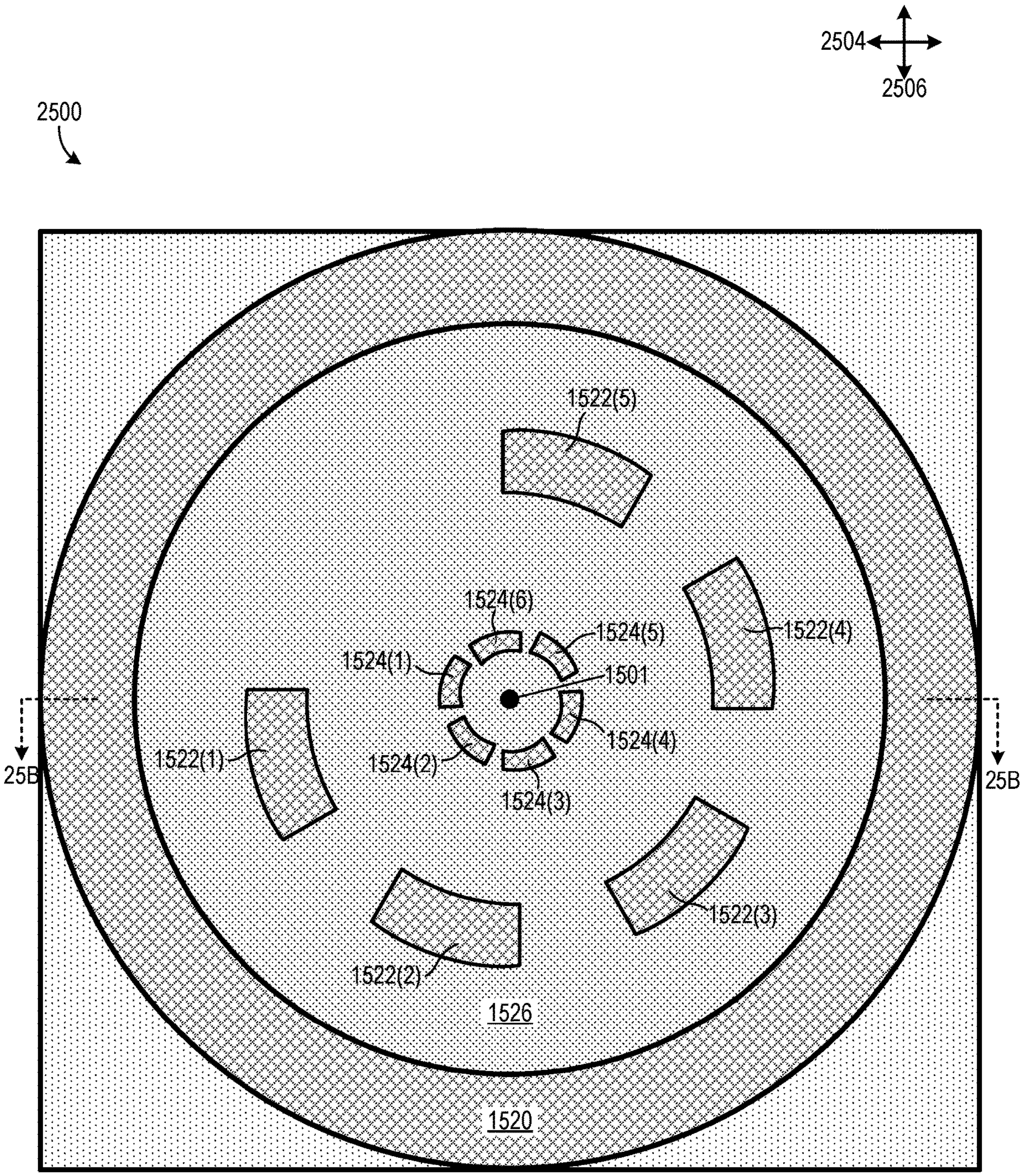
FIG. 25A is a top plan view of another assembly including a package and an embodiment of the FIG. 17 thermal cycle detector, according to an embodiment.
Figure 25B:
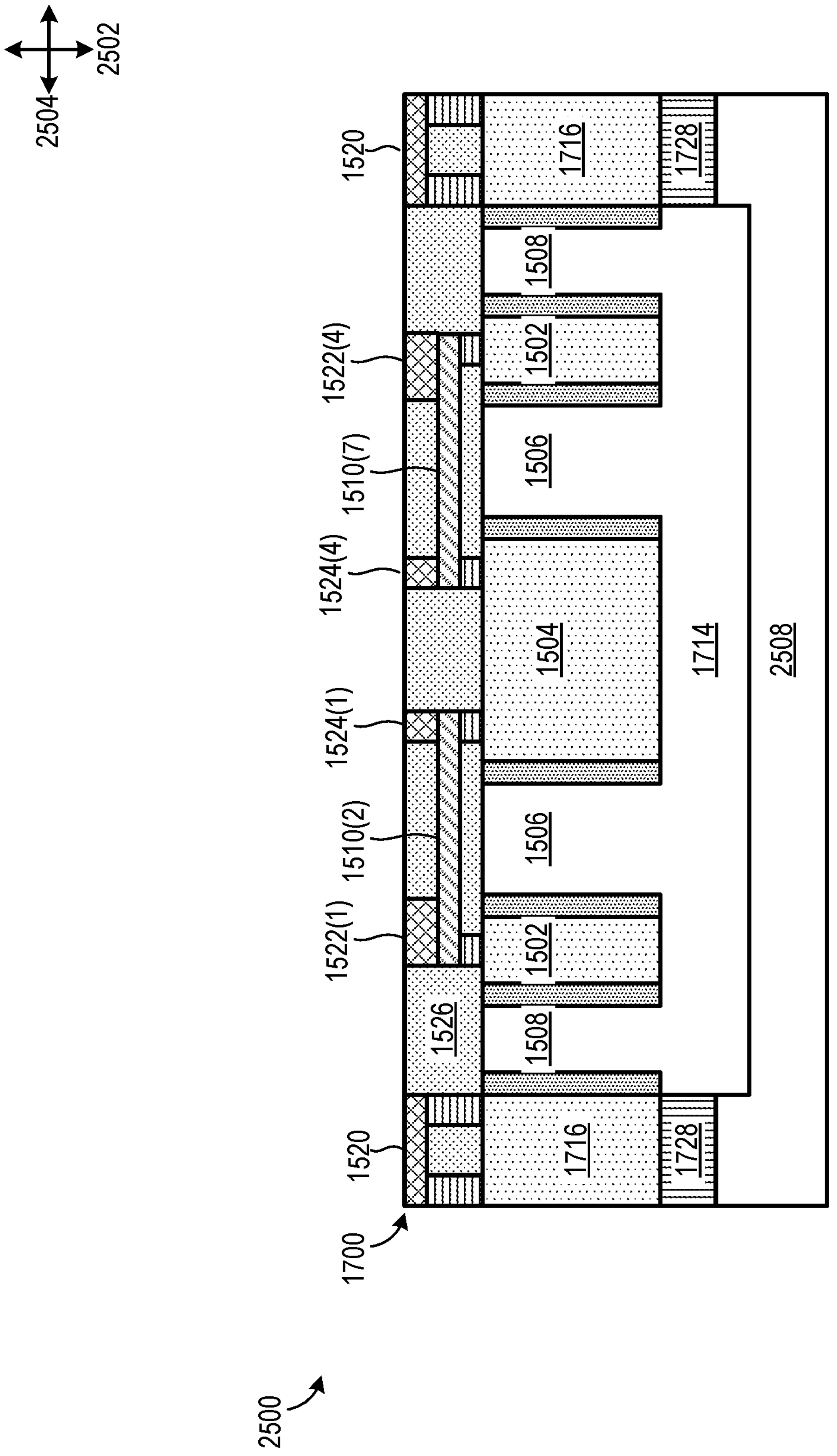
FIG. 25B is a cross-sectional view of the FIG. 25A assembly taken along line 25B-25B of FIG. 25A.

FIG. 25A is a top plan view of an assembly 2500, and FIG. 25B is a cross-sectional view of assembly 2500 taken along line 25B-25B of FIG. 25A. The shape, dimensions, construction, materials, and outline of the package of assembly 2500 can be optimized depending on the specific requirements of the application. Assembly 2500 includes an embodiment of thermal cycle detector 1700 of FIG. 17 that is packaged in another embodiment of the new packages disclosed herein. It is understood that assembly 2500 could be modified to incorporate a different thermal cycle detector, e.g., thermal cycle detector 1500, 1800, or 1900, in place of thermal detector 1700. Additionally, assembly 2500 could be modified to have a different shape, stack height, or form factor depending on the specific requirements of the application. FIGS. 25A and 25B include coordinate axes collectively showing a first direction 2502, a second direction 2504, and a third direction 2506, where each of these directions is orthogonal to each other of these directions.

Assembly 2500 includes a support structure 2508 in addition to the elements of thermal cycle detector 1700. Support structure 2508, which may also be referred to as a carrier wafer, mechanically supports thermal cycle detector 1700 via spacer 1728 below temperature sensing location 1716, but support structure 2508 otherwise does not contact thermal cycle detector 1700. Additionally, support structure 2508 forms part of a boundary of cavity 1714. In certain embodiments, support structure 2508 is formed of glass. Some embodiments of support structure 2508 further include prefabricated structures, such as channels or cavities. This can be achieved by using a pre-fabricated carrier wafer that can be attached to the thermal cycle detector wafer during the wafer fabrication process.

Support structure 2508 can provide a number of functions. For example, support structure 2508 can provide mechanical stability through subsequent processing steps (e.g., Fab backend, saw, pick and place, die-attach, wire bond etc.) and could also incorporate features (e.g., recesses, topography with raised areas to align with specific areas of a thermal cycle detector wafer/die, vias etc.). Support structure 2508 can be attached to the thermal cycle wafer using anodic bonding, glass frit, pre forms, and other suitable methods depending on the specific requirements of the application. Additionally, particular embodiments of support structure 2508 can include modifiable elements that can be enabled when a complete assembly is assembled, such as fuses, modifiable links or connections or other elements that can be activated to physically open or disconnect elements within the system such as channels, cavities, etc. Support structure 2508 can also be pre-fabricated to include structures that are critical to the functioning of the final system (e.g., topographies to enable a cavity or minimal thermal contact with specific areas of the die, vias for thermal transfer etc.)

Figure 26:
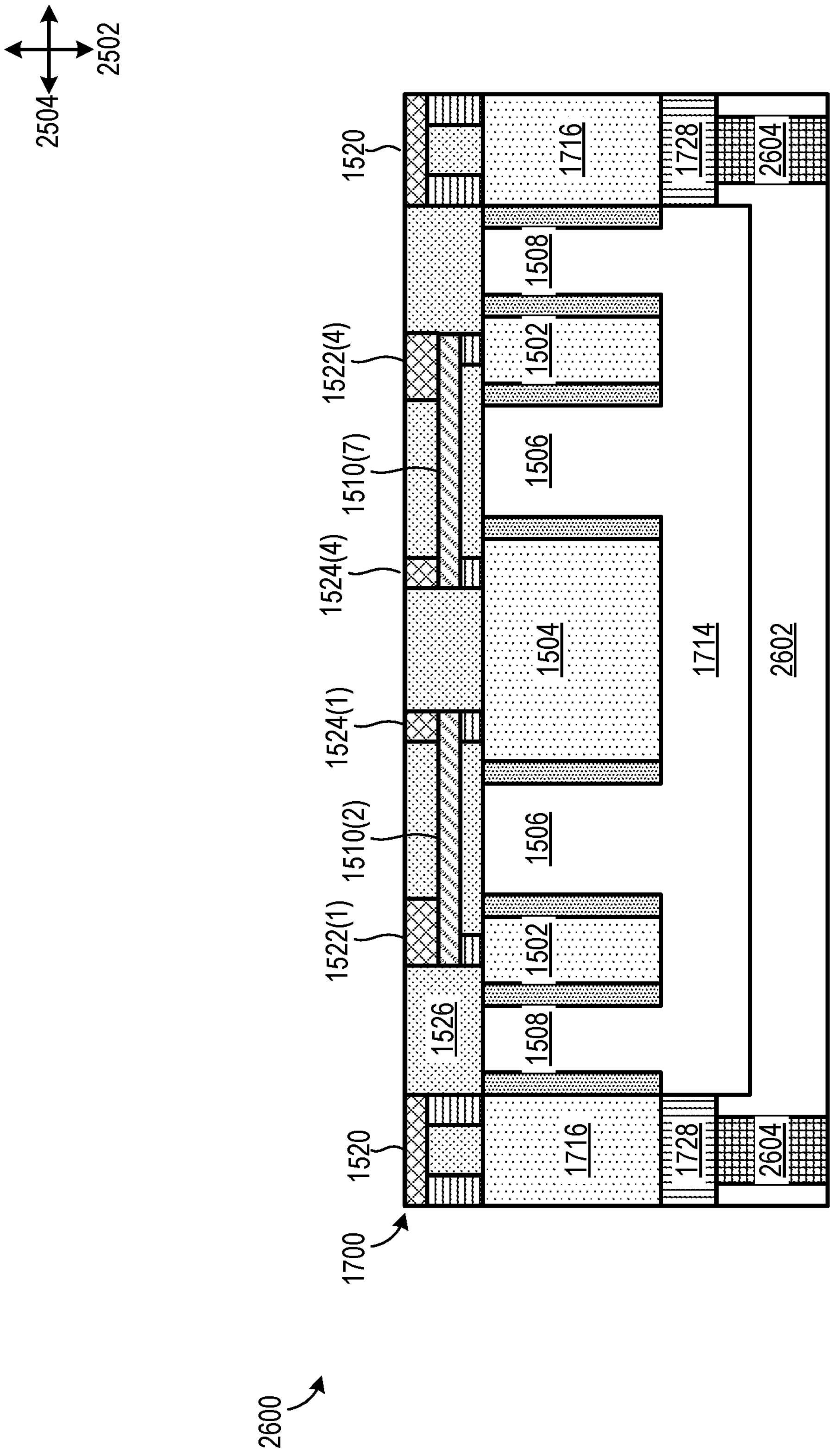
FIG. 26 is a cross-sectional view of an alternate embodiment of the FIG. 25A assembly.
Figure 27:
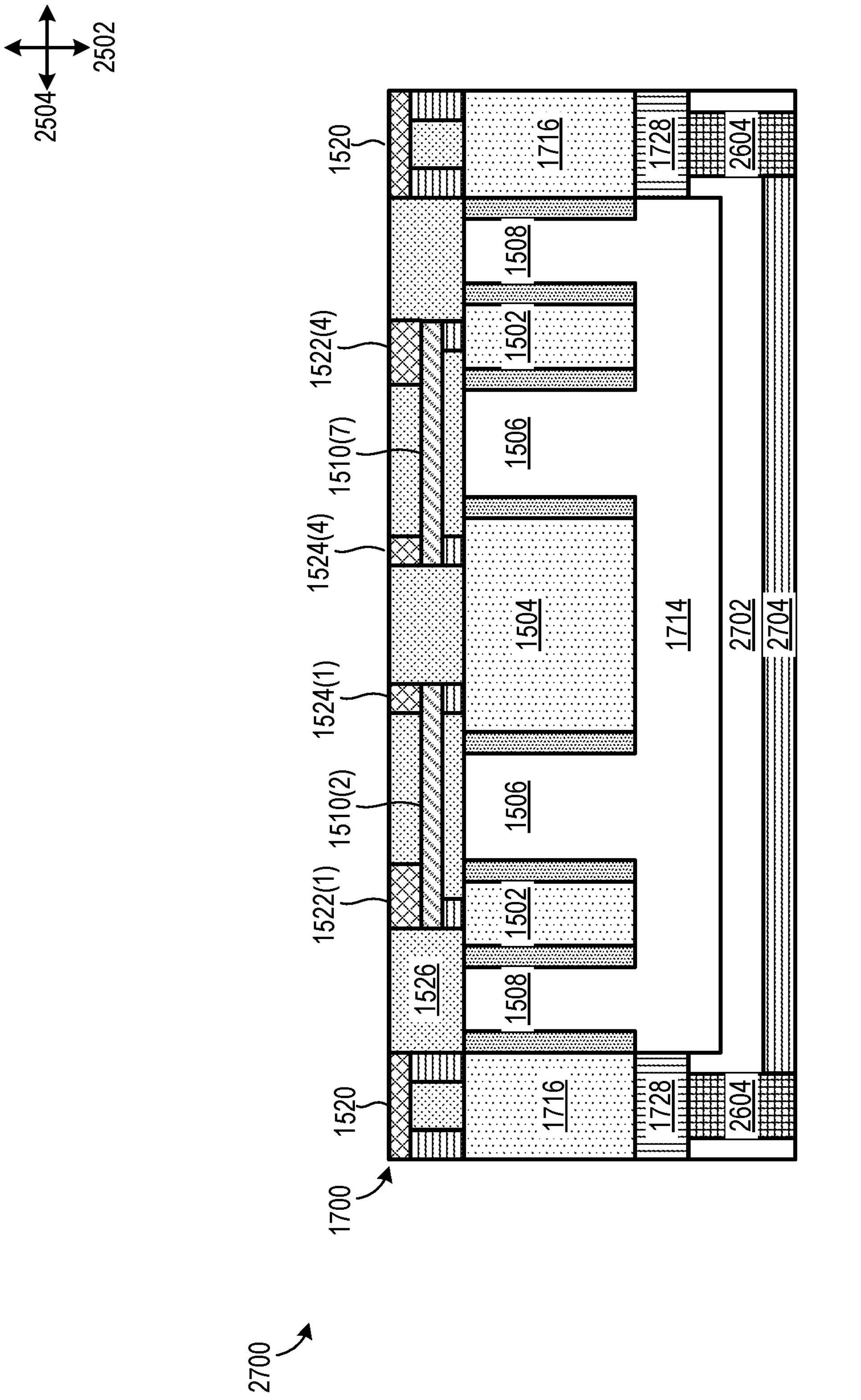
FIG. 27 is a cross-sectional view of another alternate embodiment of the FIG. 25A assembly.

Support structure 2508 could be modified to include thermal vias, and/or other thermal conductors, to provide an enhanced thermal path between temperature sensing location 1716 and an ambient environment of assembly 2500. For example, FIG. 26 is a cross-sectional view of an assembly 2600, which is an alternate embodiment of assembly 2500 including a support structure 2602 in place of support structure 2508. Support structure 2602 is like support structure 2508, but support structure 2602 further includes one or more thermal vias 2604 extending through the support structure in first direction 2502, to further thermally couple temperature sensing location 1716 to an ambient environment of the assembly. As another example, FIG. 27 is a cross-sectional view of a assembly 2700, which is an alternate embodiment of assembly 2600 including a support structure 2702 in place of support structure 2602. Support structure 2702 is like support structure 2602, but support structure 2702 further includes a thermal conductor 2704 extending between in second direction 2504.

Figure 28A:
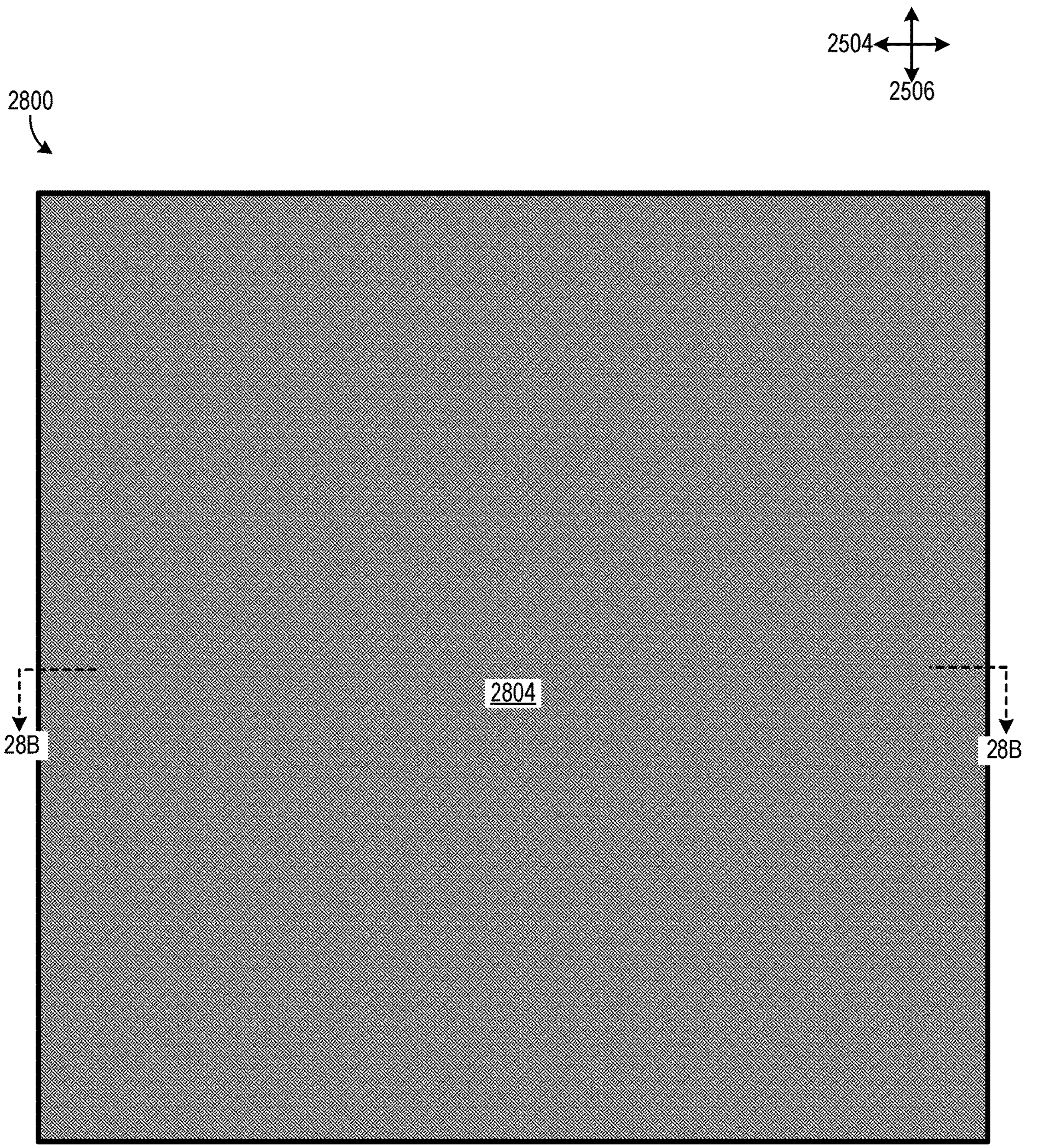
FIG. 28A is a top plan view of an alternate embodiment of the FIG. 26 assembly.
Figure 28B:
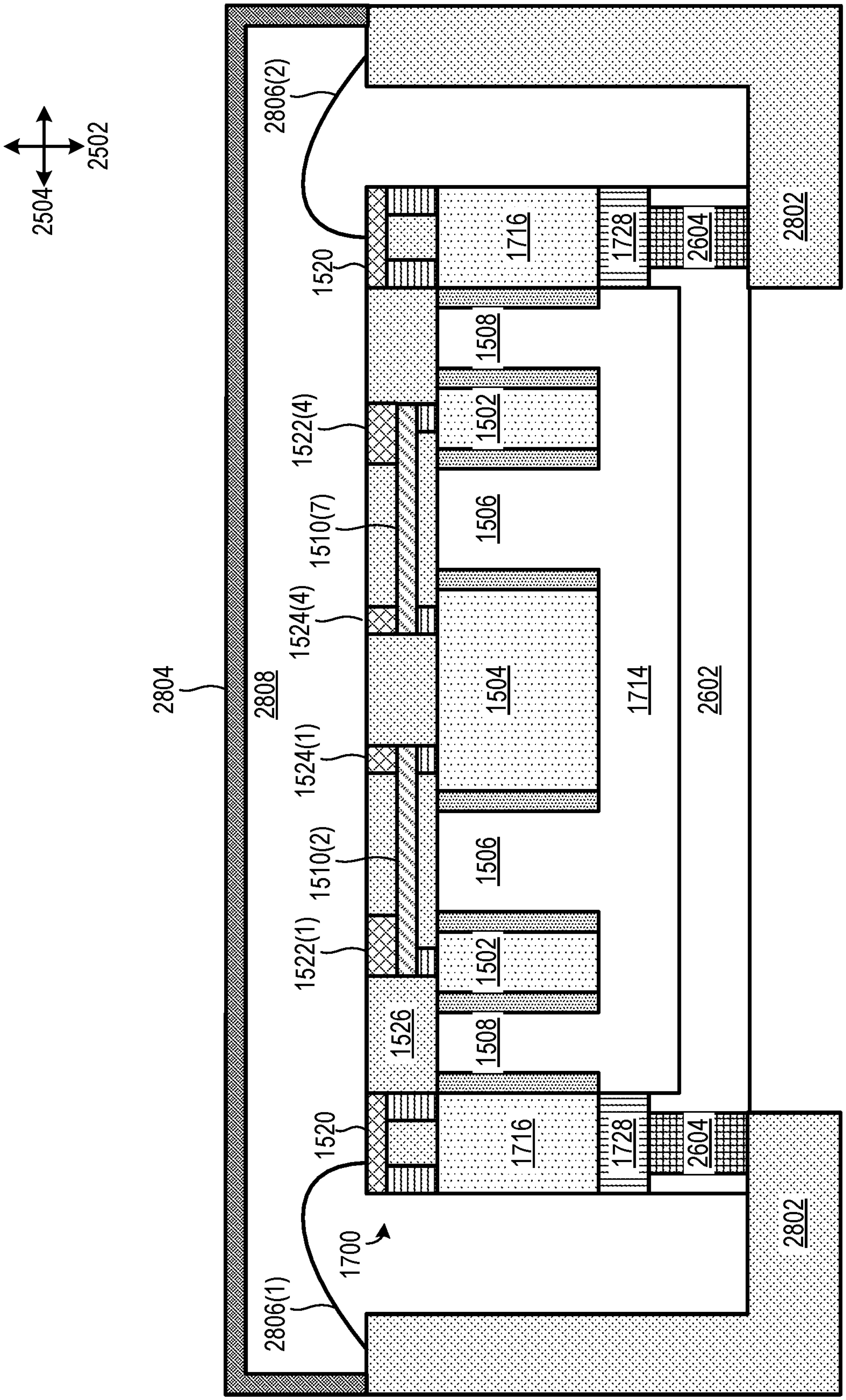
FIG. 28B is a cross-sectional view of the FIG. 28A assembly taken along line 28B-28B of FIG. 28A.

Any of assemblies 2500, 2600, or 2700 could be modified to include additional package elements. For example, FIG. 28A is a top plan view of a assembly 2800, and FIG. 28B is a cross-sectional view of assembly 2800 taken along line 28B-28B of FIG. 28A. The shape, dimensions, construction, materials, and outline of the package of assembly 2800 can be optimized depending on the specific requirements of the application. Assembly 2800 is an alternate embodiment of assembly 2600 of FIG. 26 further including leads or electrical contacts 2802, a cap or lid 2804, and a plurality of bond wires 2806. Leads or electrical contacts 2802 are, for example, thermally conductive, and leads or electrical contacts 2802 support support structure 2602 in regions below thermal vias 2604 in first direction 2502. Bond wires 2806 thermally couple first heatsink 1520 to leads or electrical contacts 2802. Although two bond wires 2806 are shown in FIG. 28B, it is understood that assembly 2800 may include any number of bond wires 2806. Cap or lid 2804 is supported by base 2802, and there is a cavity 2808 between cap or lid 2804 and thermal cycle detector 1700.

The embodiment shown in FIG. 28B could also be modified to use different interconnect technologies to connect the thermal cycle detector die to the external environment such as conductive vias, bumps, conductive paste, anisotropic conductive film, or other suitable methods, depending on the specific requirements of the application. Also, leads or electrical contacts 2802 could be partially encapsulated or embedded within a protective material. The space between the leads or electrical contacts 2802 may also be encapsulated or filled with protective material such as epoxy. The package construction of assembly 2800 could be ceramic or premoulded or fabricated using a build up or laminate or 3D printing or some other suitable technology. Again, the shape, form factor, or size of the package construction can be modified and optimized depending on the specific requirements of the application.

Figure 29:
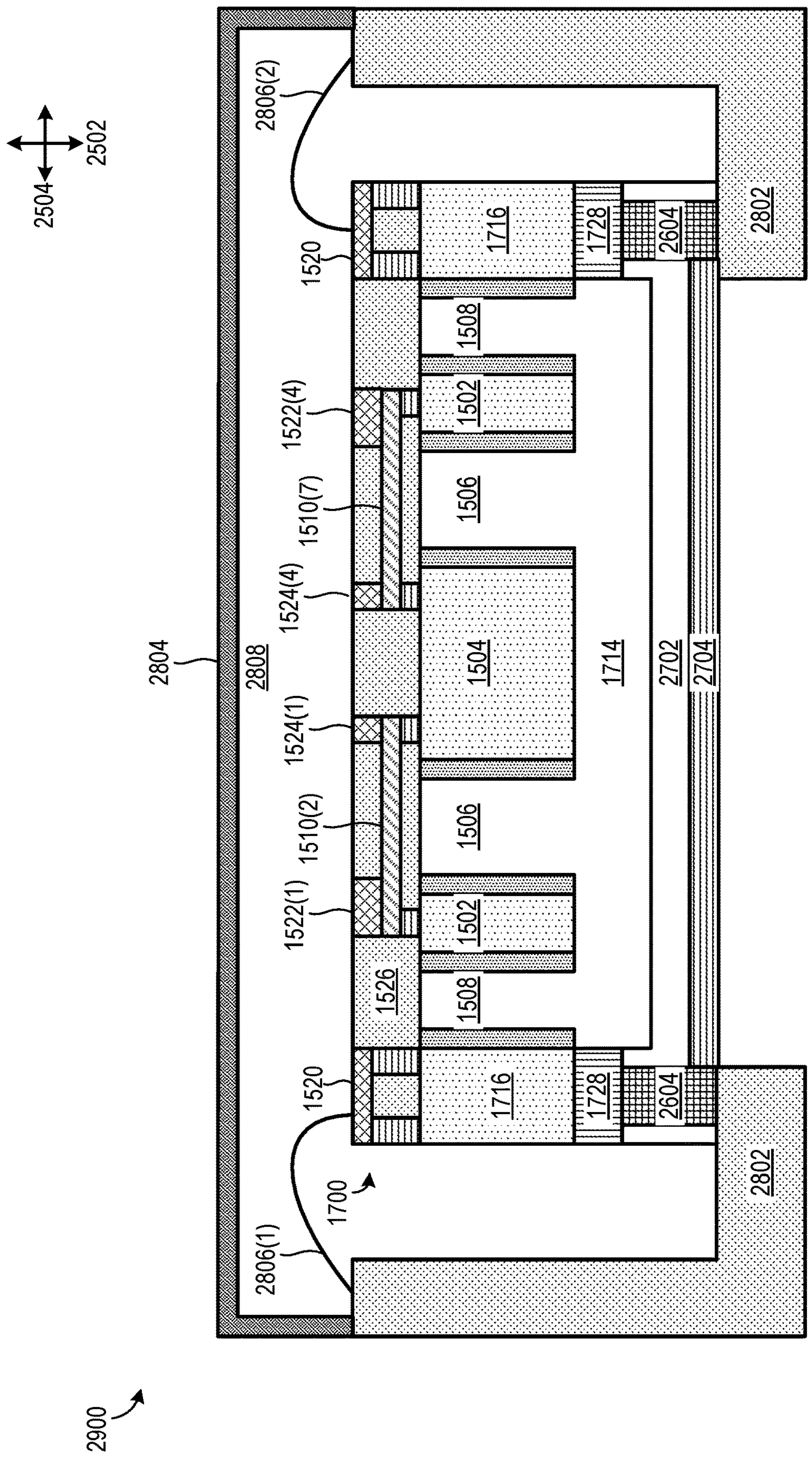
FIG. 29 is a cross-sectional view of an alternate embodiment of the FIG. 28A assembly.

FIG. 29 is a cross-sectional view of an assembly 2900, which is an alternate embodiment of assembly 2800 where support structure 2602 is replaced with support structure 2702 of FIG. 27. The shape or size of the leads or electrical contacts 2802 can be modified or contained within encapsulant or build up structure depending on the specific requirements of the application. The package construction could be ceramic or premoulded or fabricated using a build up or laminate or 3D printing or some other suitable technology. Again, the shape, form factor, or size of the package construction can be modified and optimized depending on the specific requirements of the application.

Combinations of Features

Features described above may be combined in various ways without departing from the scope hereof. The following examples illustrate some possible combinations.

(A1) A thermal cycle detector includes (1) a first temperature reservoir including a first transistor, (2) a second temperature reservoir including a second transistor, (3) a first thermal barrier disposed between the first temperature reservoir and the second temperature reservoir, and (4) a plurality of first electrical conductors spanning the first thermal barrier.

(A2) In the thermal cycle detector denoted as (A1), the first electrical conductors of the plurality of first electrical conductors may be electrically coupled in series.

(A3) In either one of the thermal cycle detectors denoted as (A1) and (A2), the plurality of first electrical conductors may be configured to provide an electrical power source for the thermal cycle detector in response to a thermal gradient across the plurality of first electrical conductors.

(A4) In any one of the thermal cycle detectors denoted as (A1) through (A3), each first electrical conductor of the plurality of first electrical conductors may include a polysilicon material.

(A5) In any one of the thermal cycle detectors denoted as (A1) through (A4), each first electrical conductor of the plurality of first electrical conductors may further include one of a P-type dopant and an N-type dopant.

(A6) Any one of the thermal cycle detectors denoted as (A1) through (A5) may further include a second thermal barrier disposed between the first temperature reservoir and a temperature sensing location.

(A7) The thermal cycle detector denoted as (A6) may further include a plurality of second electrical conductors spanning the first thermal barrier and configured to electrical couple the first transistor and the second transistor.

(A8) In the thermal cycle detector denoted as (A7), each second electrical conductor of the plurality of second electrical conductors may include a polysilicon material.

(A9) In either one of the thermal cycle detectors denoted as (A7) and (A8), each second electrical conductor of the plurality of second electrical conductors may include one of a P-type dopant and an N-type dopant.

(A10) In any one of the thermal cycle detectors denoted as (A1) through (A9), the first thermal barrier may include a trench formed in a semiconductor material.

(A11) In the thermal cycle detector denoted as (A10), the trench may be filled with air.

(A12) In the thermal cycle detector denoted as (A10), the trench may be filled with an oxide material.

(A13) In the thermal cycle detector denoted as (A10), the trench may be filled with a polysilicon material.

(A14) In any one of the thermal cycle detectors denoted as (A1) through (A13), the first transistor may include an emitter region including each of a first type of dopant and a second type of dopant.

(A15) In the thermal cycle detector denoted as (A14), the second type of dopant may have a lower activation energy than the first type of dopant.

(A16) In the thermal cycle detector denoted as (A15), the first type of dopant may be a P-type dopant, and the second type of dopant may be an N-type dopant.

(A17) In the thermal cycle detector denoted as (A16), the first transistor may further include (1) a base region including an N-type dopant and (2) a collector region including a P-type dopant.

(A18) In the thermal cycle detector denoted as (A14), the first type of dopant may be an N-type dopant, and the second type of dopant may be a P-type dopant.

(A19) In the thermal cycle detector denoted as (A18), the first transistor may further include (1) a base region including a P-type dopant and (2) a collector region including an N-type dopant.

(A20) Any one of the thermal cycle detectors denoted as (A14) through (A19) may further include a second electrical conductor spanning the first thermal barrier and electrically coupling the emitter region of the first transistor and a base region of the second transistor.

(B1) A thermal cycle detector includes (1) a first temperature reservoir including a plurality of transistors, (2) a second temperature reservoir including a plurality of transistors, (3) a first thermal barrier disposed between the first temperature reservoir and the second temperature reservoir, and (4) a second thermal barrier disposed between the first temperature reservoir and a temperature sensing location.

(B2) In the thermal cycle detector denoted as (B1), each of the first temperature reservoir, the second temperature reservoir, the first thermal barrier, and the second thermal barrier may be concentric with respect to a center axis of the thermal cycle detector.

(B3) Either one of the thermal cycle detectors denoted as (B1) and (B2) may further include a plurality of first electrical conductors spanning the first thermal barrier.

(B4) In the thermal cycle detector denoted as (B3), the plurality of first electrical conductors may be configured to provide an electrical power source for the thermal cycle detector in response to a thermal gradient across the plurality of first electrical conductors.

(B5) Either one of the thermal cycle detectors denoted as (B3) and (B4) may further include a plurality of second electrical conductors spanning the first thermal barrier and being configured to electrical couple (a) the plurality of transistors included in the first temperature reservoir and (b) the plurality of transistors included in the second temperature reservoir.

(B6) In any one of the thermal cycle detectors denoted as (B3) through (B5), each first electrical conductor of the plurality of first electrical conductors may include a polysilicon material.

(B7) In any one of the thermal cycle detectors denoted as (B3) through (B6), each first electrical conductor of the plurality of first electrical conductors may further include one of a P-type dopant and an N-type dopant.

(B8) In any one of the thermal cycle detectors denoted as (B1) through (B7), the first thermal barrier may include a trench formed in a semiconductor material.

(B9) In the thermal cycle detector denoted as (B8), the trench may be filled with air.

(B10) In the thermal cycle detector denoted as (B8), the trench may be filled with an oxide material.

(B11) In the thermal cycle detector denoted as (B8), the trench may be filled with a polysilicon material.

(C1) An assembly includes a package and a thermal cycle detector at least partially within the package. The thermal cycle detector includes (1) a first temperature reservoir including a first transistor, (2) a second temperature reservoir including a second transistor, (3) a first thermal barrier disposed between the first temperature reservoir and the second temperature reservoir, and (4) a plurality of first electrical conductors spanning the first thermal barrier.

(C2) In the assembly denoted as (C1), the package may be configured such that the package does not directly contact any one of the first temperature reservoir, the second temperature reservoir, and the first thermal barrier.

(C3) In either one of the assemblies denoted as (C1) and (C2), the package may include a cap configured to form at least part of a cavity between the thermal cycle detector and the cap.

(C4) In the assembly denoted as (C3), the cavity may be configured such that the package does not directly contact any one of the first temperature reservoir, the second temperature reservoir, and the first thermal barrier.

(C5) In either one of the assemblies denoted as (C1) and (C2), the package may be configured such there is a cavity between the thermal cycle detector and one of a paddle of the package and a substrate of the package.

(C6) In any one of the assemblies denoted as (C1) through (C5), the package may include one or more electrically conductive elements and a plurality of bond wires, and each bond wire of the plurality of bond wires may be configured to thermally couple a heatsink of the thermal cycle detector and the one or more electrically conductive elements.

(C7) In the assembly denoted as (C6), the one or more electrically conductive elements may be thermally conductive.

(C8) In any one of the assemblies denoted as (C1) through (C7), the package may include a substrate and one or more thermal vias extending through the substrate.

(C9) In the assembly denoted as (C8), the one or more thermal vias may be configured to thermally couple a temperature sensing location of the thermal cycle detector to an ambient environment of the assembly.

(C10) In either one of the assemblies denoted as (C8) and (C9), the package may further include a plurality of bond wires, and the one or more thermal vias may be configured to thermally couple a heatsink of the thermal cycle detector to an ambient environment of the assembly via the plurality of bond wires.

Changes may be made in the above described embodiments without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A thermal cycle detector, comprising:

a first temperature reservoir including a first transistor;

a second temperature reservoir including a second transistor;

a first thermal barrier disposed between the first temperature reservoir and the second temperature reservoir; and a plurality of first electrical conductors spanning the first thermal barrier.

2. The thermal cycle detector of claim 1, wherein the first electrical conductors of the plurality of first electrical conductors are electrically coupled in series.

3. The thermal cycle detector of claim 1, wherein the plurality of first electrical conductors is configured to provide an electrical power source for the thermal cycle detector in response to a thermal gradient across the plurality of first electrical conductors.

4. The thermal cycle detector of claim 1, wherein each first electrical conductor of the plurality of first electrical conductors comprises a polysilicon material.

5. The thermal cycle detector of claim 4, wherein each first electrical conductor of the plurality of first electrical conductors further comprises one of a P-type dopant and an N-type dopant.

6. The thermal cycle detector of claim 1, further comprising a second thermal barrier disposed between the first temperature reservoir and a temperature sensing location.

7. The thermal cycle detector of claim 1, further comprising a plurality of second electrical conductors spanning the first thermal barrier and configured to electrical couple the first transistor and the second transistor.

8. The thermal cycle detector of claim 7, wherein each second electrical conductor of the plurality of second electrical conductors comprises a polysilicon material.

9. The thermal cycle detector of claim 8, wherein each second electrical conductor of the plurality of second electrical conductors comprises one of a P-type dopant and an N-type dopant.

10. The thermal cycle detector of claim 1, wherein the first thermal barrier comprises a trench formed in a semiconductor material.

11. The thermal cycle detector of claim 10, wherein the trench is filled with air, an oxide material, or a polysilicon material.

12. The thermal cycle detector of claim 1, wherein:

the first transistor comprises an emitter region including each of a first type of dopant and a second type of dopant; and the second type of dopant has a lower activation energy than the first type of dopant.

13. The thermal cycle detector of claim 12, further comprising a second electrical conductor spanning the first thermal barrier and electrically coupling the emitter region of the first transistor and a base region of the second transistor.

14. A thermal cycle detector, comprising:

a first temperature reservoir including a plurality of transistors;

a second temperature reservoir including a plurality of transistors;

a first thermal barrier disposed between the first temperature reservoir and the second temperature reservoir; and a second thermal barrier disposed between the first temperature reservoir and a temperature sensing location.

15. The thermal cycle detector of claim 14, wherein each of the first temperature reservoir, the second temperature reservoir, the first thermal barrier, and the second thermal barrier is concentric with respect to a center axis of the thermal cycle detector.

16. The thermal cycle detector of claim 14, further comprising a plurality of first electrical conductors spanning the first thermal barrier, wherein the plurality of first electrical conductors is configured to provide an electrical power source for the thermal cycle detector in response to a thermal gradient across the plurality of first electrical conductors.

17. The thermal cycle detector of claim 16, further comprising a plurality of second electrical conductors spanning the first thermal barrier and being configured to electrical couple (a) the plurality of transistors included in the first temperature reservoir and (b) the plurality of transistors included in the second temperature reservoir.

18. An assembly, comprising:

a package; and a thermal cycle detector at least partially within the package, including:

a first temperature reservoir including a first transistor, a second temperature reservoir including a second transistor, a first thermal barrier disposed between the first temperature reservoir and the second temperature reservoir, and a plurality of first electrical conductors spanning the first thermal barrier.

19. The assembly of claim 18, wherein the package is configured such that the package does not directly contact any one of the first temperature reservoir, the second temperature reservoir, and the first thermal barrier.

20. The assembly of claim 18, wherein:

the package comprises one or more electrically conductive elements and a plurality of bond wires; and each bond wire of the plurality of bond wires is configured to thermally couple a heatsink of the thermal cycle detector and the one or more electrically conductive elements.

* * * * *